(12) United States Patent
Tsubamoto

(10) Patent No.: US 8,229,724 B2
(45) Date of Patent: Jul. 24, 2012

(54) SIGNAL TRANSMISSION SYSTEM EVALUATION APPARATUS AND PROGRAM, AND SIGNAL TRANSMISSION SYSTEM DESIGN METHOD

(75) Inventor: Daita Tsubamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 461 days.

(21) Appl. No.: 12/551,610

(22) Filed: Sep. 1, 2009

(65) Prior Publication Data
US 2010/0057423 A1 Mar. 4, 2010

(30) Foreign Application Priority Data
Sep. 1, 2008 (JP) ................................ 2008-223433

(51) Int. Cl.
*G06F 17/50* (2006.01)
(52) U.S. Cl. ........................................................ 703/14
(58) Field of Classification Search .................... 703/13, 703/14; 326/82; 714/30, 37; 327/410
See application file for complete search history.

(56) References Cited

U.S. PATENT DOCUMENTS

| | | | |
|---|---|---|---|
| 2001/0048298 A1 | 12/2001 | Doshita et al. | |
| 2004/0150459 A1* | 8/2004 | Muto et al. | 327/410 |
| 2005/0005199 A1* | 1/2005 | Yoda | 714/37 |
| 2005/0283668 A1* | 12/2005 | Ishikawa | 714/30 |
| 2006/0071688 A1* | 4/2006 | Uenishi | 326/82 |
| 2007/0100596 A1* | 5/2007 | Hollis | 703/14 |

FOREIGN PATENT DOCUMENTS

| | | |
|---|---|---|
| JP | 2001-265848 A | 9/2001 |
| JP | 2004-287738 A | 10/2004 |
| JP | 2005-063070 A | 3/2005 |

* cited by examiner

*Primary Examiner* — Kandasamy Thangavelu
(74) *Attorney, Agent, or Firm* — Fujitsu Patent Center

(57) ABSTRACT

A parameter acquisition section acquires model information about a waveform simulation model of a system of signal transmission, a first parameter of a waveform variation in a time direction in the system, and a second parameter of a waveform variation in an amplitude direction in the system. A first eye pattern calculation section calculates a first eye pattern of the system through a waveform simulation based on the model information acquired by the parameter acquisition section. A second eye pattern calculation section calculates, based on the first and second parameters acquired by the parameter acquisition section, a second eye pattern through processing of the first eye pattern calculated by the first eye pattern calculation section. And a transmission margin calculation section calculates, as a transmission margin, a positional relationship between a specific area and an aperture of the second eye pattern calculated by the second eye pattern calculation section.

17 Claims, 69 Drawing Sheets

FIG. 5

| NUMBER | ELEMENT | IN-PRINTED BOARD TRANSMISSION | STACKING CONNECTOR TRANSMISSION | FLEXIBLE CABLE TRANSMISSION | BACKPLANE TRANSMISSION |
|---|---|---|---|---|---|
| ① | TRANSMISSION COMPONENT | ○ | ○ | ○ | ○ |
| ② | TRANSMISSION PIU WIRING | ○ | ○ | ○ | ○ |
| ③ | TRANSMISSION-SIDE BWB CONNECTOR | | | | ○ |
| ④ | BWB WIRING | | | | ○ |
| ⑤ | RECEPTION-SIDE BWB CONNECTOR | | | | ○ |
| ⑥ | STACKING CONNECTOR | | ○ | | |
| ⑦ | FLEXIBLE CABLE | | | ○ | |
| ⑧ | RECEPTION PIU WIRING | | ○ | ○ | ○ |
| ⑨ | RECEPTION COMPONENT | ○ | ○ | ○ | ○ |

FIG. 18

| MEASURES AGAINST EXCESSIVE EMPHASIS |
|---|
| IN THE IN-PRINTED BOARD TRANSMISSION, THE PRE-EMPHASIS AND EQUALIZER ARE BOTH ON. THERE IS A POSSIBILITY OF AN ERROR DUE TO THE EXCESSIVE AMPLIFICATION OF HIGH-FREQUENCY COMPONENTS. TURNING OFF EITHER THE PRE-EMPHASIS OR EQUALIZER IS RECOMMENDED. <br><br> WARNING |

FIG. 20

| SETTING ASSUMPTION OF PRE-EMPHASIS AND EQUALIZER |
|---|
| ALTHOUGH LOSS OF TRANSMISSION PATH EXCEEDS A REFERENCE VALUE, THE PRE-EMPHASIS AND THE EQUALIZER ARE BOTH OFF. TURNING ON EITHER SETTING IS RECOMMENDED.<br><br>[ WARNING ] |

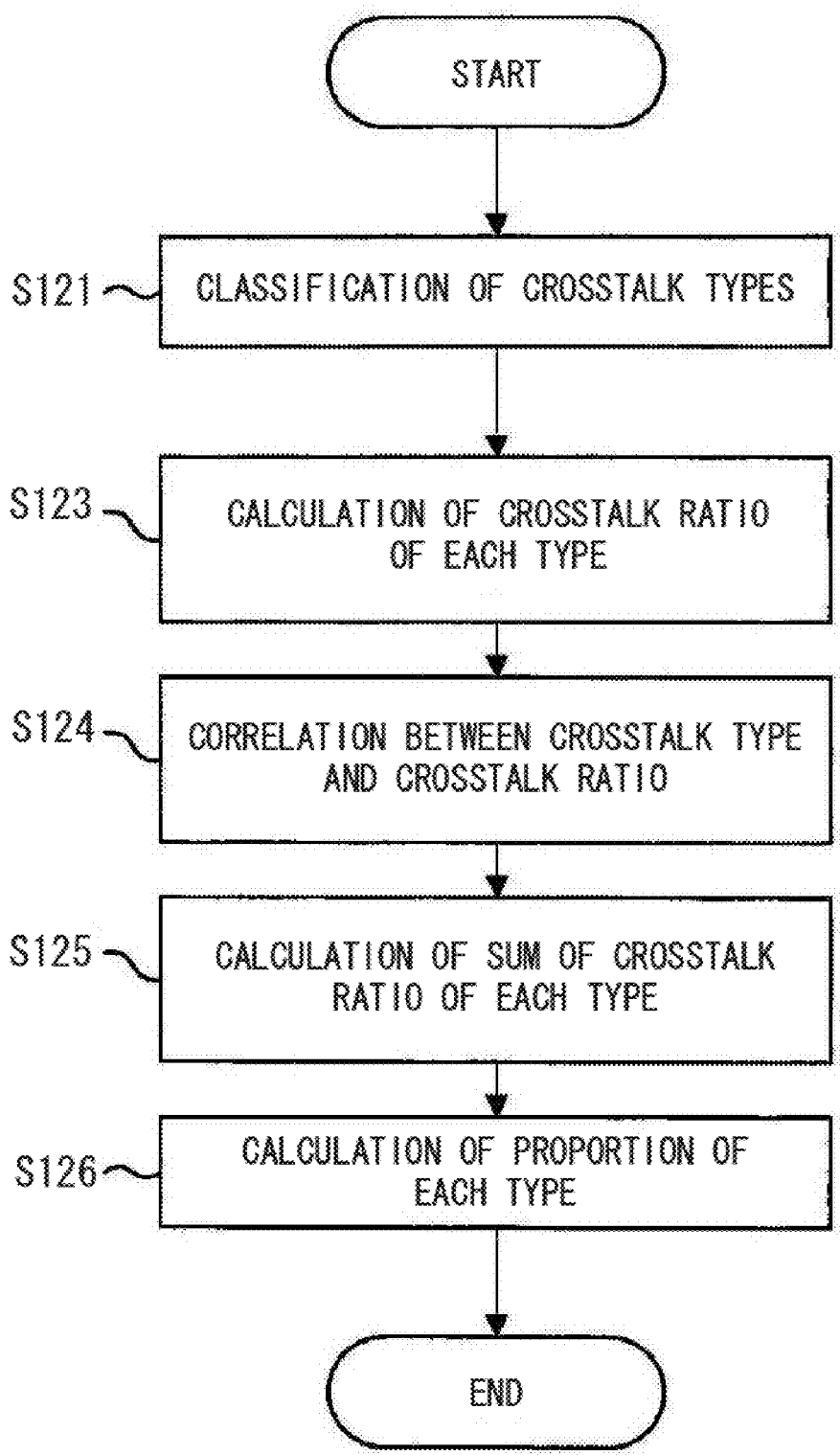

FIG. 38

| CONNECTOR | COUPLING | CONNECTION | TYPE ABBREVIATION |
|---|---|---|---|
| TRANSMISSION SIDE | SAME DIRECTION | SAME PIU | T-SS |
| TRANSMISSION SIDE | SAME DIRECTION | DIFFERENT PIU | T-SD |
| TRANSMISSION SIDE | DIFFERENT DIRECTION | SAME PIU | T-DS |
| TRANSMISSION SIDE | DIFFERENT DIRECTION | DIFFERENT PIU | T-DD |
| RECEPTION SIDE | SAME DIRECTION | SAME PIU | R-SS |
| RECEPTION SIDE | SAME DIRECTION | DIFFERENT PIU | R-SD |
| RECEPTION SIDE | DIFFERENT DIRECTION | SAME PIU | R-DS |
| RECEPTION SIDE | DIFFERENT DIRECTION | DIFFERENT PIU | R-DD |

FIG. 39
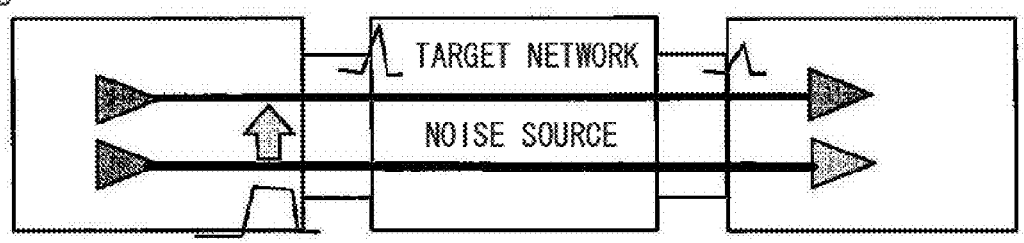
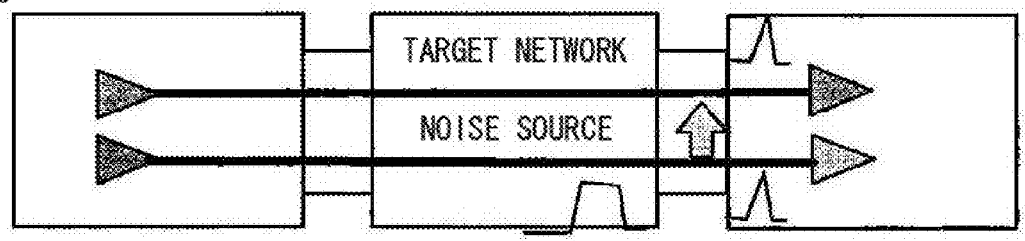

FIG. 42
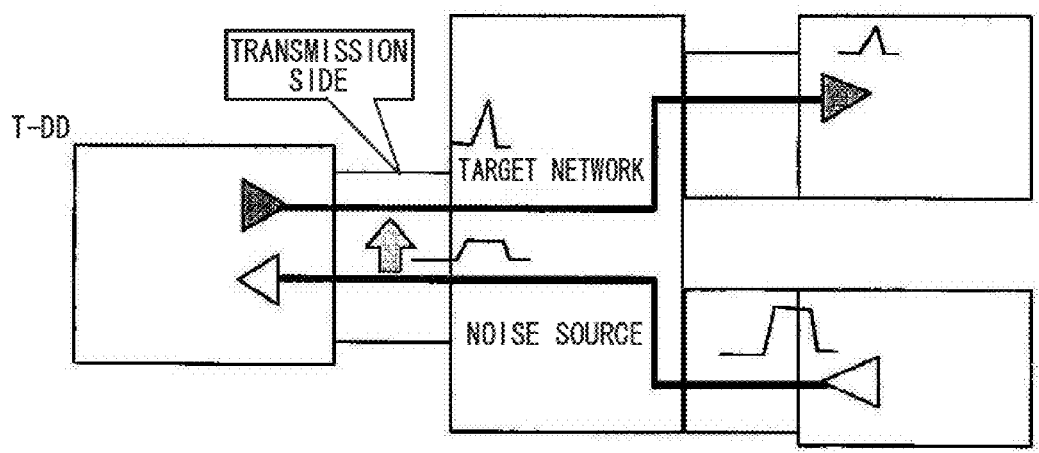
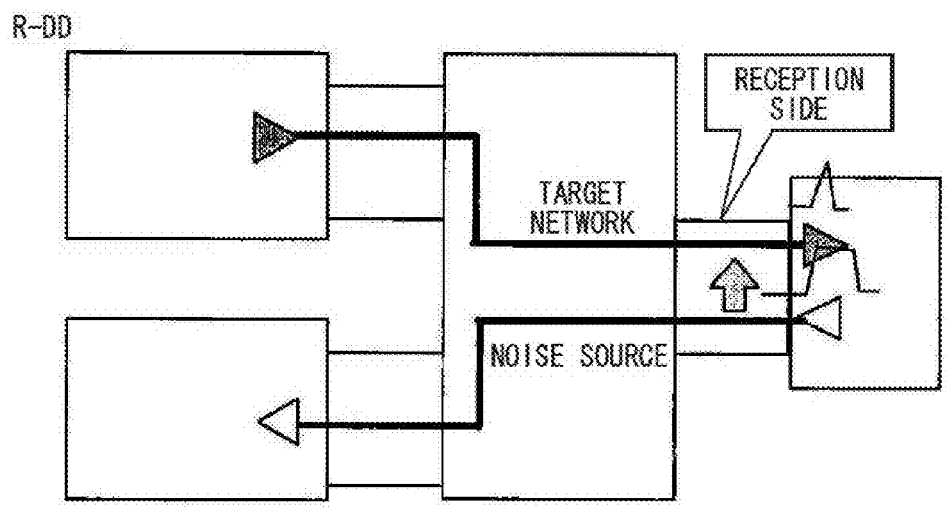

FIG. 43

|   | A | B |
|---|---|---|
| 1 | a(%) | c(%) |
| 2 | TARGET PIN | d(%) |
| 3 | b(%) | e(%) |

FIG. 44

|   | A | B |
|---|---|---|
| 1 | T-SS-a (%) | T-SD-c (%) |
| 2 | TARGET PIN | T-DS-d (%) |
| 3 | T-SS-b (%) | T-DD-e (%) |

FIG. 45

|   | A | B |
|---|---|---|
| 1 | R-SD-a (%) | R-SS-c (%) |
| 2 | TARGET PIN | R-DS-d (%) |
| 3 | R-SD-b (%) | R-DD-e (%) |

FIG. 46

| TYPE | CONNECTOR | COUPLING | CONNECTION | SUM OF CROSSTALK RATIOS |
|---|---|---|---|---|
| T-SS | TRANSMISSION SIDE | SAME DIRECTION | SAME PIU | (a+b) (%) |
| T-SD | TRANSMISSION SIDE | SAME DIRECTION | DIFFERENT PIU | c (%) |
| T-DS | TRANSMISSION SIDE | DIFFERENT DIRECTION | SAME PIU | e (%) |
| T-DD | TRANSMISSION SIDE | DIFFERENT DIRECTION | DIFFERENT PIU | d (%) |
| R-SS | RECEPTION SIDE | SAME DIRECTION | SAME PIU | c (%) |
| R-SD | RECEPTION SIDE | SAME DIRECTION | DIFFERENT PIU | (a+b) (%) |
| R-DS | RECEPTION SIDE | DIFFERENT DIRECTION | SAME PIU | d (%) |
| R-DD | RECEPTION SIDE | DIFFERENT DIRECTION | DIFFERENT PIU | e (%) |

TOTAL 100%

FIG. 47

| TYPE | CONNECTOR | COUPLING | CONNECTION | PROPORTION |
|---|---|---|---|---|
| T-SS | TRANSMISSION SIDE | SAME DIRECTION | SAME PIU | (a+b)/t×100(%) |
| T-SD | TRANSMISSION SIDE | SAME DIRECTION | DIFFERENT PIU | c/t×100(%) |
| T-DS | TRANSMISSION SIDE | DIFFERENT DIRECTION | SAME PIU | e/t×100(%) |
| T-DD | TRANSMISSION SIDE | DIFFERENT DIRECTION | DIFFERENT PIU | d/t×100(%) |
| R-SS | RECEPTION SIDE | SAME DIRECTION | SAME PIU | c/t×100(%) |
| R-SD | RECEPTION SIDE | SAME DIRECTION | DIFFERENT PIU | (a+b)/t×100(%) |
| R-DS | RECEPTION SIDE | DIFFERENT DIRECTION | SAME PIU | d/t×100(%) |
| R-DD | RECEPTION SIDE | DIFFERENT DIRECTION | DIFFERENT PIU | e/t×100(%) |

TOTAL 100%

F I G. 48

| TYPE | CONNECTOR | COUPLING | CONNECTION | NOISE-SOURCE AMPLITUDE REQUIREMENTS |
|---|---|---|---|---|
| T-SS | TRANSMISSION SIDE | SAME DIRECTION | SAME PIU | MIN VALUE |
| T-SD | TRANSMISSION SIDE | SAME DIRECTION | DIFFERENT PIU | MIN VALUE |
| T-DS | TRANSMISSION SIDE | DIFFERENT DIRECTION | SAME PIU | MAX VALUE |
| T-DD | TRANSMISSION SIDE | DIFFERENT DIRECTION | DIFFERENT PIU | MAX VALUE |
| R-SS | RECEPTION SIDE | SAME DIRECTION | SAME PIU | MIN VALUE |
| R-SD | RECEPTION SIDE | SAME DIRECTION | DIFFERENT PIU | MAX VALUE |
| R-DS | RECEPTION SIDE | DIFFERENT DIRECTION | SAME PIU | MAX VALUE |
| R-DD | RECEPTION SIDE | DIFFERENT DIRECTION | DIFFERENT PIU | MAX VALUE |

FIG. 49

| TYPE | CONNECTOR | COUPLING | CONNECTION | SETTING OF WIRE LENGTH OF NOISE SOURCE | | SETTING OF WIRE LENGTH OF TARGET NETWORK | |
|---|---|---|---|---|---|---|---|
| | | | | TRANSMISSION PIU | BWB | BWB | RECEPTION PIU |
| T-SS | TRANSMISSION SIDE | SAME DIRECTION | SAME PIU | MIN VALUE | NOT IN USE | MAX VALUE | MAX VALUE |
| T-SD | TRANSMISSION SIDE | SAME DIRECTION | DIFFERENT PIU | MIN VALUE | NOT IN USE | MAX VALUE | MAX VALUE |
| T-DS | TRANSMISSION SIDE | DIFFERENT DIRECTION | SAME PIU | MIN VALUE | MIN VALUE | MAX VALUE | MAX VALUE |
| T-DD | TRANSMISSION SIDE | DIFFERENT DIRECTION | DIFFERENT PIU | MIN VALUE | MAX VALUE | MAX VALUE | MAX VALUE |
| R-SS | RECEPTION SIDE | SAME DIRECTION | SAME PIU | MIN VALUE | MAX VALUE | NOT IN USE | MAX VALUE |
| R-SD | RECEPTION SIDE | SAME DIRECTION | DIFFERENT PIU | MIN VALUE | NOT IN USE | NOT IN USE | MAX |
| R-DS | RECEPTION SIDE | DIFFERENT DIRECTION | SAME PIU | MIN VALUE | NOT IN USE | NOT IN USE | MAX |
| R-DD | RECEPTION SIDE | DIFFERENT DIRECTION | DIFFERENT PIU | MIN VALUE | NOT IN USE | NOT IN USE | MAX |

F I G. 50

| TYPE | CONNECTOR | COUPLING | CONNECTION | NOISE SOURCE [dB] | TARGET NETWORK [dB] |
|---|---|---|---|---|---|
| T-SS | TRANSMISSION SIDE | SAME DIRECTION | SAME PIU | a1 | a2 |
| T-SD | TRANSMISSION SIDE | SAME DIRECTION | DIFFERENT PIU | b1 | b2 |
| T-DS | TRANSMISSION SIDE | DIFFERENT DIRECTION | SAME PIU | c1 | c2 |
| T-DD | TRANSMISSION SIDE | DIFFERENT DIRECTION | DIFFERENT PIU | d1 | d2 |
| R-SS | RECEPTION SIDE | SAME DIRECTION | SAME PIU | e1 | e2 |
| R-SD | RECEPTION SIDE | SAME DIRECTION | DIFFERENT PIU | f1 | f2 |
| R-DS | RECEPTION SIDE | DIFFERENT DIRECTION | SAME PIU | g1 | g2 |
| R-DD | RECEPTION SIDE | DIFFERENT DIRECTION | DIFFERENT PIU | h1 | h2 |

FIG. 57

| | CONDITIONS OF PARAMETERS AFFECTING NOISE | | | | CALCULATION RESULT OF NOISE | |
|---|---|---|---|---|---|---|
| 0 SUCCESSION | TRANSMISSION SPEED (Gbps) | NOISE-SOURCE LOSS (dB@1.6GHz) | TARGET NETWORK LOSS (dB@1.6GHz) | trtf | NOISE (mVpp) | Xtalk RATIO (%) |
| 7 | 1.25 | 1 | 1 | 0.05 | 21.4 | 2.14 |
| 7 | 1.25 | 1 | 1 | 0.2 | 16.5 | 1.65 |
| 7 | 1.25 | 1 | 10 | 0.05 | 9.603 | 0.9603 |
| 7 | 1.25 | 1 | 10 | 0.2 | 9.048 | 0.9048 |
| 7 | 1.25 | 10 | 1 | 0.05 | 9.778 | 0.9778 |
| 7 | 1.25 | 10 | 1 | 0.2 | 9.07 | 0.907 |
| 7 | 1.25 | 10 | 10 | 0.05 | 6.375 | 0.6375 |
| 7 | 1.25 | 10 | 10 | 0.2 | 6.162 | 0.6162 |
| 7 | 2.5 | 1 | 1 | 0.05 | 20.518 | 2.0518 |
| 7 | 2.5 | 1 | 1 | 0.2 | 16.345 | 1.6345 |
| 7 | 2.5 | 1 | 10 | 0.05 | 9.92 | 0.992 |
| 7 | 2.5 | 1 | 10 | 0.2 | 9.149 | 0.9149 |
| 7 | 2.5 | 10 | 1 | 0.05 | 9.748 | 0.9748 |
| 7 | 2.5 | 10 | 1 | 0.2 | 9.109 | 0.9109 |
| 7 | 2.5 | 10 | 10 | 0.05 | 5.938 | 0.5938 |
| 7 | 2.5 | 10 | 10 | 0.2 | 5.586 | 0.5586 |
| 72 | 1.25 | 1 | 1 | 0.05 | 21.128 | 2.1128 |
| 72 | 1.25 | 1 | 1 | 0.2 | 16.603 | 1.6603 |
| 72 | 1.25 | 1 | 10 | 0.05 | 10.146 | 1.0146 |
| 72 | 1.25 | 1 | 10 | 0.2 | 9.167 | 0.9167 |
| 72 | 1.25 | 10 | 1 | 0.05 | 10.164 | 1.0164 |
| 72 | 1.25 | 10 | 1 | 0.2 | 9.148 | 0.9148 |
| 72 | 1.25 | 10 | 10 | 0.05 | 6.331 | 0.6331 |
| 72 | 1.25 | 10 | 10 | 0.2 | 6.408 | 0.6408 |
| 72 | 2.5 | 1 | 1 | 0.05 | 21.136 | 2.1136 |
| 72 | 2.5 | 1 | 1 | 0.2 | 16.277 | 1.6277 |
| 72 | 2.5 | 1 | 10 | 0.05 | 10.028 | 1.0028 |
| 72 | 2.5 | 1 | 10 | 0.2 | 9.393 | 0.9393 |
| 72 | 2.5 | 10 | 1 | 0.05 | 9.931 | 0.9931 |

FIG. 59

| 0 SUCCESSION | TRANSMISSION SPEED (Gbps) | NOISE-SOURCE LOSS (dB@1.6GHz) | TARGET NETWORK LOSS (dB@1.6GHz) | trtf | NOISE (mVpp) | Xtalk RATIO (%) |
|---|---|---|---|---|---|---|
| 7 | 1.25 | 1 | 1 | 0.05 | 21.4 | 2.14 |
| 7 | 1.25 | 1 | 1 | 0.2 | 16.5 | 1.65 |
| 7 | 1.25 | 1 | 10 | 0.05 | 9.603 | 0.9603 |
| 7 | 1.25 | 1 | 10 | 0.2 | 9.048 | 0.9048 |
| 7 | 1.25 | 10 | 1 | 0.05 | 9.778 | 0.9778 |
| 7 | 1.25 | 10 | 1 | 0.2 | 9.07 | 0.907 |
| 7 | 1.25 | 10 | 10 | 0.05 | 6.375 | 0.6375 |
| 7 | 1.25 | 10 | 10 | 0.2 | 6.162 | 0.6162 |
| 7 | 2.5 | 1 | 1 | 0.05 | 20.518 | 2.0518 |
| 7 | 2.5 | 1 | 1 | 0.2 | 16.345 | 1.6345 |
| 7 | 2.5 | 1 | 10 | 0.05 | 9.92 | 0.992 |
| 7 | 2.5 | 1 | 10 | 0.2 | 9.149 | 0.9149 |
| 7 | 2.5 | 10 | 1 | 0.05 | 9.748 | 0.9748 |
| 7 | 2.5 | 10 | 1 | 0.2 | 9.109 | 0.9109 |
| 7 | 2.5 | 10 | 10 | 0.05 | 5.938 | 0.5938 |
| 7 | 2.5 | 10 | 10 | 0.2 | 5.586 | 0.5586 |
| 72 | 1.25 | 1 | 1 | 0.05 | 21.128 | 2.1128 |
| 72 | 1.25 | 1 | 1 | 0.2 | 16.603 | 1.6603 |
| 72 | 1.25 | 1 | 10 | 0.05 | 10.146 | 1.0146 |
| 72 | 1.25 | 1 | 10 | 0.2 | 9.167 | 0.9167 |
| 72 | 1.25 | 10 | 1 | 0.05 | 10.164 | 1.0164 |
| 72 | 1.25 | 10 | 1 | 0.2 | 9.148 | 0.9148 |
| 72 | 1.25 | 10 | 10 | 0.05 | 6.331 | 0.6331 |
| 72 | 1.25 | 10 | 10 | 0.2 | 6.408 | 0.6408 |
| 72 | 2.5 | 1 | 1 | 0.05 | 21.136 | 2.1136 |
| 72 | 2.5 | 1 | 1 | 0.2 | 16.277 | 1.6277 |
| 72 | 2.5 | 1 | 10 | 0.05 | 10.028 | 1.0028 |
| 72 | 2.5 | 1 | 10 | 0.2 | 9.393 | 0.9393 |
| 72 | 2.5 | 10 | 1 | 0.05 | 9.931 | 0.9931 |

FIG. 60

CONDITIONS OF PARAMETERS AFFECTING NOISE | | | | CALCULATION RESULT OF NOISE | | |
|---|---|---|---|---|---|---|
| SUCCESSION | TRANSMISSION SPEED (Gbps) | NOISE-SOURCE LOSS (dB@1.6GHz) | TARGET NETWORK LOSS (dB@1.6GHz) | trtf | NOISE | Xtalk RATIO (%) | COEFFICIENT OF INCREASE |
| 7 | 1.25 | 1 | 1 | 0.05 | 21.4 | 2.14 | |
| 7 | 2.5 | 1 | 1 | 0.05 | 20.518 | 2.0518 | −0.071 |
| 7 | 1.25 | 10 | 10 | 0.2 | 6.162 | 0.6162 | |
| 7 | 2.5 | 10 | 10 | 0.2 | 5.586 | 0.5586 | −0.046 |
| 72 | 1.25 | 1 | 1 | 0.05 | 21.128 | 2.1128 | |
| 72 | 2.5 | 1 | 1 | 0.05 | 21.136 | 2.1136 | 0.001 |
| 72 | 1.25 | 10 | 10 | 0.2 | 6.408 | 0.6408 | |
| 72 | 2.5 | 10 | 10 | 0.2 | 5.785 | 0.5785 | −0.050 / 0.001 |

MAX VALUE (=WORST VALUE)

FIG. 61

CONDITIONS OF PARAMETERS AFFECTING NOISE / CALCULATION RESULT OF NOISE

| 0 SUCCESSION | TRANSMISSION SPEED (Gbps) | NOISE-SOURCE LOSS (dB@1.6GHz) | Victim LOSS (dB@1.6GHz) | trtf | NOISE (mVpp) | Xtalk RATIO (%) |
|---|---|---|---|---|---|---|
| 7 | 1.25 | 1 | 1 | 0.05 | 21.4 | 2.14 |
| 7 | 1.25 | 1 | 1 | 0.2 | 16.5 | 1.65 |
| 7 | 1.25 | 1 | 10 | 0.05 | 9.603 | 0.9603 |
| 7 | 1.25 | 1 | 10 | 0.2 | 9.048 | 0.9048 |
| 7 | 1.25 | 10 | 1 | 0.05 | 9.778 | 0.9778 |
| 7 | 1.25 | 10 | 1 | 0.2 | 9.07 | 0.907 |
| 7 | 1.25 | 10 | 10 | 0.05 | 6.375 | 0.6375 |
| 7 | 1.25 | 10 | 10 | 0.2 | 6.162 | 0.6162 |
| 7 | 2.5 | 1 | 1 | 0.05 | 20.518 | 2.0518 |
| 7 | 2.5 | 1 | 1 | 0.2 | 16.345 | 1.6345 |
| 7 | 2.5 | 1 | 10 | 0.05 | 9.92 | 0.992 |
| 7 | 2.5 | 1 | 10 | 0.2 | 9.149 | 0.9149 |
| 7 | 2.5 | 10 | 1 | 0.05 | 9.748 | 0.9748 |
| 7 | 2.5 | 10 | 1 | 0.2 | 9.109 | 0.9109 |
| 7 | 2.5 | 10 | 10 | 0.05 | 5.938 | 0.5938 |
| 7 | 2.5 | 10 | 10 | 0.2 | 5.586 | 0.5586 |
| 72 | 1.25 | 1 | 1 | 0.05 | 21.128 | 2.1128 |
| 72 | 1.25 | 1 | 1 | 0.2 | 16.603 | 1.6603 |
| 72 | 1.25 | 1 | 10 | 0.05 | 10.146 | 1.0146 |
| 72 | 1.25 | 1 | 10 | 0.2 | 9.167 | 0.9167 |
| 72 | 1.25 | 10 | 1 | 0.05 | 10.164 | 1.0164 |
| 72 | 1.25 | 10 | 1 | 0.2 | 9.148 | 0.9148 |
| 72 | 1.25 | 10 | 10 | 0.05 | 6.331 | 0.6331 |
| 72 | 1.25 | 10 | 10 | 0.2 | 6.408 | 0.6408 |
| 72 | 2.5 | 1 | 1 | 0.05 | 21.136 | 2.1136 |
| 72 | 2.5 | 1 | 1 | 0.2 | 16.277 | 1.6277 |
| 72 | 2.5 | 1 | 10 | 0.05 | 10.028 | 1.0028 |
| 72 | 2.5 | 1 | 10 | 0.2 | 9.393 | 0.9393 |
| 72 | 2.5 | 10 | 1 | 0.05 | 9.931 | 0.9931 |

REFERENCE CONDITIONS

FIG. 62

| 0 SUCCESSION | TRANSMISSION SPEED(Gbps) | NOISE-SOURCE LOSS (dB@1.6GHz) | Victim LOSS (dB@1.6GHz) | trtf | NOISE (mVpp) | Xtalk RATIO (%) |
|---|---|---|---|---|---|---|
| 7 | 1.25 | 1 | 1 | 0.05 | 21.4 | 2.14 |
| 7 | 1.25 | 1 | 1 | 0.2 | 16.5 | 1.65 |
| 7 | 1.25 | 1 | 10 | 0.05 | 9.603 | 0.9603 |
| 7 | 1.25 | 1 | 10 | 0.2 | 9.048 | 0.9048 |
| 7 | 1.25 | 10 | 1 | 0.05 | 9.778 | 0.9778 |
| 7 | 1.25 | 10 | 1 | 0.2 | 9.07 | 0.907 |
| 7 | 1.25 | 10 | 10 | 0.05 | 6.375 | 0.6375 |
| 7 | 1.25 | 10 | 10 | 0.2 | 6.162 | 0.6162 |
| 7 | 2.5 | 1 | 1 | 0.05 | 20.518 | 2.0518 |
| 7 | 2.5 | 1 | 1 | 0.2 | 16.345 | 1.6345 |
| 7 | 2.5 | 1 | 10 | 0.05 | 9.92 | 0.992 |
| 7 | 2.5 | 1 | 10 | 0.2 | 9.149 | 0.9149 |
| 7 | 2.5 | 10 | 1 | 0.05 | 9.748 | 0.9748 |
| 7 | 2.5 | 10 | 1 | 0.2 | 9.109 | 0.9109 |
| 7 | 2.5 | 10 | 10 | 0.05 | 5.938 | 0.5938 |
| 7 | 2.5 | 10 | 10 | 0.2 | 5.586 | 0.5586 |
| 72 | 1.25 | 1 | 1 | 0.05 | 21.128 | 2.1128 |
| 72 | 1.25 | 1 | 1 | 0.2 | 16.603 | 1.6603 |
| 72 | 1.25 | 1 | 10 | 0.05 | 10.146 | 1.0146 |
| 72 | 1.25 | 1 | 10 | 0.2 | 9.167 | 0.9167 |
| 72 | 1.25 | 10 | 1 | 0.05 | 10.164 | 1.0164 |
| 72 | 1.25 | 10 | 1 | 0.2 | 9.148 | 0.9148 |
| 72 | 1.25 | 10 | 10 | 0.05 | 6.331 | 0.6331 |
| 72 | 1.25 | 10 | 10 | 0.2 | 6.408 | 0.6408 |
| 72 | 2.5 | 1 | 1 | 0.05 | 21.136 | 2.1136 |
| 72 | 2.5 | 1 | 1 | 0.2 | 16.277 | 1.6277 |
| 72 | 2.5 | 1 | 10 | 0.05 | 10.028 | 1.0028 |
| 72 | 2.5 | 1 | 10 | 0.2 | 9.393 | 0.9393 |
| 72 | 2.5 | 10 | 1 | 0.05 | 9.931 | 0.9931 |
| 72 | 2.5 | 10 | 1 | 0.2 | 9.299 | 0.9299 |
| 72 | 2.5 | 10 | 10 | 0.05 | 6.214 | 0.6214 |
| 72 | 2.5 | 10 | 10 | 0.2 | 5.785 | 0.5785 |

SIGNAL TRANSMISSION SYSTEM EVALUATION APPARATUS AND PROGRAM, AND SIGNAL TRANSMISSION SYSTEM DESIGN METHOD

CROSS-REFERENCE TO RELATED APPLICATIONS

This application is based upon and claims the benefit of priority of the prior Japanese Patent Application No. 2008-223433, filed on Sep. 1, 2008, the entire contents of which are incorporated herein by reference.

FIELD

The present invention relates to a signal transmission system evaluation apparatus and program for evaluation of a signal transmission system, and a signal transmission system design method.

BACKGROUND

Recently, the demand is ever increasing for digital electronic equipment to handle a larger amount of information processing. To meet such a demand, the signal speed is increasing in the equipment, and the transmission margin is being reduced.

In keeping with such a trend, there is a need to estimate a transmission margin with good accuracy by comprehensively estimating a large number of factors that cause deterioration of the transmission margin.

The related art includes a simulation apparatus, a transmission waveform analysis apparatus, and a digital circuit noise analysis method. The simulation apparatus is for virtual design use to find the optimal component layout in a circuit. The transmission waveform analysis apparatus is for estimation of the influence of signal deterioration caused by circuit components in a transmission circuit that performs high-speed serial transmission of digital signals. The digital circuit noise analysis method can complete calculation in a short time. Examples include Japanese Laid-open Patent Publication No. 2005-63070, Japanese Laid-open Patent Publication No. 2004-287738, and Japanese Laid-open Patent Publication No. 2001-265848.

The problem with such related art is that, because no method has been yet proposed to estimate a transmission margin in a fixed manner, the transmission margin has been calculated in various different manners by people in various different fields in charge of design. The resulting calculated transmission margins thus vary in accuracy depending on the personal knowledge and understanding of the field.

There is another problem that a circuit simulation, e.g., HSPICE™, model does not accurately represent component variations, and thus is not capable of accurately evaluating a risk of causing a failure in volume production due to the component variations.

Moreover, obtaining such a circuit simulation model requires a complicated procedure such as concluding an NDA (Non-Disclosure Agreement), for example.

SUMMARY

According to an aspect of the invention, an apparatus includes a parameter acquisition section that acquires model information about a waveform simulation model of a system of signal transmission, a first parameter of a waveform variation in a time direction in the system, and a second parameter of a waveform variation in an amplitude direction in the system; a first eye pattern calculation section that calculates a first eye pattern of the system through a waveform simulation based on the model information acquired by the parameter acquisition section; a second eye pattern calculation section that calculates, based on the first and second parameters acquired by the parameter acquisition section, a second eye pattern through processing of the first eye pattern calculated by the first eye pattern calculation section; and a transmission margin calculation section that calculates, as a transmission margin, a positional relationship between a specific area and an aperture of the second eye pattern calculated by the second eye pattern calculation section.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a table illustrating model elements included in topologies of the embodiment;

FIG. 18 illustrates a message screen to be displayed as a result of the over-amplification measures display process of the embodiment;

FIG. 20 illustrates a message screen to be displayed as a result of the amplification setting display process of the embodiment;

FIG. 37 is a flowchart of a proportion calculation process of the embodiment;

FIG. 38 is a table illustrating crosstalk types of the embodiment;

FIG. 39 is a conceptual diagram illustrating the crosstalk types of T-SS and R-SS of the embodiment;

FIG. 42 is a conceptual diagram illustrating the crosstalk types of T-DD and R-DD of the embodiment;

FIG. 43 is a table illustrating the pin-arrangement dependence of a crosstalk ratio of the embodiment;

FIG. 44 is a table illustrating a correlation between the crosstalk type and the crosstalk ratio of each pin of a transmission-side connector of the embodiment;

FIG. 45 is a table illustrating a correlation between the crosstalk type and the crosstalk ratio of each pin of a reception-side connector of the embodiment;

FIG. 46 is a table illustrating a sum of crosstalk ratios for each of the crosstalk types of the embodiment;

FIG. 47 is a table illustrating a proportion of each of the crosstalk types of the embodiment;

FIG. 48 is a table illustrating conditions for a noise-source amplitude for each of the crosstalk types of the embodiment;

FIG. 49 is a table illustrating wire length for each of the crosstalk types of the embodiment;

FIG. 50 is a table illustrating wire loss for each of the crosstalk types of the embodiment;

FIG. 57 is a table illustrating a noise database of the embodiment;

FIG. 59 is a table illustrating a conditions selection of a transmission speed dependence coefficient in the noise database of the embodiment;

FIG. 60 is a table illustrating a calculation result of the transmission speed dependence coefficient of the embodiment;

FIG. 61 is a table illustrating reference conditions in the noise database of the embodiment;

FIG. 62 is a table illustrating applicable conditions and reference conditions in the noise database of the embodiment;

DESCRIPTION OF EMBODIMENTS

In the below, an embodiment of the invention is described by referring to the accompanying drawings.

Described below is the configuration of a signal transmission system evaluation apparatus of the embodiment.

Figure 1:
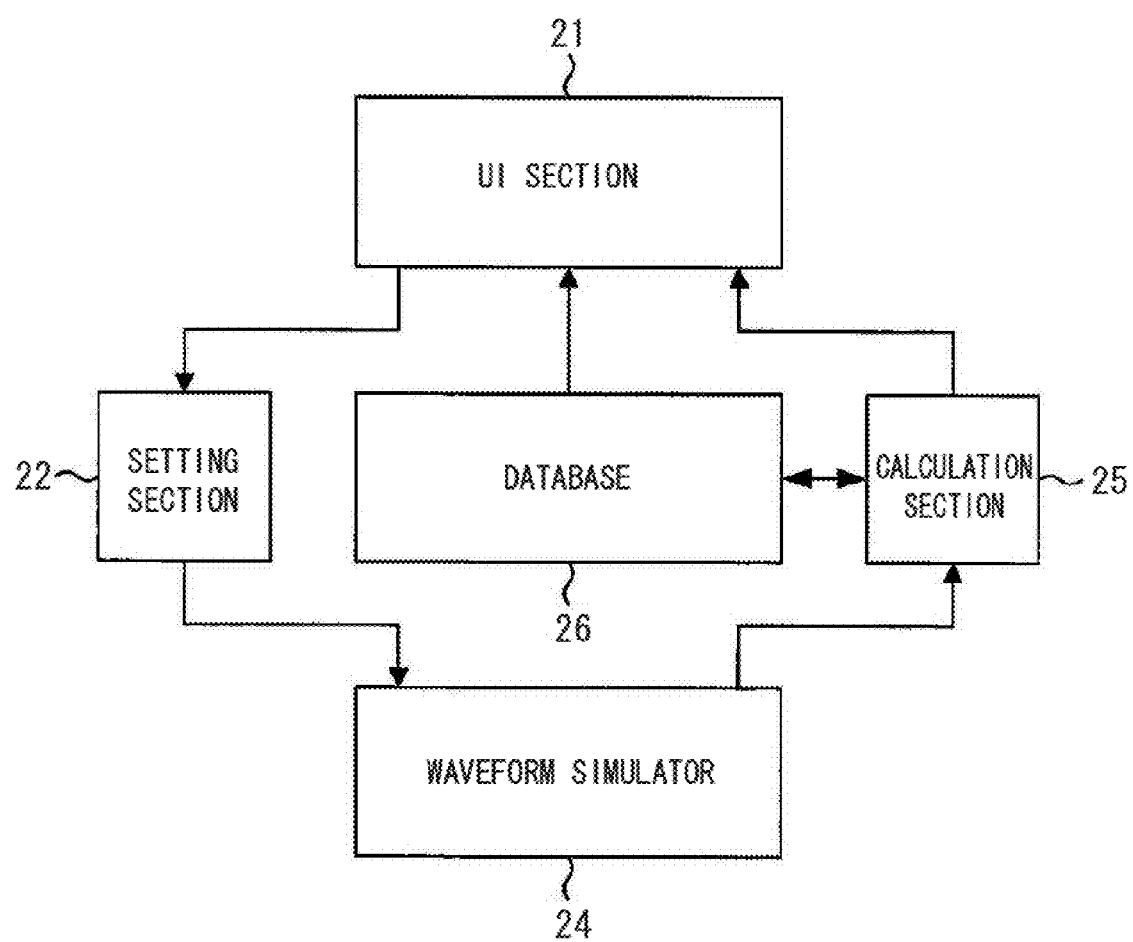
FIG. 1 is a block diagram illustrating a configuration of a signal transmission system evaluation apparatus of an embodiment.

FIG. 1 is a block diagram illustrating an example of a configuration of the signal transmission system evaluation apparatus of the embodiment. This signal transmission system evaluation apparatus includes a UI (User Interface) section 21, a setting section 22, a waveform simulator 24, a calculation section 25, and a database 26.

The UI section 21, the setting section 22, and the database 26, correspond to a parameter acquisition section. The waveform simulator 24 corresponds to a first eye pattern calculation section, and the calculation section 25 corresponds to a second eye pattern calculation section.

The signal transmission system evaluation apparatus of the embodiment stores therein in advance a procedure for calculating a transmission margin and any other items requiring consideration. The signal transmission system evaluation apparatus is configured to perform a waveform simulation based on input conditions, and for the resulting waveform, calculate a transmission margin, i.e., a voltage-axis margin, and a time-axis margin. The input conditions here are those input by a user.

The transmission margin of the embodiment denotes a distance between a specific area set to an eye pattern, e.g., hexagon area, and an aperture of the eye pattern.

Described next is how a signal transmission system evaluation program is run by the signal transmission system evaluation apparatus of the embodiment.

A related art transmission margin calculation method only provides a function for calculating a transmission margin. Therefore, if the simulation result indicates the occurrence of any critical setting error upstream in the calculation process, many manhours are wasted in going back through the workflow and repeating the various steps in the process.

According to this embodiment, setting errors are favorably prevented, a waveform simulation may be performed at the beginning of and/or during a study process, and the procedure provided for a user to follow may reduce manhours through the display of a menu in accordance with the workflow. Due to these characteristics, repeated steps are reduced and studying manhours are also reduced.

Figure 2:
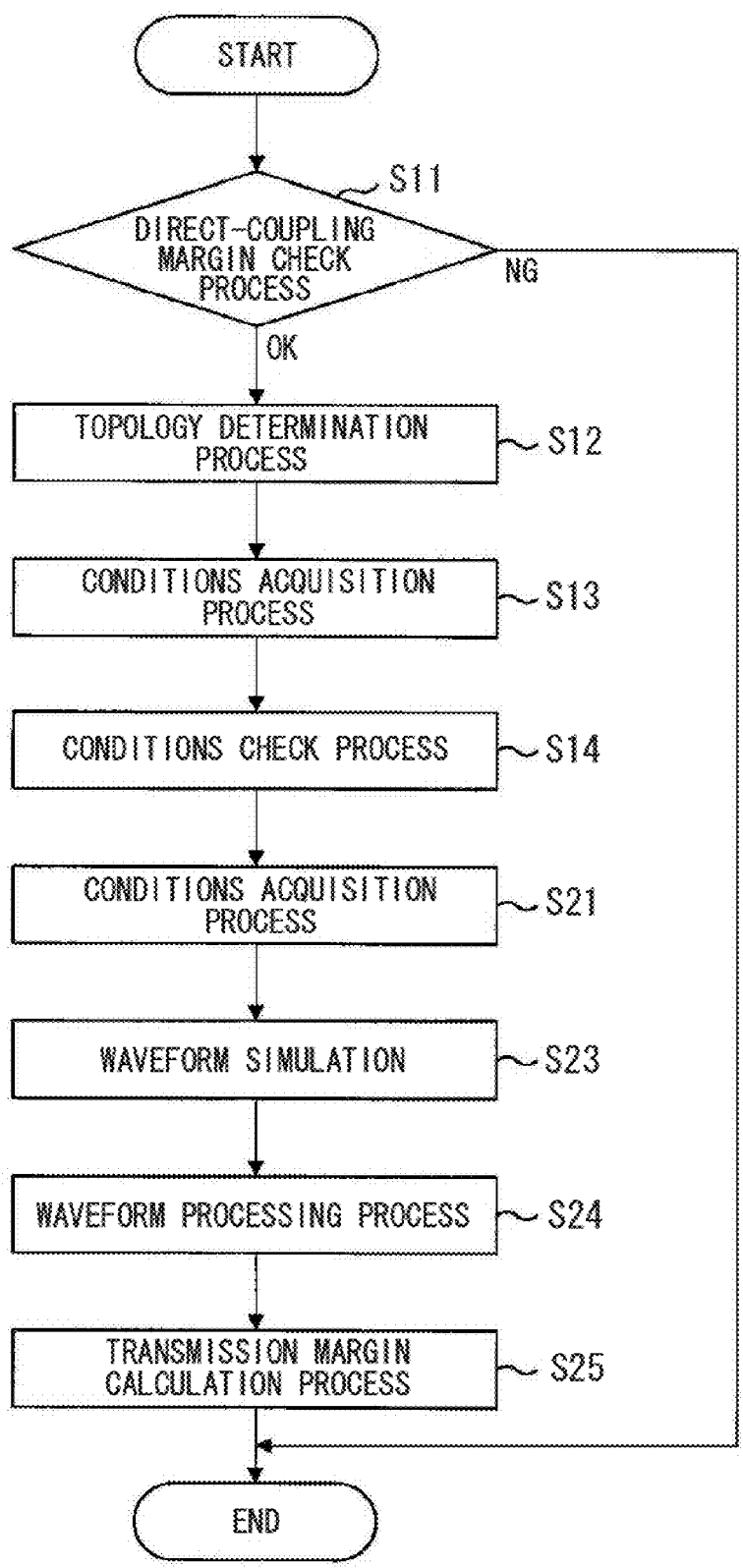
FIG. 2 is a flowchart of how a signal transmission system evaluation program of the embodiment is run.

FIG. 2 is a flowchart of how the signal transmission system evaluation program of the embodiment is run.

First of all, when the signal transmission system evaluation program is activated in response to a specific command, the signal transmission system evaluation apparatus performs a direct-coupling margin check process, and determines whether or not the result of the direct-coupling margin check process is OK (S11). The direct-coupling margin check process is a process for checking a direct-coupling margin, which is a transmission margin when a transmission component is directly coupled with a reception component. When the result of the direct-coupling margin check process indicates an error (S11, NG), the flow is ended. When the result of the direct-coupling margin check process is OK (S11, OK), the procedure goes to the next operation.

Figure 3:
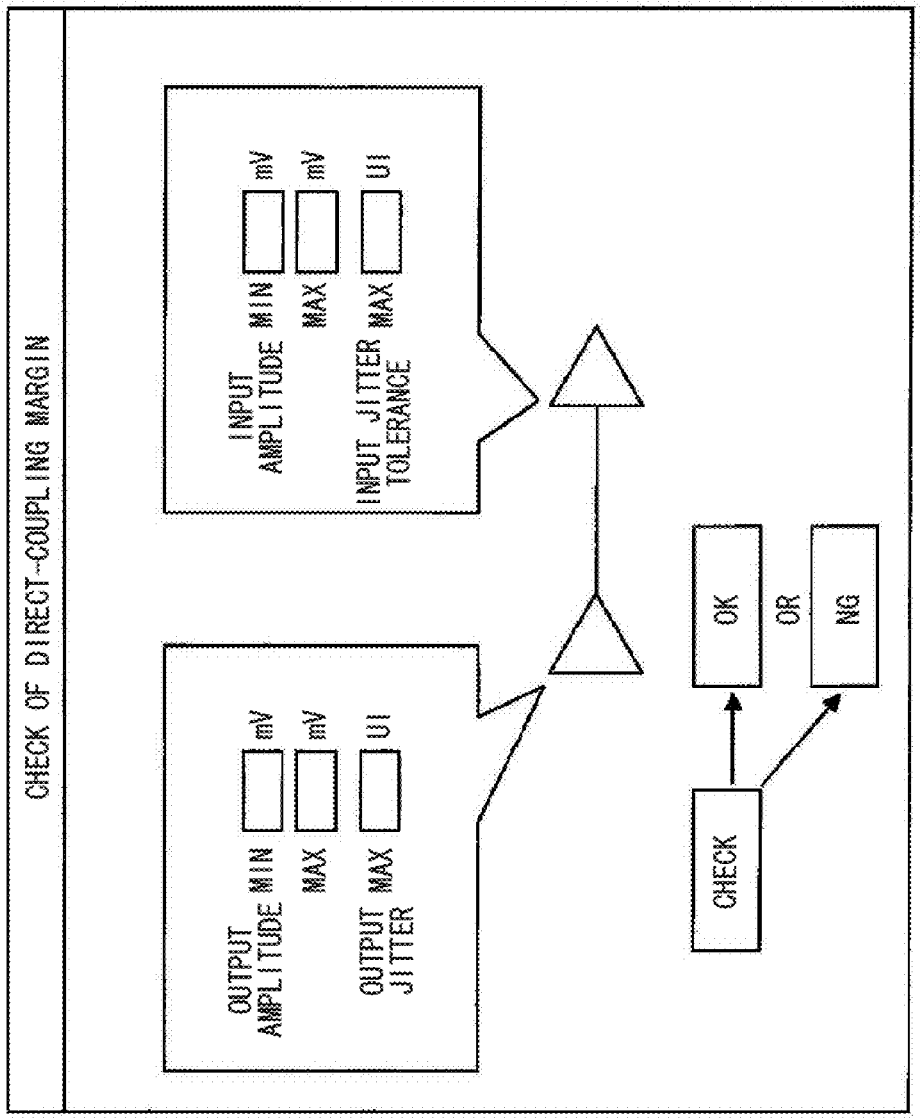
FIG. 3 illustrates a direct-coupling margin check screen of the embodiment.

The UI section 21 displays a direct-coupling margin check screen. In the direct-coupling margin check screen, when a user presses a "check" button after entering any needed information into the items on the screen, the setting section 22 calculates a direct-coupling margin, and displays the calculation result. FIG. 3 illustrates an example of a direct-coupling margin check screen of the embodiment. The items for information entering include items about transmission components, e.g., MIN and MAX output amplitude, and MAX output jitter, and items about reception components, e.g., MIN and MAX input amplitude, and MAX input jitter tolerance.

The direct-coupling margin includes MIN amplitude margin, MAX amplitude margin, and jitter margin. These margins are calculated as follows:

MIN Amplitude Margin=MIN Output Amplitude− MIN Input Amplitude

MAX Amplitude Margin=MAX Input Amplitude− MAX Output Amplitude

Jitter Margin=Input Jitter Tolerance−Output Jitter

When the margins each take a positive value, i.e., positive margin, the UI section 21 displays a button encouraging the user to go to the next process. When any one of the margins takes a negative value, i.e., negative margin, the UI section 21 outputs a message to encourage the user to select another transmission or reception device, and this is the end of the signal transmission system evaluation program.

In the related art, the details to be checked in the direct-coupling margin check process as such in the embodiment are checked in a check process by a simulation, which will be described later. As a result, with the related art, it takes quite a long time to notice that the cause of a negative margin is the failure of the direct-coupling margin, that is, after making detailed settings and performing a simulation. In this embodiment, however, before such settings and simulation, the user is encouraged to consider again the selection made for the transmission and reception devices, thereby contributing to the reduction of the number of manhours to go through for studying.

Figure 4:
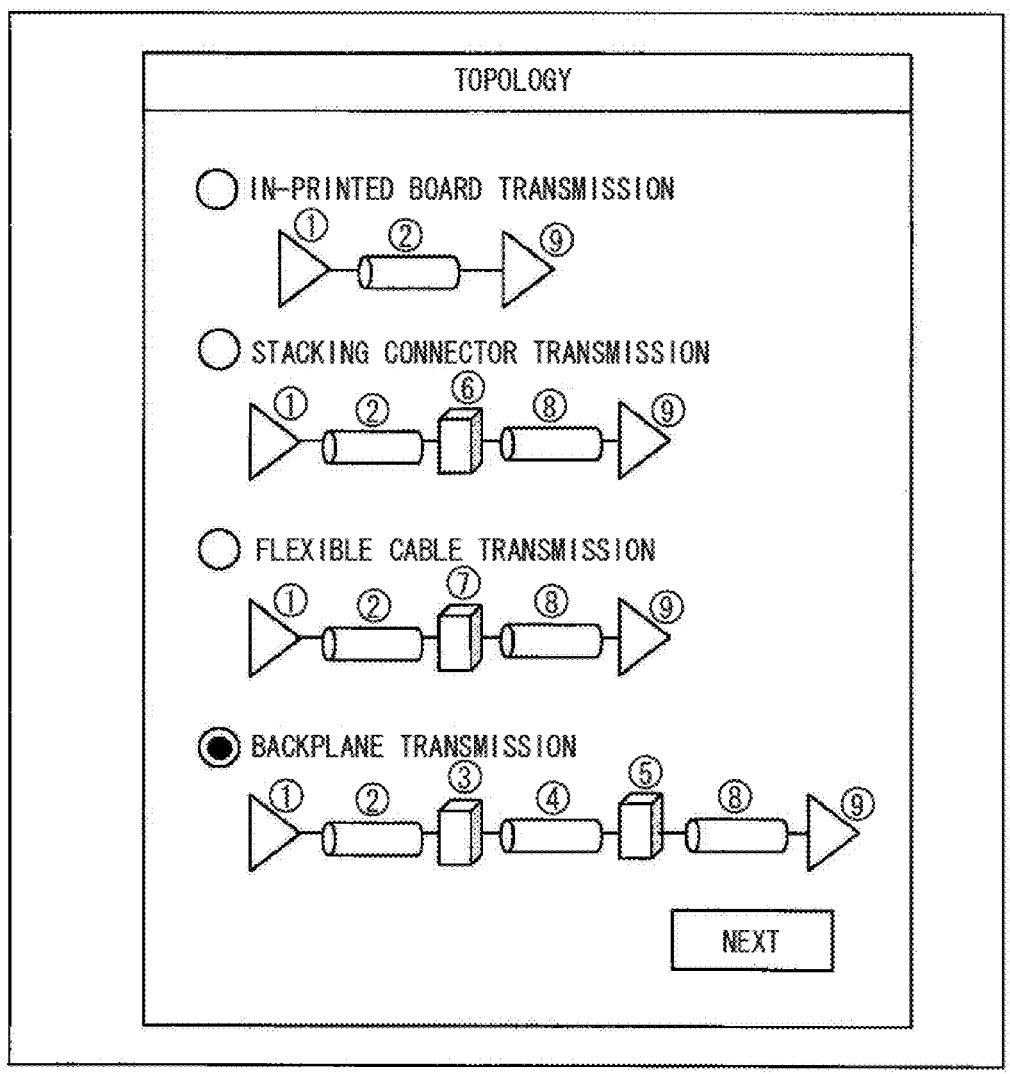
FIG. 4 illustrates a topology determination screen of the embodiment.

The signal transmission system evaluation apparatus then goes through a topology determination process for topology determination (S12). In this process, the UI section 21 displays a topology determination screen. FIG. 4 illustrates an example of a topology determination screen of the embodiment. In the topology determination screen, the user selects any applicable topology from the displayed menu. The selection options of topology include "in-printed board transmission", "stacking connector transmission", "flexible cable transmission", "backplane transmission", and so on. The topology determination screen includes circuit diagrams of model topologies, and model elements E1 to E9. After the completion of the topology selection, the UI section 21 displays a button to encourage the user to go to the next process.

FIG. 5 is a table illustrating example model elements in the topologies of the embodiment. In this table, each circle indicates that the model element is included in the topology. In the database 26, a topology database is stored in advance. This topology database includes model elements of a transmission component E1, a transmission PIU (Plug-In Unit) wiring E2, a transmission-side BWB (Back Wiring Board) connector E3, a BWB wiring E4, a reception-side BWB connector E5, a stacking connector E6, a flexible cable E7, a reception PIU wiring E8, and a reception component E9.

In the related art, the target has been a low- to mid-speed signal, and thus there has been no selection option of topology considering any possible signal loss to be caused by the transmission-path elements (model elements). In this embodiment, any transmission-path elements possibly causing a signal loss are specifically listed, and the resulting list is used to display any selection options possible from the combination of the elements. By selecting any applicable scheme from the selection options for use, all items related to the transmission-path elements are included for studying so that the resulting study may be conducted with increased accuracy.

The signal transmission system evaluation apparatus then goes through a conditions acquisition process for acquiring a user input of conditions (S13). This conditions acquisition process includes a termination pattern selection process for selection of termination patterns, an implementation conditions selection process for selection of implementation conditions, a topology display for display of topologies, and an element conditions acquisition process for acquisition of a user input of element conditions.

Figure 6:
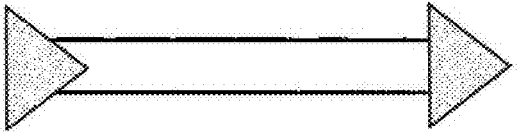
FIG. 6 illustrates a termination pattern selection screen of the embodiment.

In the termination pattern selection process, the UI section 21 displays a termination pattern selection screen. FIG. 6 illustrates an example of a termination pattern selection screen of the embodiment. In the termination pattern selection screen, the user selects any applicable termination pattern from the displayed menu. The selection options of termination pattern include "no external termination", "Posi-Nega 100Ω termination", "50Ω termination at termination potential" "YES or NO of coupling capacitor", and so on. After the completion of the selection of termination pattern, the UI section 21 displays a button to encourage the user to go to the next process.

Figure 7:
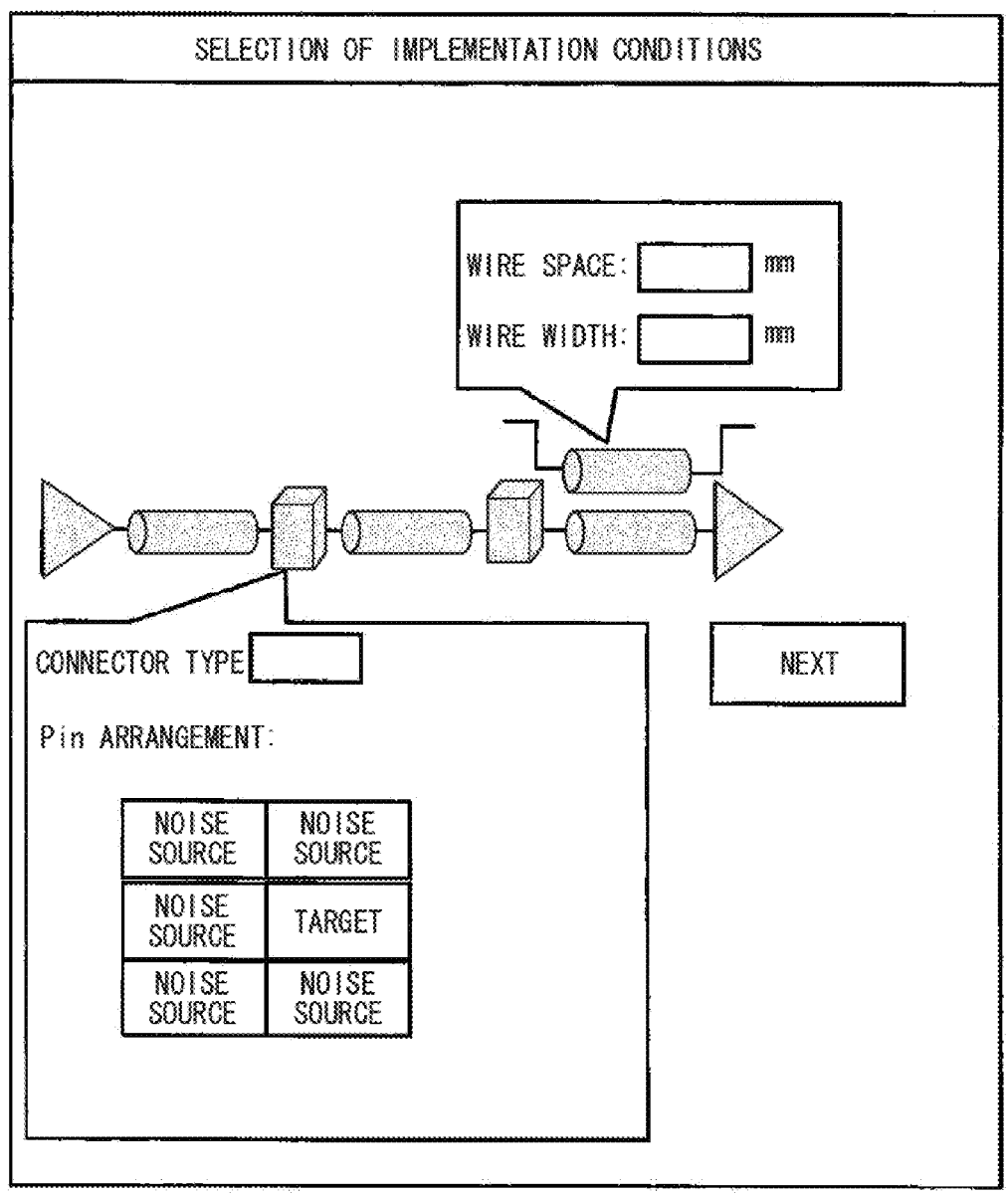
FIG. 7 illustrates an implementation conditions selection screen of the embodiment.

In the implementation conditions selection process, the UI section 21 displays an implementation conditions selection screen. FIG. 7 illustrates an example of an implementation conditions selection screen of the embodiment. In the implementation conditions selection screen, the user selects any implementation conditions for noise calculation from the displayed menu. The selection options of implementation conditions include "wire space", "connector type", "pin arrangement of connector", and so on.

The UI section 21 then uses the pin arrangement of a connector in order to take into account, for crosstalk occurring in the connector, the dependence on a physical distance between the signal pins. Specifically, the UI section 21 makes a setting of pin addresses for a network being the calculation target, and for signals being the noise source existing around the network.

In the related art, only the crosstalk in signal wiring is considered as the cause of noise. Actually, however, the noise generated by the connector is also a factor. In this embodiment, on the other hand, the implementation conditions include "connector type", and "Pin arrangement of connector", and based thereon, the noise calculation is performed. As such, in the embodiment, the conditions are explicitly displayed for accurately estimating the noise as a result of the crosstalk in the connector. This accordingly helps prevent the occurrence of a calculation error that is often caused by various interpretations of the implementation conditions, thereby favorably increasing the accuracy.

Figure 8:
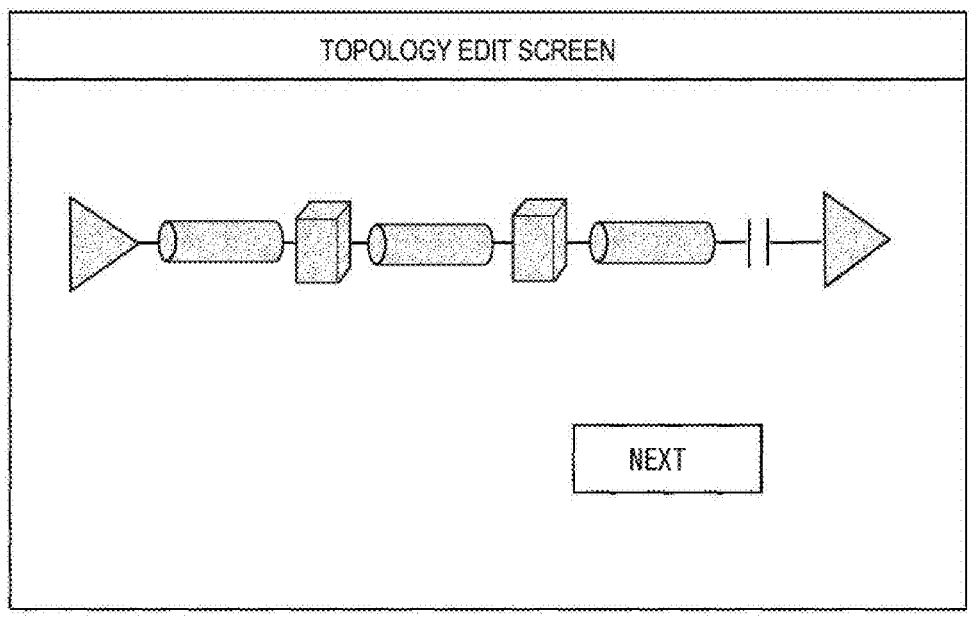
FIG. 8 illustrates a topology edit screen of the embodiment.

In a topology display process, the UI section 21 displays a topology edit screen. FIG. 8 illustrates an example of a topology edit screen of the embodiment. In the topology display process, the UI section 21 reads any applicable topology from the topology database stored in advance in the signal transmission system evaluation apparatus, and displays the read result on the topology edit screen. Such topology reading is performed in accordance with any selected topology, and information about any selected termination pattern.

In the element conditions acquisition process, the UI section 21 encourages the user to make an input of information into any item suspected of causing deterioration of a transmission margin. Specifically, the UI section 21 displays a pop-up menu in response to a user-click with a mouse, for example, of any applicable portion in an image of the actual transmission system. Such a mechanism helps the user's easy understanding in a visual way.

The items for the element conditions include items about a transmission component, e.g., MIN and MAX output amplitude, trtf (time rising, time falling), MAX output jitter, and MIN and MAX pre-emphasis amount, and items about a reception component, e.g., mask (reference area of an eye pattern aperture for calculation of a transmission margin, specific area), and value of built-in termination resistor, and items about a printed wiring board. Such element conditions will be described later.

Note here that an input value in the direct-coupling margin check process is reflected in the items for input in the element conditions acquisition process.

In the related art, the models of transmission and reception devices are generally transistor-level models. Such a model represents characteristics considering the manufacturing variations. However, the manufacturing variations are merely at a transistor-to-transistor level, and are not at a circuit level being a group of transistors.

As such, the input/output characteristics of the transmission and reception devices are generally defined based on the result of an actual measurement performed on a plurality of samples in various lots. The issue here is that the result of the actual measurement performed for defining such input/output characteristics, e.g., specifications, is not reflected very well to such a transistor-level model as above. In this sense, performing a simulation using such a previous transistor-level model does not mean examining, with high accuracy, the component variations in volume production. Such a technique is thus considered highly risky when it is used for examining several thousands to tens of thousands of production lots.

In the embodiment, on the other hand, a model is created based on a defined value that correctly represents the characteristic variations of components in volume production, thereby being able to accurately estimate the risk in volume production. In the embodiment, the models of the transmission and reception devices are each assumed to behave in a typical way. Such a typical behavior model is a combination of an ideal current source and a resistor, and the amplitude may be set to any desired value through adjustment of a value of the current source.

Because the model in the embodiment is an ideal type, the reflection characteristics of the model are slightly different from models of real transmission and reception devices. However, influences over a transmission margin of high-speed transmission are predominantly caused by loss, and the error related to the reflection in the embodiment is already confirmed to fall within the tolerance. To be specific, using a 500-mm thick FR4 substrate with 2.5 Gbps operation, with the conditions of 20% of output impedance difference, the received waveform is observed with an amplitude difference of 0.5% or less.

The technology of this embodiment may prove effective when the high-speed signal transmission becomes more popular for general use, and when the resulting cost reduction leads to the use of any lossy transmission-path components.

Also the technology of this embodiment favorably eliminates the complicated procedure that has been required to obtain transistor-level models from manufacturers, e.g., concluding an NDA, because the circuit configuration of the transistor-level models may be analogized with a glance. With the technology of this embodiment, such models may be created using documents that are generally available, e.g. datasheets, and thus obtaining such models requires less manhours than the related art, thereby increasing the efficiency of studying.

There is a concern that the simulation of a transistor-level model takes quite a long time because such a model is large in size, and is complicated in configuration. With the technology of the embodiment, however, a general behavior model is used to represent the behavior thereof so that the simulation thereof can be completed in a short time. As such, the number of manhours required for studying may be reduced.

Figure 9:
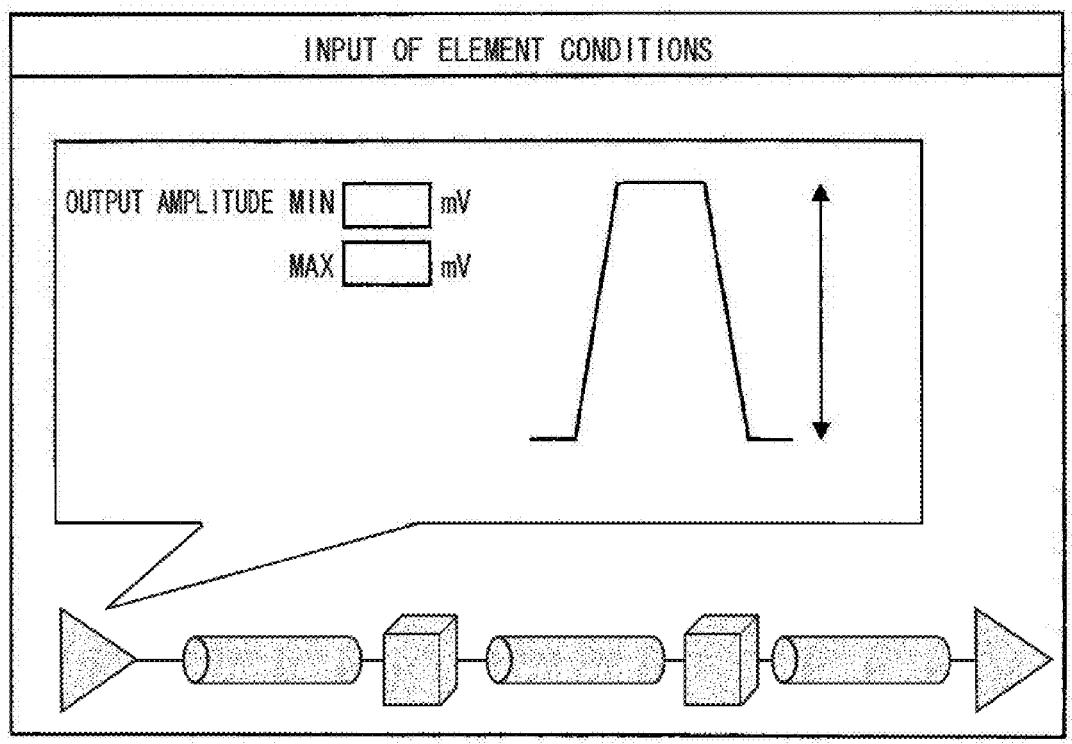
FIG. 9 illustrates an input screen for an output amplitude of a transmission component in an element conditions acquisition process of the embodiment.

Described next is one of the element conditions, i.e., the output amplitude of a transmission component. FIG. 9 illustrates an example input screen for output amplitude of a transmission component in the element conditions acquisition process of the embodiment. Causes of deterioration of a transmission margin may include a transmission-path loss, various types of noise, and the like, and due to these causes, a smaller output amplitude results in a smaller transmission margin. Thus, making an input of the minimum amplitude value as the worst-case condition is desired.

An excessive input margin, which is a margin that corresponds to the maximum amplitude a reception element can receive, is provided as one of the transmission margin calculation items. The input screen requests input of the excessive input margin so that the maximum output amplitude may be considered as a worst-case condition.

Figure 10:
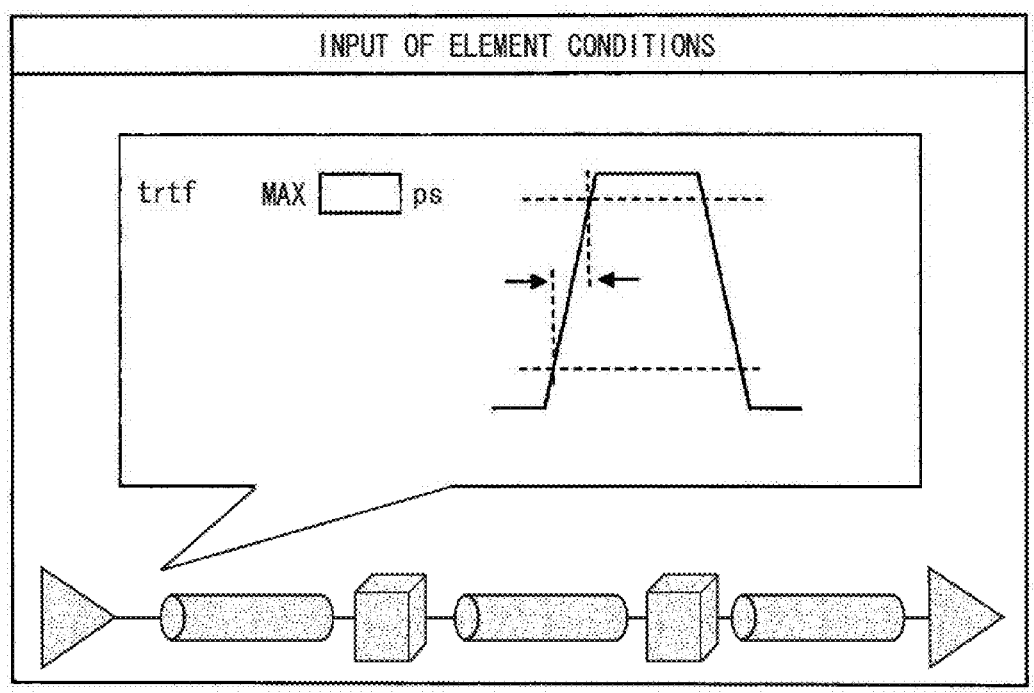
FIG. 10 illustrates an input screen for trtf of a transmission component in the element conditions acquisition process of the embodiment.

Described next is another of the element conditions, i.e., trtf of a transmission device in terms of output amplitude. FIG. 10 illustrates an example input screen for the trtf of a transmission component in the element conditions acquisition process of the embodiment. The calculation item for the transmission margin includes a voltage-axis margin and a time-axis margin, both of which correspond to a mask of the reception component. The input screen requests input of the maximum value of the trtf for each of the margins because a larger trtf results in a smaller aperture of the eye pattern when a waveform reaches the reception component.

Figure 11:
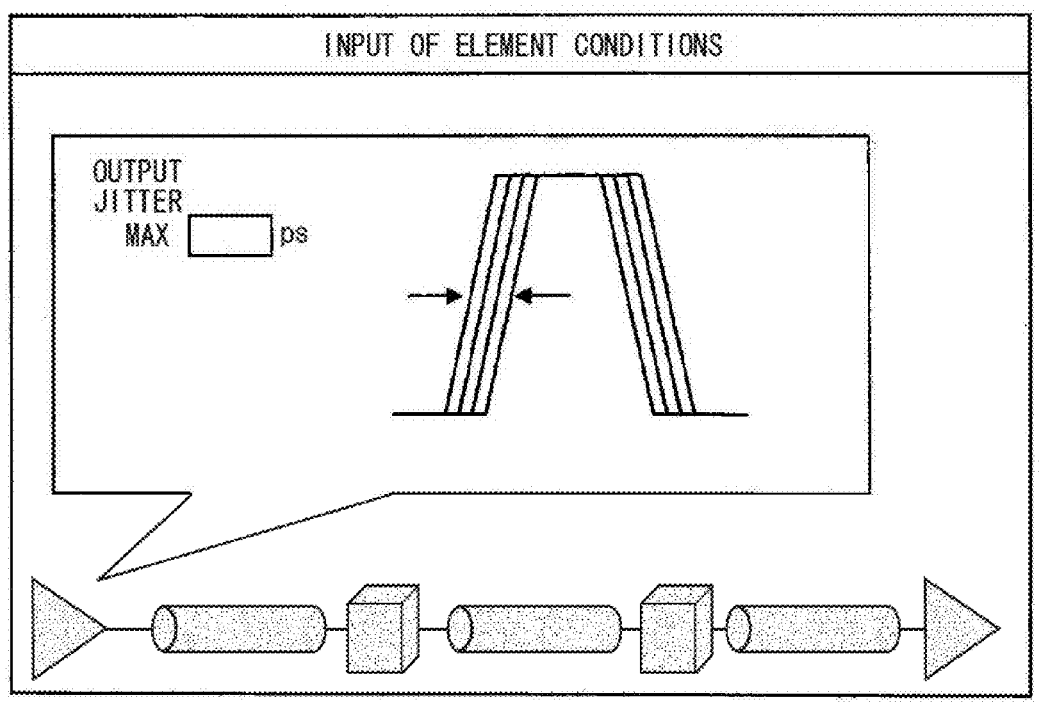
FIG. 11 illustrates an input screen for output jitter of the transmission component in the element conditions acquisition process of the embodiment.

Described next is an output jitter of a transmission component. FIG. 11 illustrates an example of an input screen for output jitter of a transmission component in the element conditions acquisition process of the embodiment. The larger the output jitter of the transmission component, the more the aperture of an eye pattern is reduced in the time-axis direction, thereby reducing the margin with respect to the mask of the reception device. Thus, the input screen requests an input of the maximum value of the output jitter.

Figure 12:
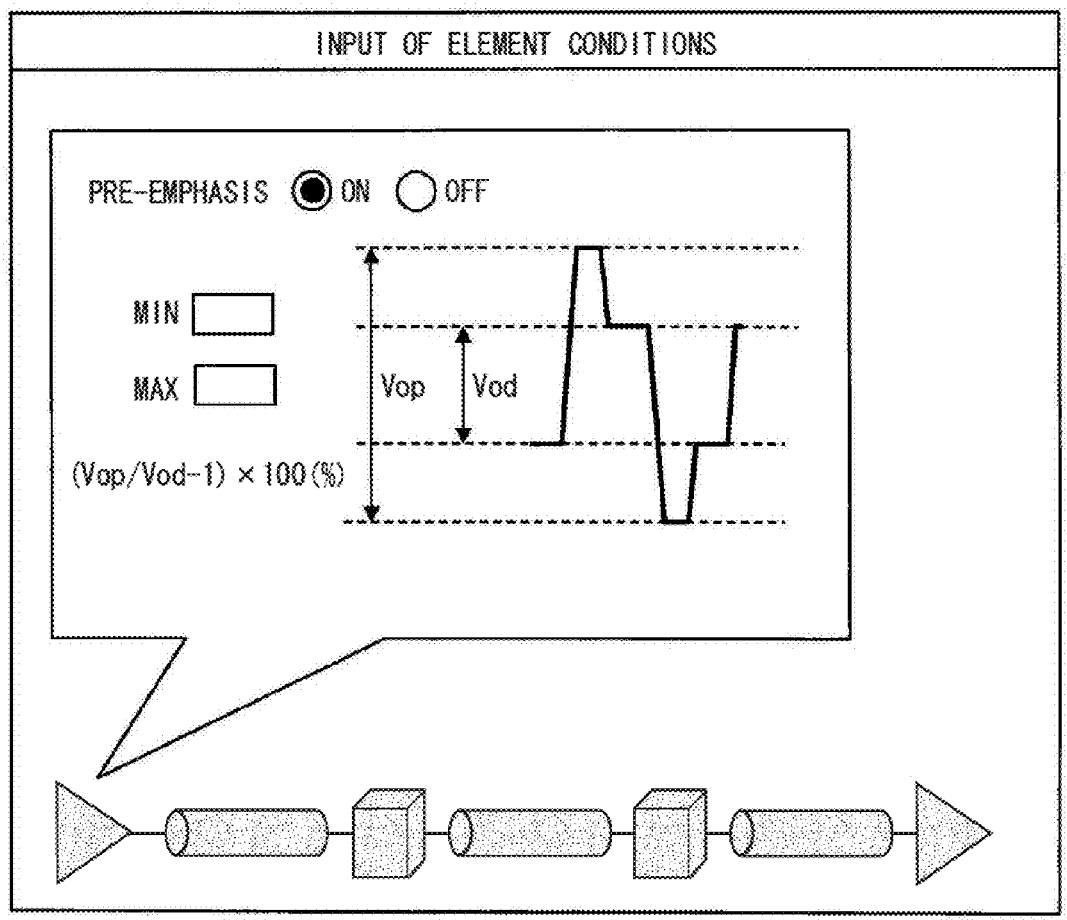
FIG. 12 illustrates an input screen for a pre-emphasis amount of the transmission component in the element conditions acquisition process of the embodiment.

Described next is a pre-emphasis amount of a transmission component. FIG. 12 illustrates an example of an input screen for the pre-emphasis amount of a transmission component in the element conditions acquisition process of the embodiment. There is a technology for increasing the aperture of an eye pattern in the waveform that reaches the reception component by performing circuit compensation on high-frequency components to be attenuated on the transmission path on the transmission component side. The effectiveness of this technology relies on the balance between the amount of attenuation on the transmission path and the pre-emphasis amount in the transmission component. Thus, the input screen requests the inputs of the maximum and minimum values of this pre-emphasis amount. In the screen, a button of "ON/OFF" is provided for use as input conditions to determine excessive emphasis, which will be described later.

Figure 13:
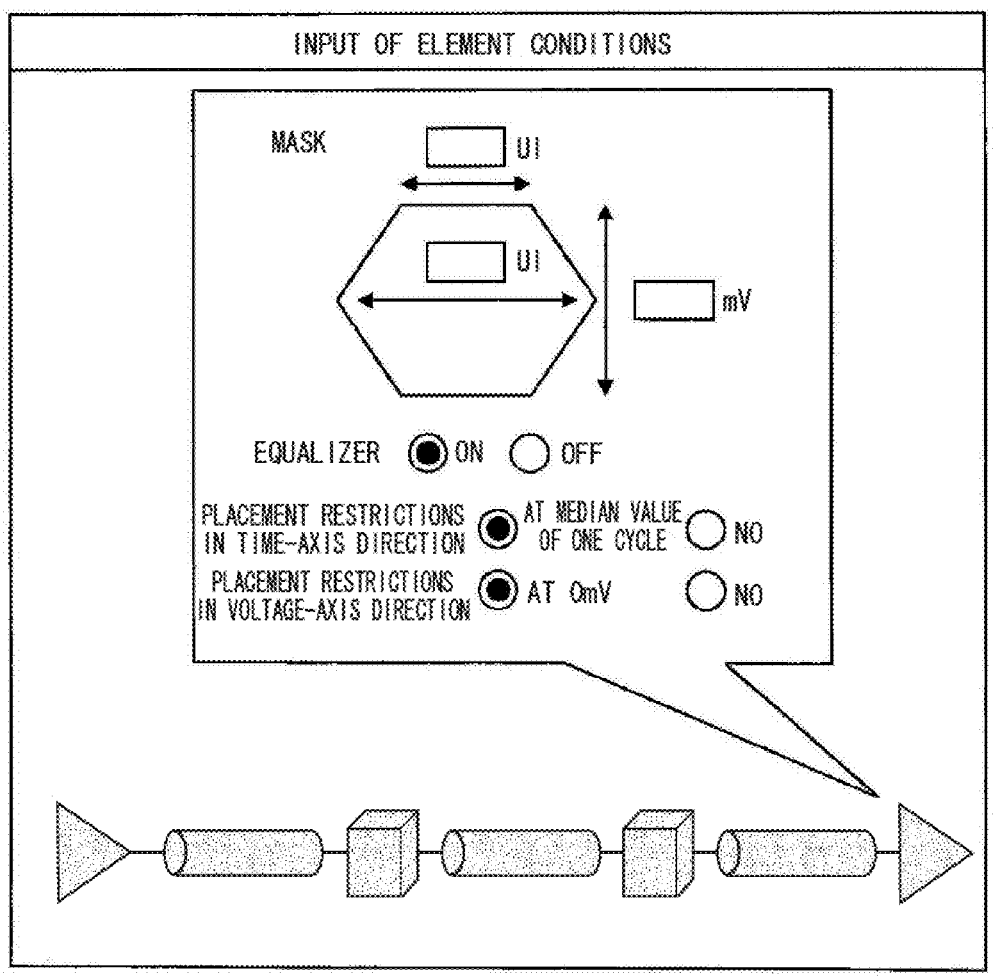
FIG. 13 illustrates an input screen for a mask of a reception component in the element conditions acquisition process of the embodiment.

Described next is the mask of a reception component. FIG. 13 illustrates an example of an input screen for the mask of a reception component in the element conditions acquisition process of the embodiment. The input screen requests the input of a default value for a standard mask for the transmission margin. As illustrated, a hexagonal mask is used for the setting. For use as input conditions for the determination of excessive emphasis that will be described later, the input screen includes an equalizer "ON/OFF" button, and buttons for placement restrictions of the mask.

Figure 14:
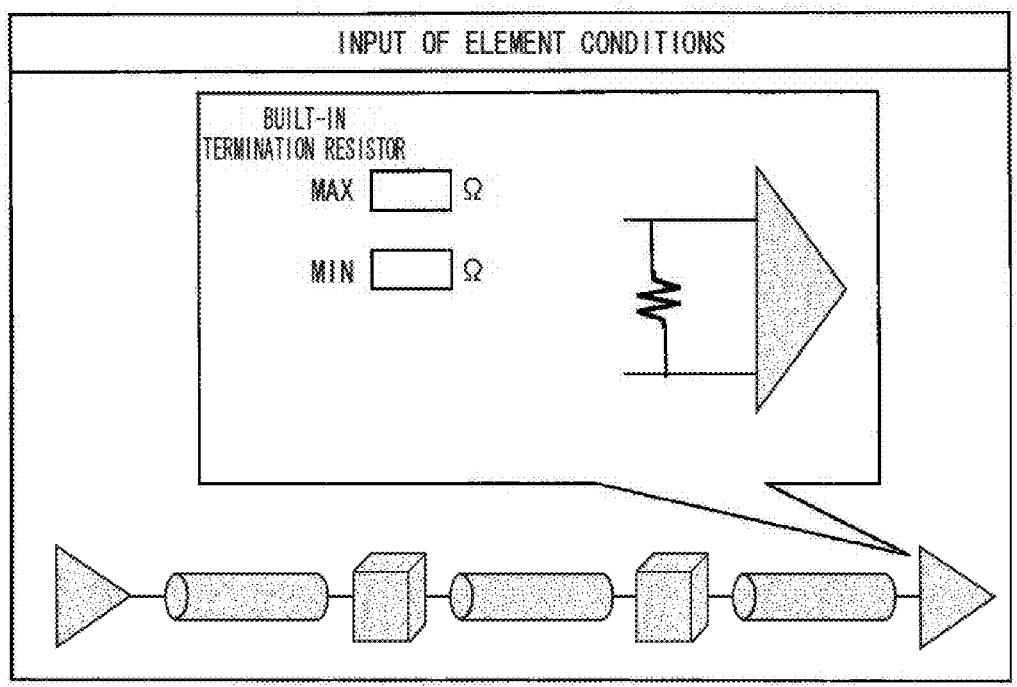
FIG. 14 illustrates an input screen for a value of a built-in termination resistor of the reception component in the element conditions acquisition process of the embodiment.

Described next is a built-in termination resistor value of a reception component. FIG. 14 illustrates an example of an input screen for the built-in termination resistor value of a reception component in the element conditions acquisition process of the embodiment. Recently, reception components for high-speed signals often include a matching termination resistor for the purpose of suppression of reflection. This built-in termination resistor is configured by a semiconductor circuit, and thus may exhibit a wide range of variation. If there is any variation in the value, the mismatch with the characteristic impedance on the transmission path causes reflection, thereby reducing the transmission margin. Thus, the input screen requests the inputs of maximum and minimum values of the built-in termination resistance.

Figure 15:
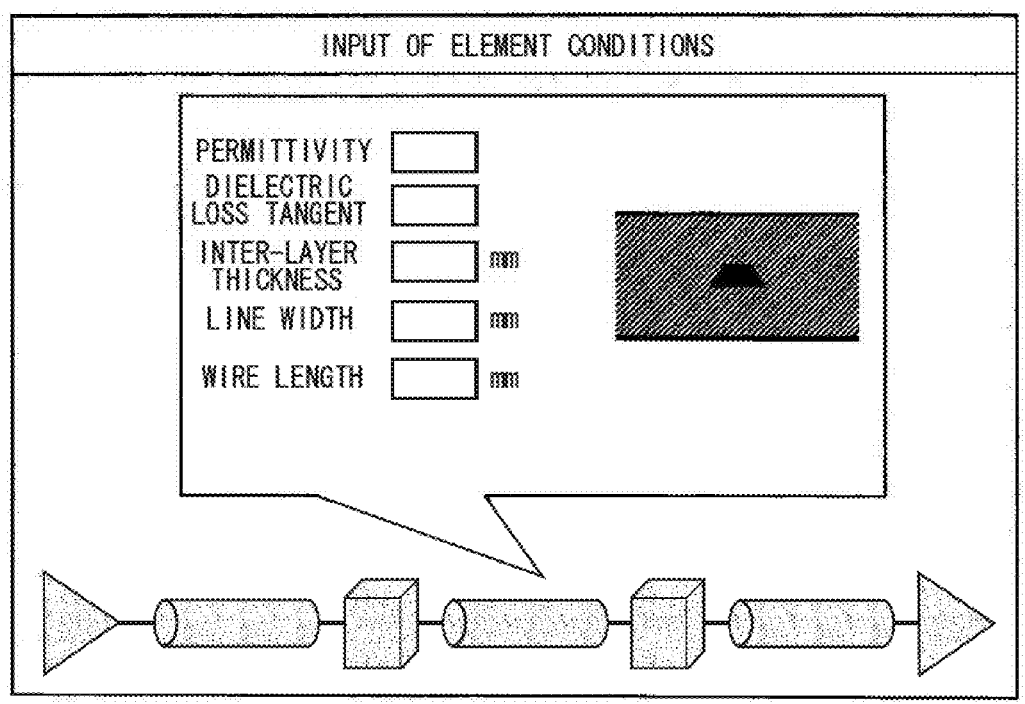
FIG. 15 illustrates an input screen for a printed wiring board in the element conditions acquisition process of the embodiment.

Described next is a printed wiring board. FIG. 15 illustrates an example of an input screen for a printed wiring board in the element conditions acquisition process of the embodiment. The larger the transmission loss of a printed wiring board, the more the signal amplitude will be attenuated, and thus the aperture of an eye pattern of a signal reaching the reception component is reduced in size, thereby reducing the transmission margin. Thus, the transmission loss of the printed wiring board is considered. Since a transmission loss is affected by the material of the printed wiring board, the input screen requests the input of conditions such as the dielectric characteristics and physical dimensions.

The signal transmission system evaluation apparatus then goes through a conditions check process for checking the conditions acquired by the conditions acquisition process (S14). In the conditions check process, the setting section 22 checks parameters acquired by the conditions acquisition process and determines which contents will affect later processes. Based on the determination result, the setting section 22 outputs a message for user attention.

When the parameters set as the conditions are not appropriate, later processes may be needlessly executed considering the original purpose. Moreover, when any conditional branch based on the conditions is required in the later processes, if such a conditional branch is not correctly performed, the study result may be considerably reduced in accuracy. In the related art, because the determination of the element conditions is up to the user, the user may make a wrong determination, and thus many procedures may need to be repeated which may lead to an increase in manhours for studying. On the other hand, in this embodiment, a technique for preventing the possibility of repeating the same steps is provided by including a function of outputting messages asking for the determination of conditions and for user attention. This accordingly leads to the effective reduction of the number of manhours for studying.

The conditions check process includes other processes, e.g., selection of mask placement method, display of measures against excessive amplification, and display of amplification setting.

Described next is the mask placement method selection process.

The user determines which method to use for mask placement in the direction of voltage axis direction, e.g., the direction of amplitude, and the direction of time-axis, e.g., the direction of time. Such a mask placement is determined based on the attribute of the model of a reception component. When there are no restrictions on the mask placement, the setting section 22 automatically optimizes the mask placement to maximize the transmission margin.

Figure 16:
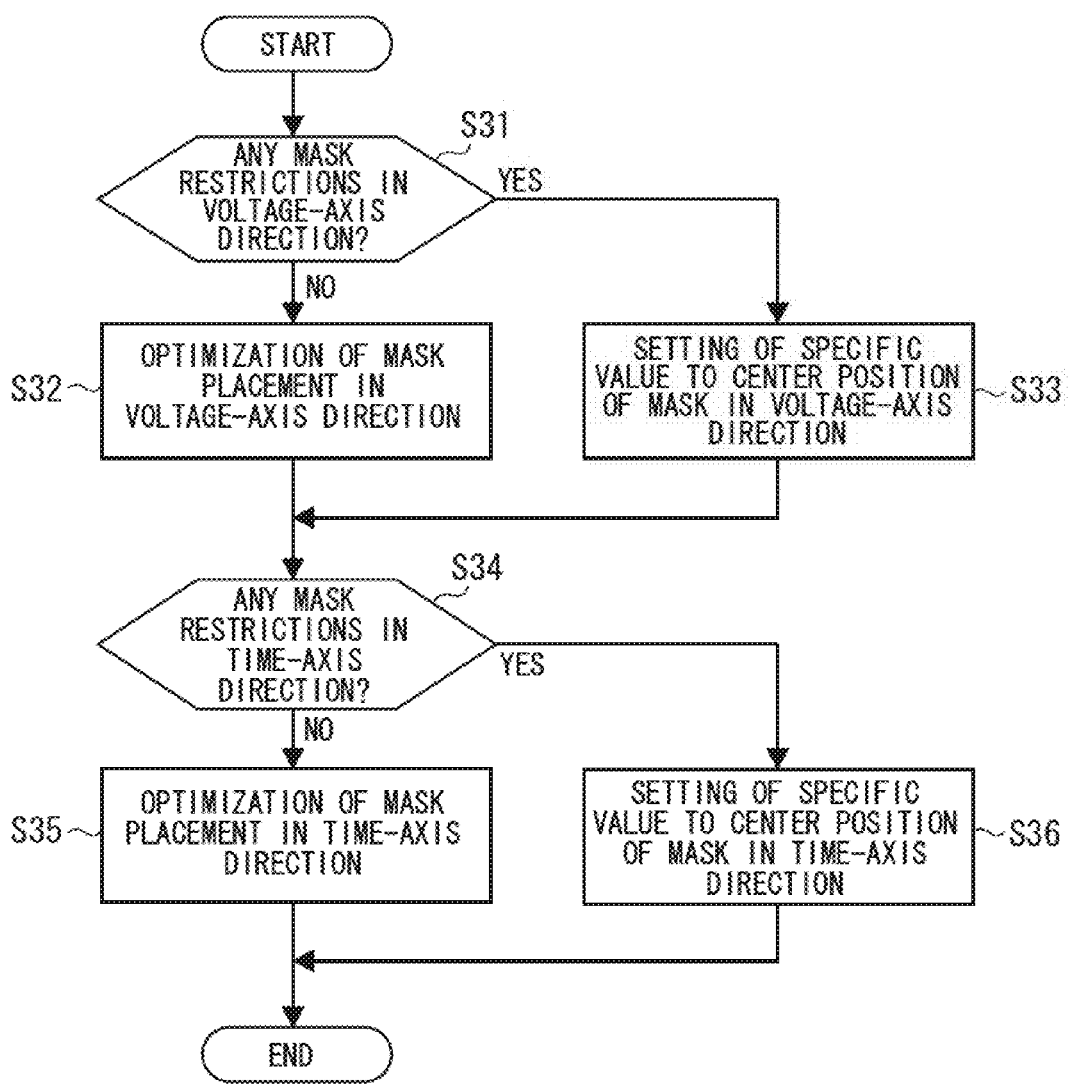
FIG. 16 is a flowchart of a mask placement method selection process of the embodiment.

FIG. 16 is a flowchart of an example of a mask placement method selection process of the embodiment. First, the setting section 22 makes a determination whether there are any restrictions on the mask placement in the voltage-axis direction (S31). When there are no such restrictions on the mask placement in the voltage-axis direction (S31, NO), the setting section 22 optimizes the position of the mask in the voltage-axis direction (S32). When there are restrictions on the position of the mask in the voltage-axis direction (S31, YES), the setting section 22 sets the center position of the mask in the voltage-axis direction to a specific value, e.g., voltage-axis margin of 0 mV (S33).

The setting section 22 then determines whether or not there are any restrictions on the mask placement in the time-axis direction (S34). When there are no such restrictions on the mask placement in the time-axis direction (S34, NO), the setting section 22 optimizes the position of the mask in the time-axis direction (S35), and then the process is completed. When there are restrictions on the position of the mask in the time-axis direction (S34, YES), the setting section 22 sets the center position of the mask in the time-axis direction to a specific value, e.g., a value halfway through a transmission clock cycle (S36), and then the process is completed.

Described next is an over-amplification measures display process.

When the equalizer is ON, and when the pre-emphasis function is ON in a short transmission path, high-frequency components may be excessively amplified, thereby possibly causing a transmission error. For preventing such a possibility, the topology of an in-printed board transmission is selected, and when both the pre-emphasis function and the equalizer are ON, a message is displayed to encourage the user to perform a simulation after taking measures against the excessive emphasis.

Figure 17:
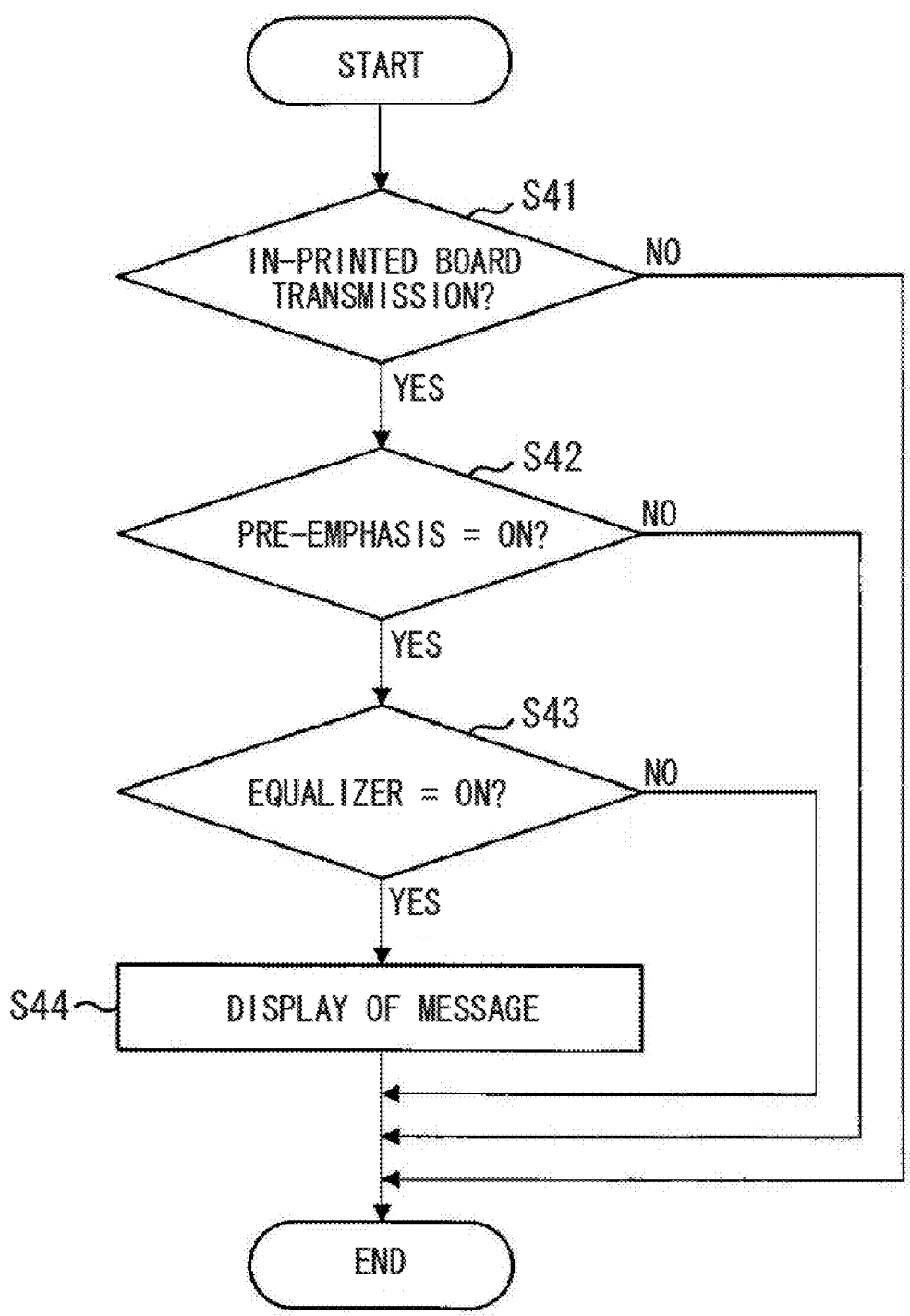
FIG. 17 is a flowchart of an over-amplification measures display process of the embodiment.

FIG. 17 is a flowchart of an example of an over-amplification measures display process of the embodiment. First of all, the setting section 22 makes a determination whether or not the topology is the in-printed board transmission (S41). When the topology is not the in-printed board transmission (S41, NO), the process is completed.

When the topology is the in-printed board transmission (S41, YES), the setting section 22 makes a determination whether or not the pre-emphasis function is ON (S42). When the pre-emphasis function is not ON (S42, NO), the process is completed.

When the pre-emphasis function is ON (S42, YES), the setting section 22 makes a determination whether or not the equalizer is ON (S43). When the equalizer is not ON (S43, N), the process is completed.

When the equalizer is ON (S43, YES), the UI section 21 displays a message to encourage the user to turn OFF either the pre-emphasis function or the equalizer (S44), and then the process is completed. FIG. 18 illustrates an example of a message screen to be displayed as a result of the over-amplification measures display process of the embodiment.

Described next is an amplification setting display process.

Using information about a transmission path, e.g., physical dimensions and dielectric loss, the setting section 22 calculates a loss in the transmission path. When the resulting loss exceeds a specific reference value, the UI section 21 outputs a message to encourage the user to turn ON the pre-emphasis function or the equalizer. The loss of the transmission path is calculated first by finding a loss per unit length based on the cross sectional dimension, the permittivity, and the dielectric loss tangent, and then by multiplying the result by the wire length.

Figure 19:
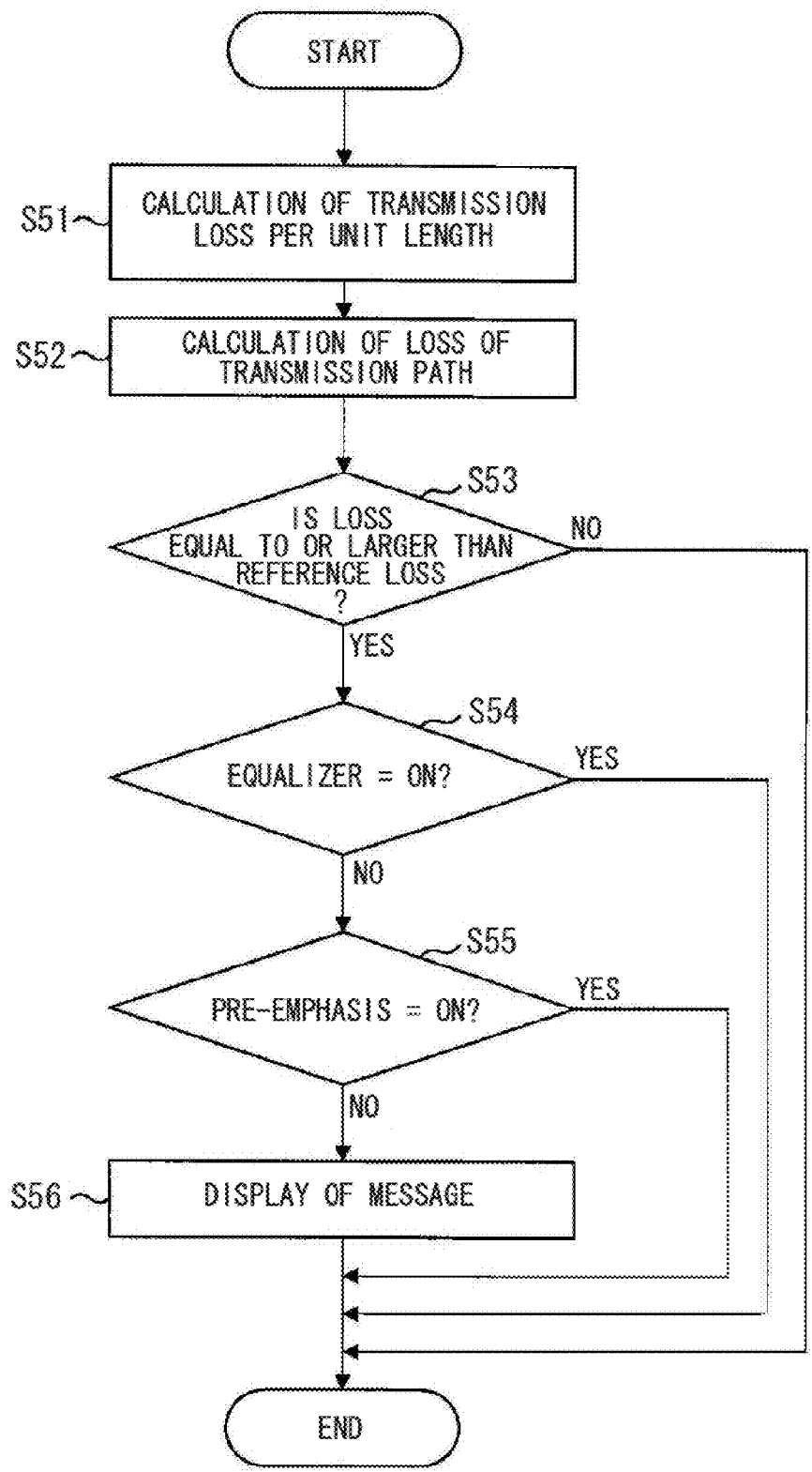
FIG. 19 is a flowchart of an amplification setting display process of the embodiment.

FIG. 19 is a flowchart of an example of an amplification setting display process of the embodiment. First of all, the setting section 22 calculates a transmission loss per unit length based on the physical information about the transmission path (S51). The setting section 22 then calculates the loss of the transmission path based on the wire length (S52).

The setting section 22 then makes a determination whether or not the loss calculated in the process steps S51 and S52 is equal to or larger than a specific reference value of loss (S53).

When the calculation result of loss is not equal to or larger than the reference value of loss (S53, NO), the process is completed.

When the calculation result of loss is equal to or larger than the reference value of loss (S53, YES), the setting section 22 determines whether or not the equalizer is ON (S54). When the equalizer is ON (S54, YES), the process is completed.

When the equalizer is not ON (S54, NO), the setting section 22 makes a determination whether or not the pre-emphasis function is ON (S55). When the pre-emphasis function is ON (S55, YES), the process is completed.

When the pre-emphasis function is not ON (S55, NO), the UI section 21 displays a message to encourage the user to turn ON either the pre-emphasis function or the equalizer (S56), and then the process is completed. FIG. 20 illustrates an example of a message screen to be displayed as a result of the amplification setting display process of this embodiment.

The signal transmission system evaluation apparatus then performs a connector crosstalk calculation process for calculation of connector-crosstalk noise (amount of crosstalk) based on the pin arrangement of the connector (S21). In the connector crosstalk calculation process, the calculation section 25 performs such calculation of noise based on the implementation conditions selected as a result of the implementation conditions selection process. The database 26 stores a noise database in advance. The noise database is a database created based on the result of actual measurements or simulations. The calculation section 25 performs calculation of connector-crosstalk noise by approximate calculation based on the noise database and the conditions applied to the target signal transmission system, e.g., applicable conditions.

The signal transmission system evaluation apparatus then performs a waveform simulation (S23).

Figure 21:
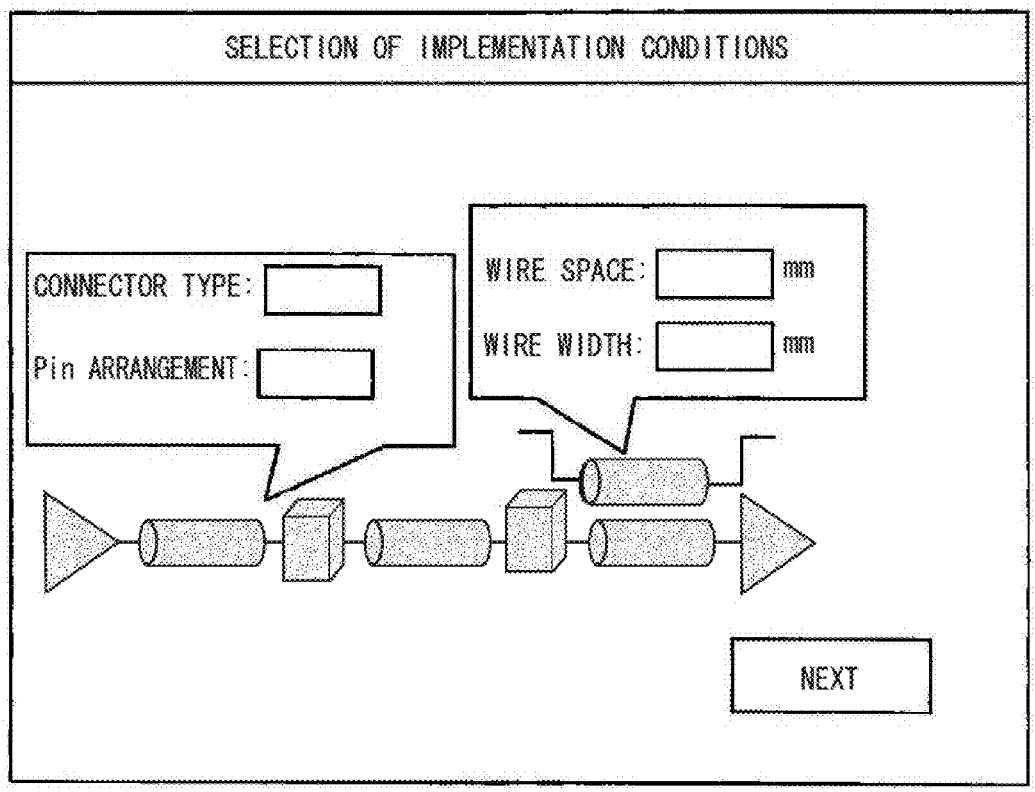
FIG. 21 illustrates an implementation conditions selection screen of the embodiment.
Figure 21A:
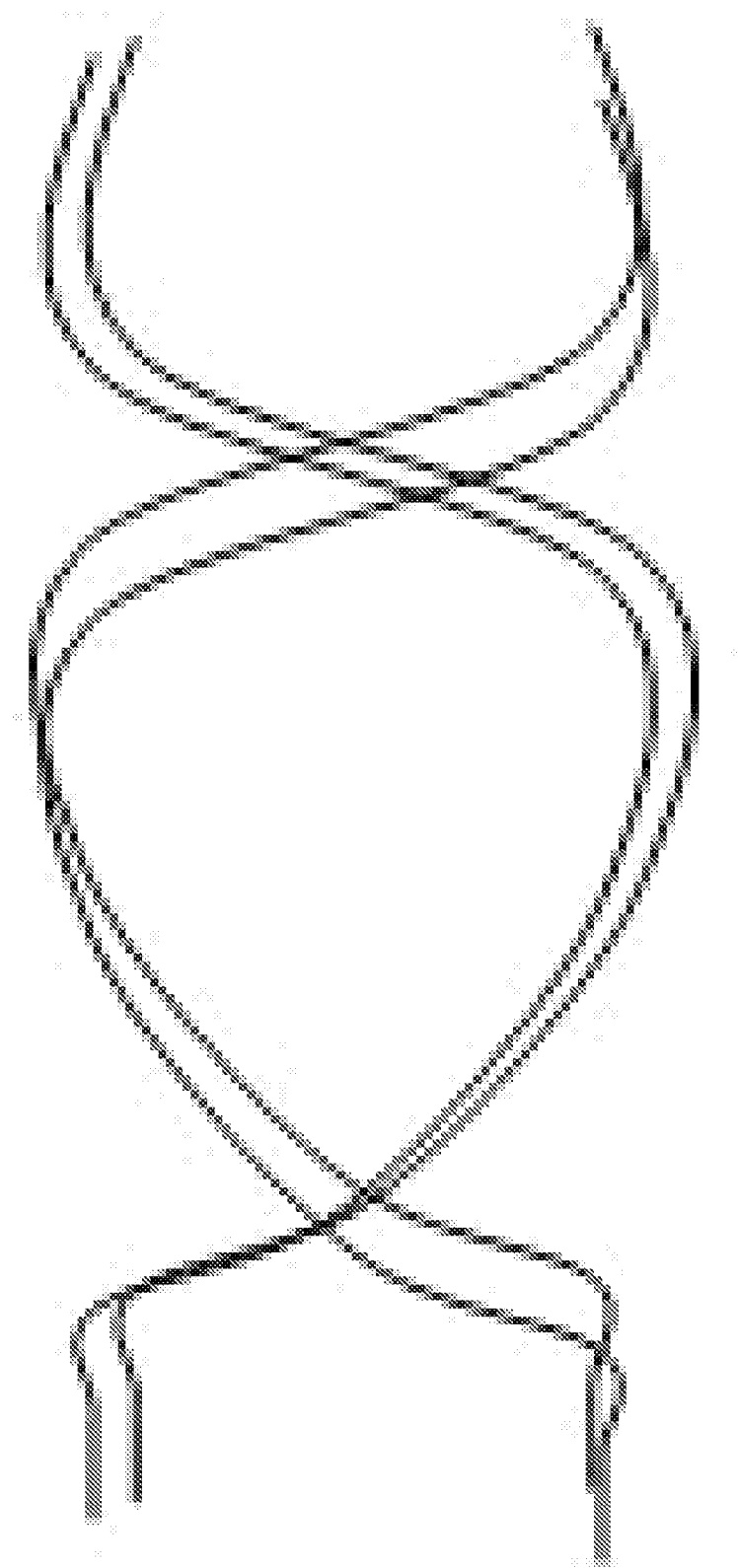
FIG. 21A is a conceptual diagram illustrating a received waveform acquired as a result of a waveform simulation of the embodiment.

In the waveform simulation, the setting section 22 sets the acquired conditions to a waveform simulation model. After completing the setting, the waveform simulator 24 performs the waveform simulation. The waveform simulation may be performed by a general circuit simulator. The reception waveform of the reception component obtained from the waveform simulation reflects the characteristics of the transmission component and those of the printed wiring board. FIG. 21 illustrates an example implementation conditions selection screen.

the signal transmission system evaluation apparatus then goes through a waveform processing process for processing the result of the waveform simulation (S24). In the waveform processing process, the calculation section 25 processes the waveform received (illustrated in FIG. 21A) from the waveform simulation.

Figure 22:
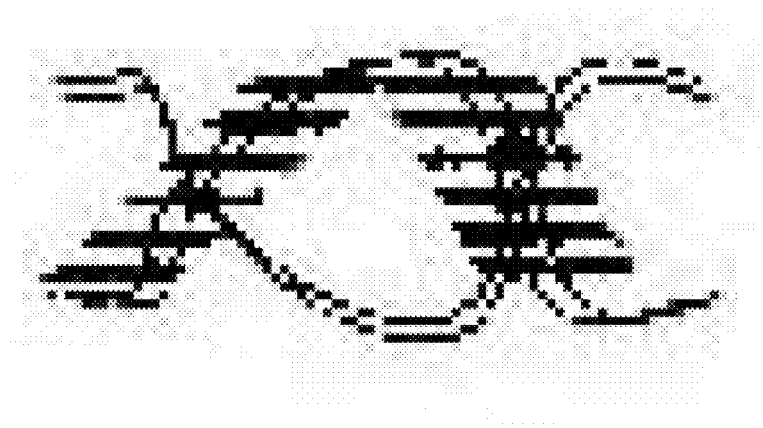
FIG. 22 is a conceptual diagram illustrating a representation of output jitter in a waveform display screen of the embodiment.

Described below is how output jitter is taken into consideration in the waveform processing process. With the occurrence of jitter, the rising portion of the waveform illustrates variation phenomenon in the time-axis direction. Because a general waveform simulation model cannot represent such a phenomenon, the calculation section 25 widens the waveform in the time-axis direction in the waveform display screen to represent such a phenomenon. FIG. 22 is a conceptual diagram illustrating an example of a representation of output jitter in the waveform display screen of the embodiment. The waveform of an eye pattern is widened in the time-axis direction. This width corresponds to the value of the observed output jitter, and is calculated as follows:

Display Width of Output Jitter (mm)=Width corresponding to Unit Time (mm/ps)×Amount of Output Jitter (ps)

The calculation section 25 then calculates a transmission margin based on the width of the widened waveform.

Figure 23:
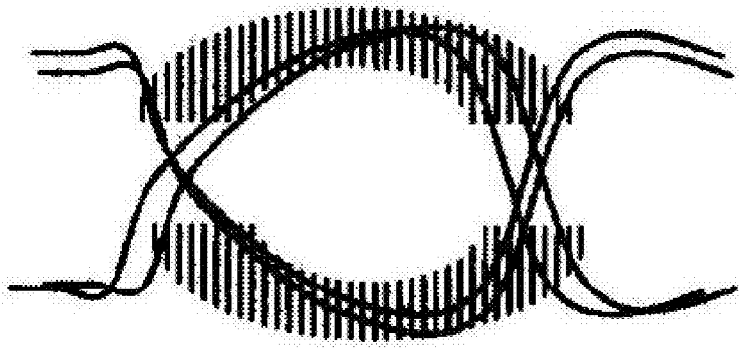
FIG. 23 is a conceptual diagram illustrating a representation of noise in the waveform display screen of the embodiment.

Described next is how noise is considered in the waveform processing process. Noise includes connector crosstalk and printed-wiring-board crosstalk. Noise is a phenomenon in which the waveform illustrates variation in the voltage-axis direction, and a general waveform simulation model cannot represent such a phenomenon. The calculation section 25 widens the waveform in the voltage-axis direction in the waveform display screen to represent such a phenomenon. FIG. 23 is a conceptual diagram illustrating an example of a representation of noise in the waveform display screen of the embodiment. In this drawing, the waveform of an eye pattern is widened in the voltage-axis direction. This width corresponds to an amount of addition of the input crosstalk, e.g., connector crosstalk, and printed-wiring-board crosstalk. This amount is an amount representing the peak value of the noise by the amount of voltage [V]. Based on the width of the widened waveform, a transmission margin is calculated as follows:

Display Width of Noise (mm)=Width corresponding to Unit Voltage (mm/ps)×Amount of Noise (mV)

The calculation section 25 then performs a transmission margin calculation process for calculating a transmission margin based on the result of the waveform simulation (S25), and the process is completed.

In the transmission margin calculation process, the calculation section 25 places a mask to the waveform reflecting the output jitter and the noise displayed as a result of the waveform processing process. The mask here is a mask defined as a standard value of the reception component. On the coordinate axis, a difference between the waveform and the mask is calculated, and the result is the transmission margin.

Figure 24:
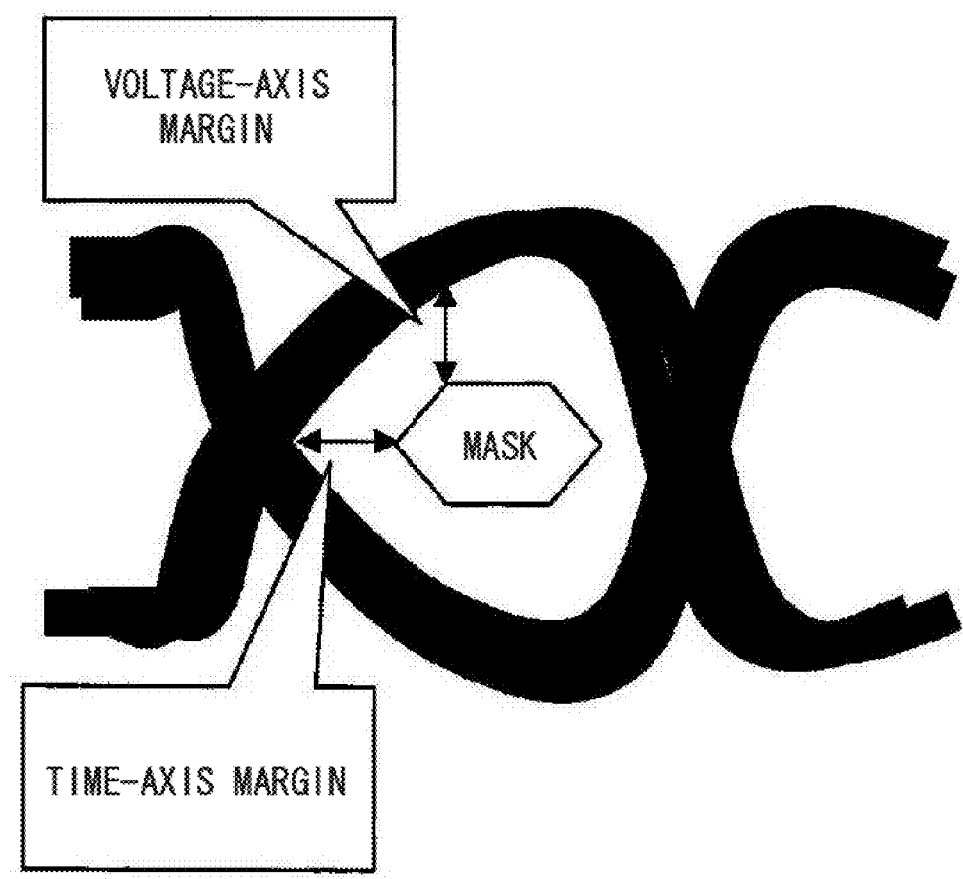
FIG. 24 is a conceptual diagram illustrating a transmission margin of the embodiment.

The transmission margin includes a voltage-axis margin, and a time-axis margin. FIG. 24 is a conceptual diagram illustrating an example of a transmission margin of the embodiment. The hexagon at the center of the drawing is a mask. Also in this drawing, the lateral axis indicates the time axis, and the vertical axis indicates the voltage axis. Herein, the distance in the time-axis direction from the specific vertex of the mask to the aperture of the eye pattern is assumed to be the time-axis margin, and the distance in the voltage-axis direction from the specific vertex of the mask to the aperture of the eye pattern is assumed to be the voltage-axis margin.

With the related art, only the function of placing a mask to a displayed waveform has been provided, and placing a mask as such may be the cause of an error because the knowledge and understanding of users are not all the same. With this embodiment, on the other hand, the signal transmission system evaluation program performs all functions, i.e., from placement of a mask to the calculation of margins. This accordingly prevents the result from varying due to user involvement, thereby effectively increasing the accuracy, and reducing the number of manhours required for studying.

The transmission margin calculation process is performed differently depending on whether there are any restrictions on the mask placement or not.

Described now is the transmission margin calculation process with the restrictions on the mask placement.

Figure 25:
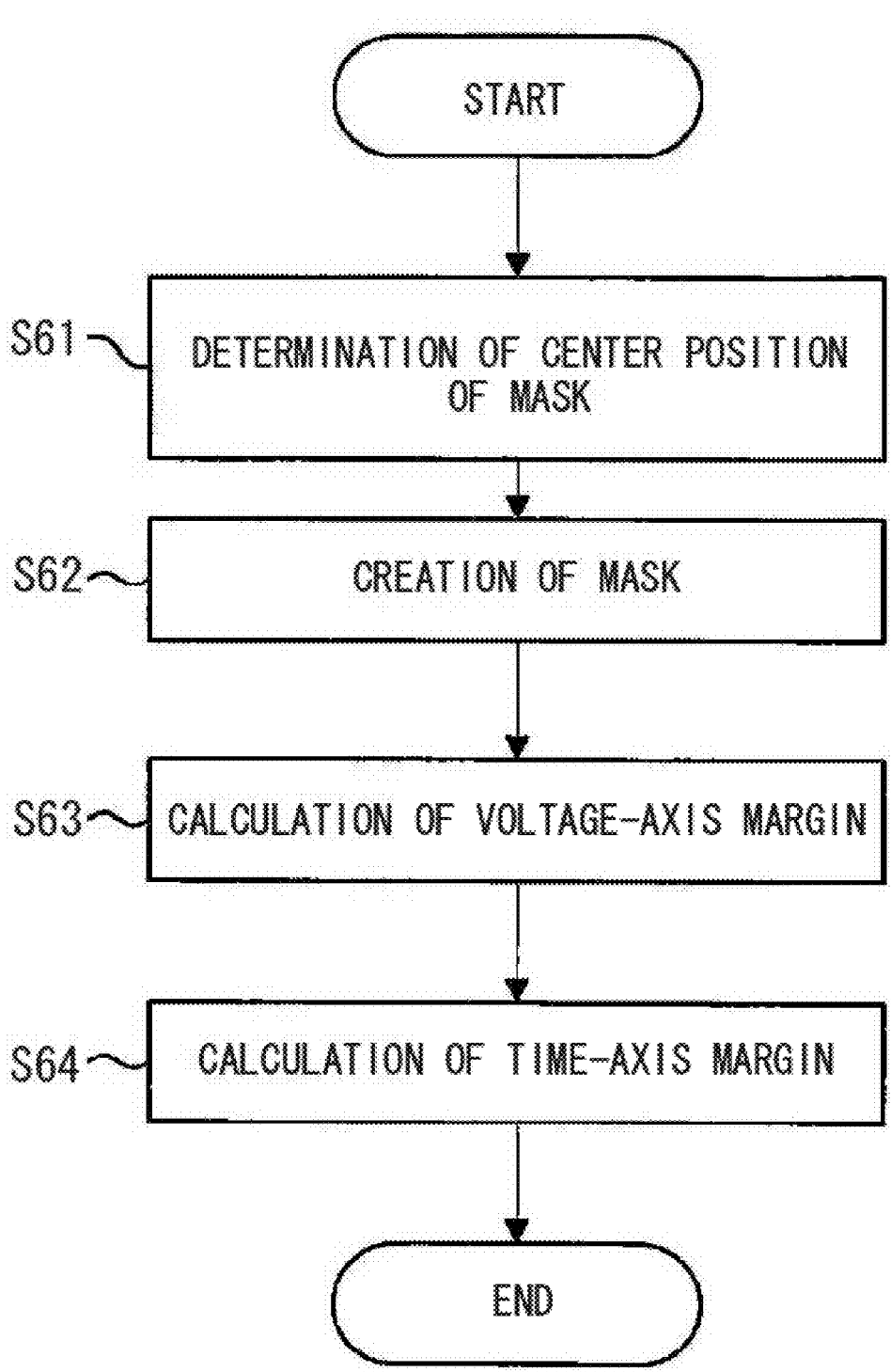
FIG. 25 is a flowchart of a transmission margin calculation process of the embodiment with mask placement restrictions.

FIG. 25 is a flowchart of an example of a transmission margin calculation process of the embodiment with the restrictions on the mask placement. First of all, the calculation section 25 determines the center position of a mask (S61). High-speed data communication devices are provided with a function, e.g., a circuit, called clock data recovery (hereinafter, referred to as "CDR") for optimizing the timing for data extraction. Considering the characteristics of this circuit, the mask for use as a reference for determination is required to be placed at the center of the aperture of the eye pattern on the time axis. To find the center position, the calculation section 25 first identifies the position of the eye pattern on the time axis, and the center of the result is determined as the center position of the mask.

The calculation section 25 then creates a mask (S62). The calculation section 25 then uses, as a reference, the center position of the mask determined above to create a mask serving as a reference for determination of the eye pattern. The mask is calculated based on the specifications of the reception component, the time-axis margin, and the voltage-axis margin.

The calculation section 25 then calculates the voltage-axis margin (S63). To calculate the voltage-axis margin, the calculation section 25 finds the minimum distance in the voltage-axis direction between any arbitrary vertex of the mask created above and the coordinate value of plot data of the eye pattern. The resulting value is the voltage-axis margin.

The calculation section 25 then calculates the time-axis margin (S64), which completes the process. Herein, similarly to the voltage-axis margin, the calculation section 25 finds the minimum distance in the time-axis direction between any arbitrary vertex of the mask created as above and the coordinate value of the plot data of the eye pattern. The resulting value is the time-axis margin.

Described next is the transmission margin calculation process without the restrictions on the mask placement.

When there are no restrictions on the mask placement, the calculation section 25 extracts any position of the mask where the transmission margin becomes the largest while sweeping the mask both in the time- and voltage-axis directions. The transmission margin at the position is regarded as the result of the transmission margin calculation process. Below, a flow related to the time-axis direction is described. A similar flow is used for the voltage-axis direction also.

Figure 26:
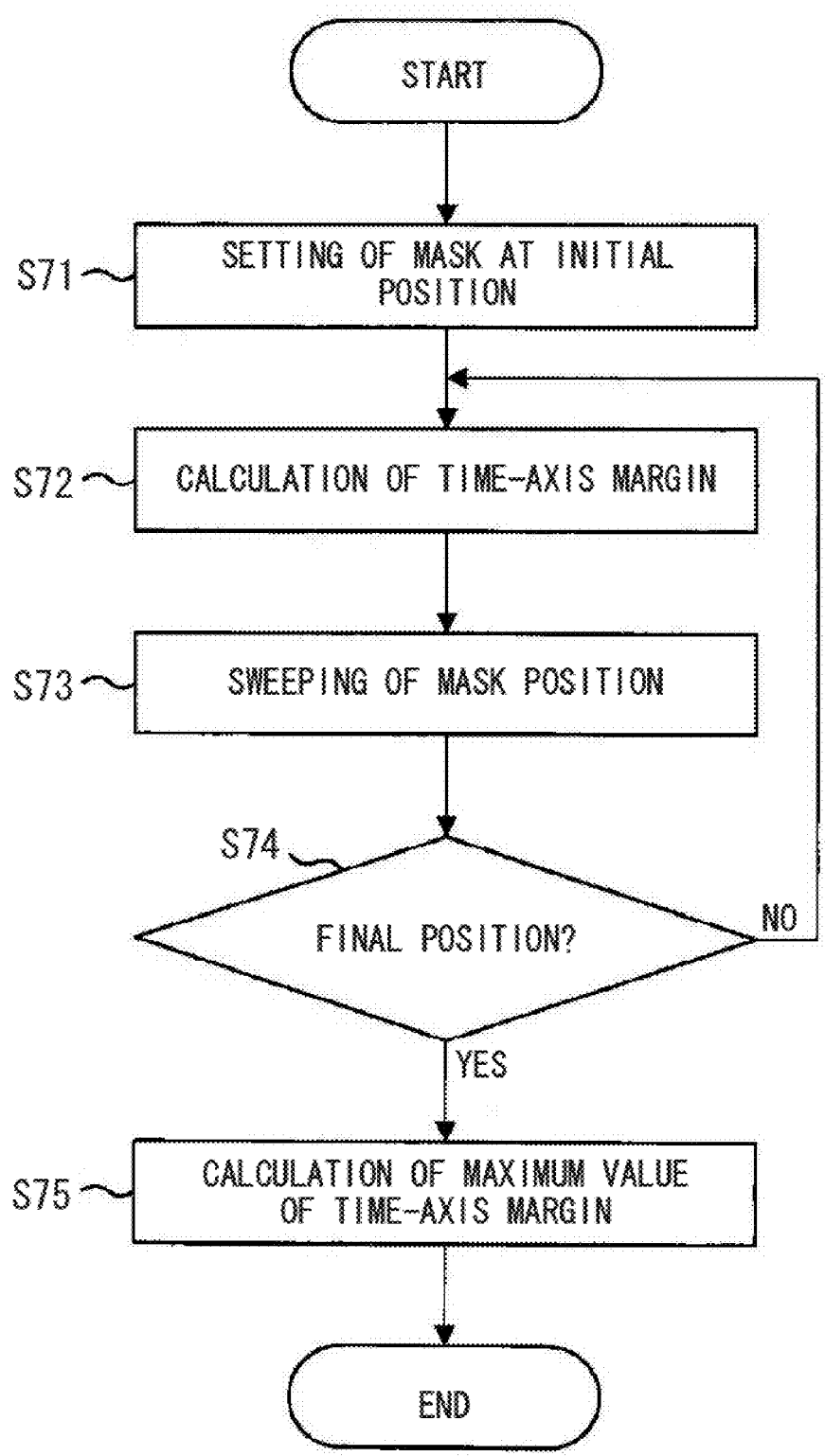
FIG. 26 is a flowchart of z transmission margin calculation process of the embodiment without the mask placement restrictions.

FIG. 26 is a flowchart of an example of a transmission margin calculation process of the embodiment without the restrictions on the mask placement. First of all, the calculation section 25 sets the mask at an initial position (S71). The initial position is set so that a point of the mask where the time axis is minimized comes at a point of a transmission clock cycle segment where the time axis is also minimized.

The calculation section 25 then calculates the time-axis margin similarly to the process step S64, and stores the calculation result (S72).

The calculation section 25 then sweeps the position of the mask by one degree (S73). At this time, the calculation section 25 moves the position of the mask by a specific number of degrees in the positive direction of the time axis.

Next, the calculation section 25 makes a determination whether or not the mask is located at a final position (S74). The final position is set so that a point of the mask where the time axis is maximized comes at a point of the transmission clock cycle segment where the time axis is maximized.

Figure 27:
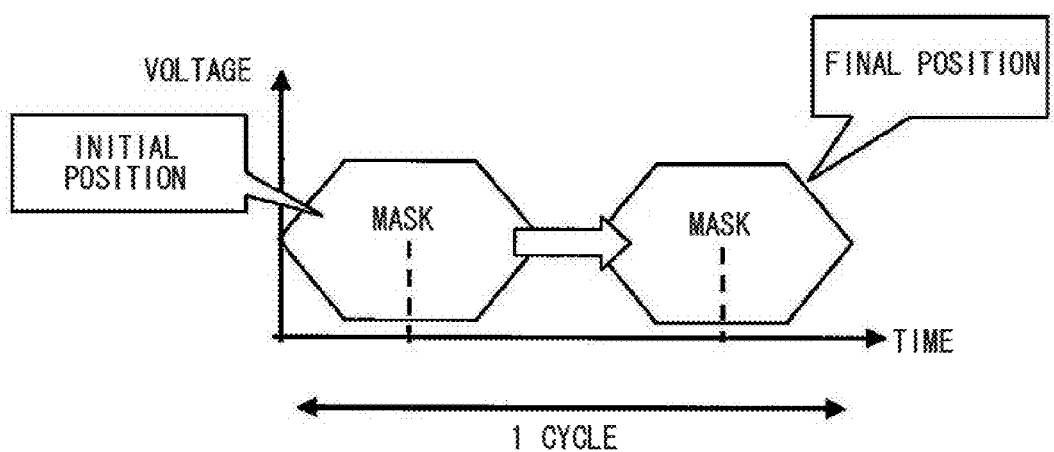
FIG. 27 is a conceptual diagram illustrating another transmission margin calculation process of the embodiment without the mask placement restrictions.

FIG. 27 is a conceptual diagram illustrating the transmission margin calculation process of the embodiment without the restrictions on the mask placement. In this drawing, the lateral axis indicates the time axis, and the vertical axis indicates the voltage axis. This drawing also illustrates the initial and final positions of the mask.

When the mask is not yet located at the final position (S74, NO), the procedure goes to the process step S72. When the mask is at the final position (S74, YES), the calculation section 25 extracts the maximum value of the calculated time-axis margin, and regards the extracted maximum value as the calculation result of the transmission margin (S75). Then the flow is completed.

Alternatively, the calculation section 25 may perform a quality determination process. When the time- and voltage-axis margins being the calculation results of the transmission margin calculation process are both positive, the quality of the signal transmission system, which is being evaluated, may be determined as being satisfactory (OK); and when either the time- or voltage-axis margin is negative, the quality of the signal transmission system may be determined as not being satisfactory (NG).

Figure 28:
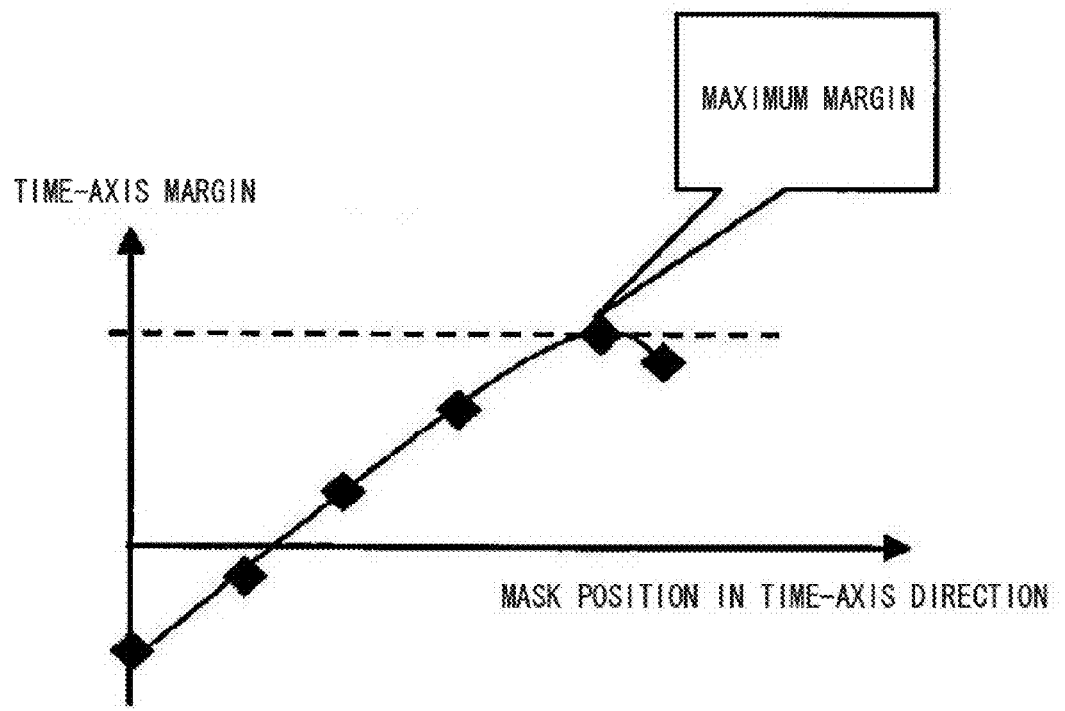
FIG. 28 is a conceptual diagram illustrating a maximum margin of the embodiment without the mask placement restrictions.

FIG. 28 is a conceptual diagram illustrating an example of a maximum margin with the restrictions on the mask placement of the embodiment. The points in the drawing each indicate the value of the time-axis margin with respect to the position of the mask as a result of sweeping in the time-axis direction. The maximum value of these values is the maximum margin.

Alternatively, the signal transmission system evaluation apparatus of the embodiment may use a model of a printed wiring board, and protocol information, and may check the operation of the transmission and reception devices.

Described next is the model of the printed wiring board.

In the embodiment, the transmission margin is calculated in the initial designing stage of the printed board. In the initial designing stage, however, the material to be used for the printed board may not be determined yet, and parameters of the model of the printed wiring board may not be available for input. Herein, for general designers, understanding the parameters affecting the loss of the printed wiring board and setting any appropriate values to such parameters may be highly difficult.

Figure 29:
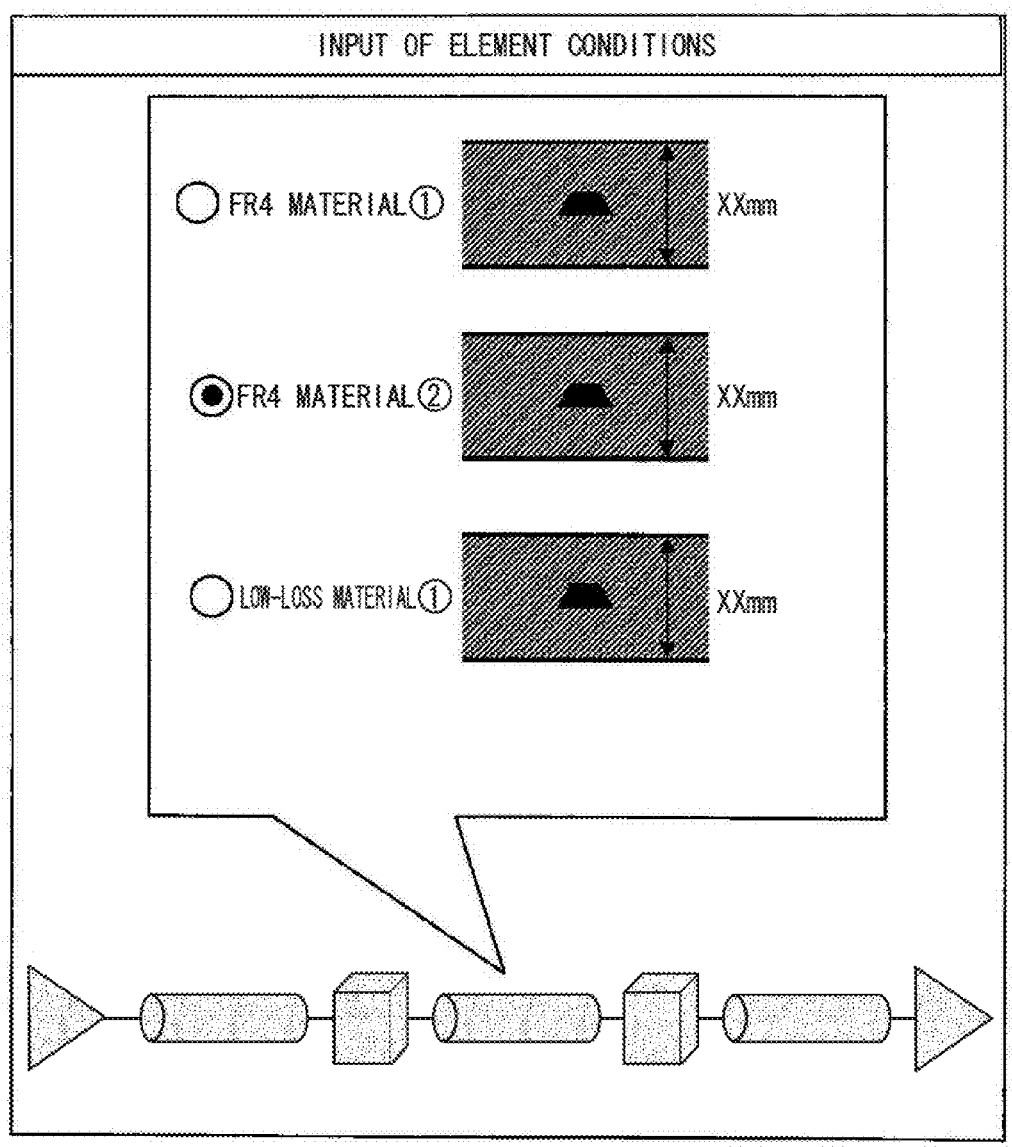
FIG. 29 illustrates an input screen by a library of a printed wiring board in the element conditions acquisition process of the embodiment.

In consideration thereof, any person with expert knowledge may incorporate any typical model of the printed wiring board as a library into the system based on a loss calculated for every material available for use. The loss here includes a change of conditions as a result of an actual measurement or a simulation. If this is the case, any user without the expert knowledge is able to calculate the transmission margin with high accuracy. FIG. 29 is an example of an input screen using a library of the printed wiring board in the element conditions acquisition process of the embodiment. In this screen, the user makes a selection of printed wiring boards from the library.

Described below is the protocol information.

Figure 30:
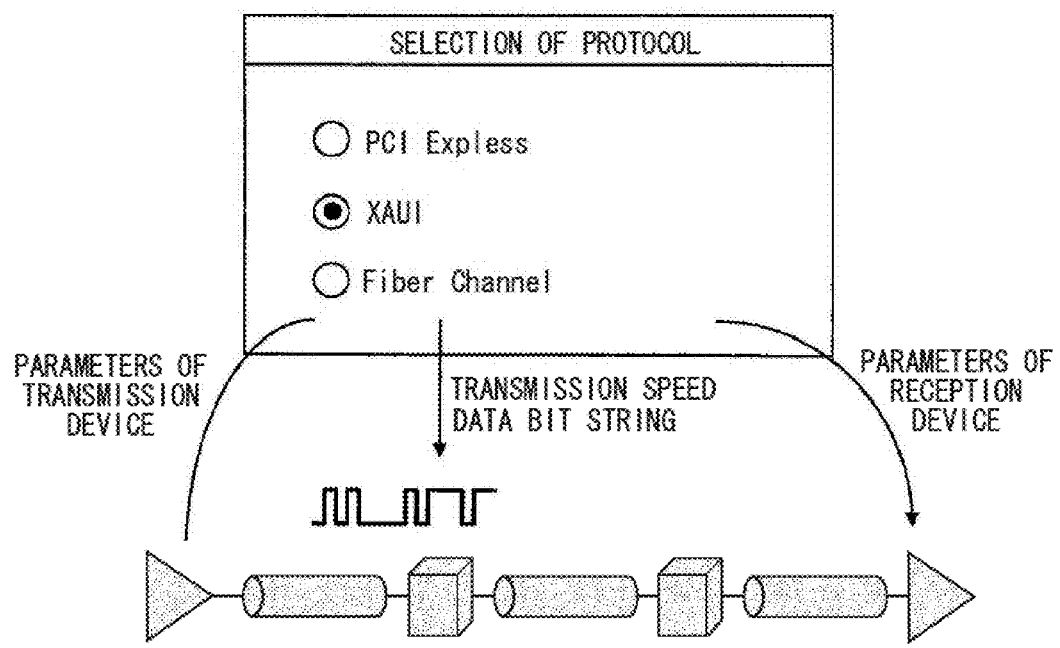
FIG. 30 is a conceptual diagram illustrating a protocol input and setting in the element conditions acquisition process of the embodiment.

With the high-speed signal transmission, a protocol often defines a transmission speed, a data bit string, and parameters of transmission and reception devices. In the element conditions setting process, alternatively, the user may select any applicable protocol from the menu, and the setting section 22 may set parameters corresponding thereto to a model. This accordingly leads to the reduction of the number of manhours. FIG. 30 is a conceptual diagram illustrating an example of a protocol input and setting in the element conditions acquisition process of the embodiment.

Described next is the operation check of the transmission and reception devices.

For parameter setting of the transmission and reception devices by any user who is not accustomed to setting a waveform simulation model, or by any user who has no expert knowledge about a device operating at high speed, there is a possibility of causing an erroneous setting. In consideration thereof, the simulation waveform may be monitored to observe the devices in operation. If this is the case, however, reflection of the connectors and the like may prevent the accurate observation of the operations of each of the transmission and reception devices.

As such, in the element conditions acquisition process, input and output waveforms in the standard state may be displayed after setting input of the transmission and reception components. With such a display, the user is allowed to visually check whether or not the setting is correct.

Figure 31:
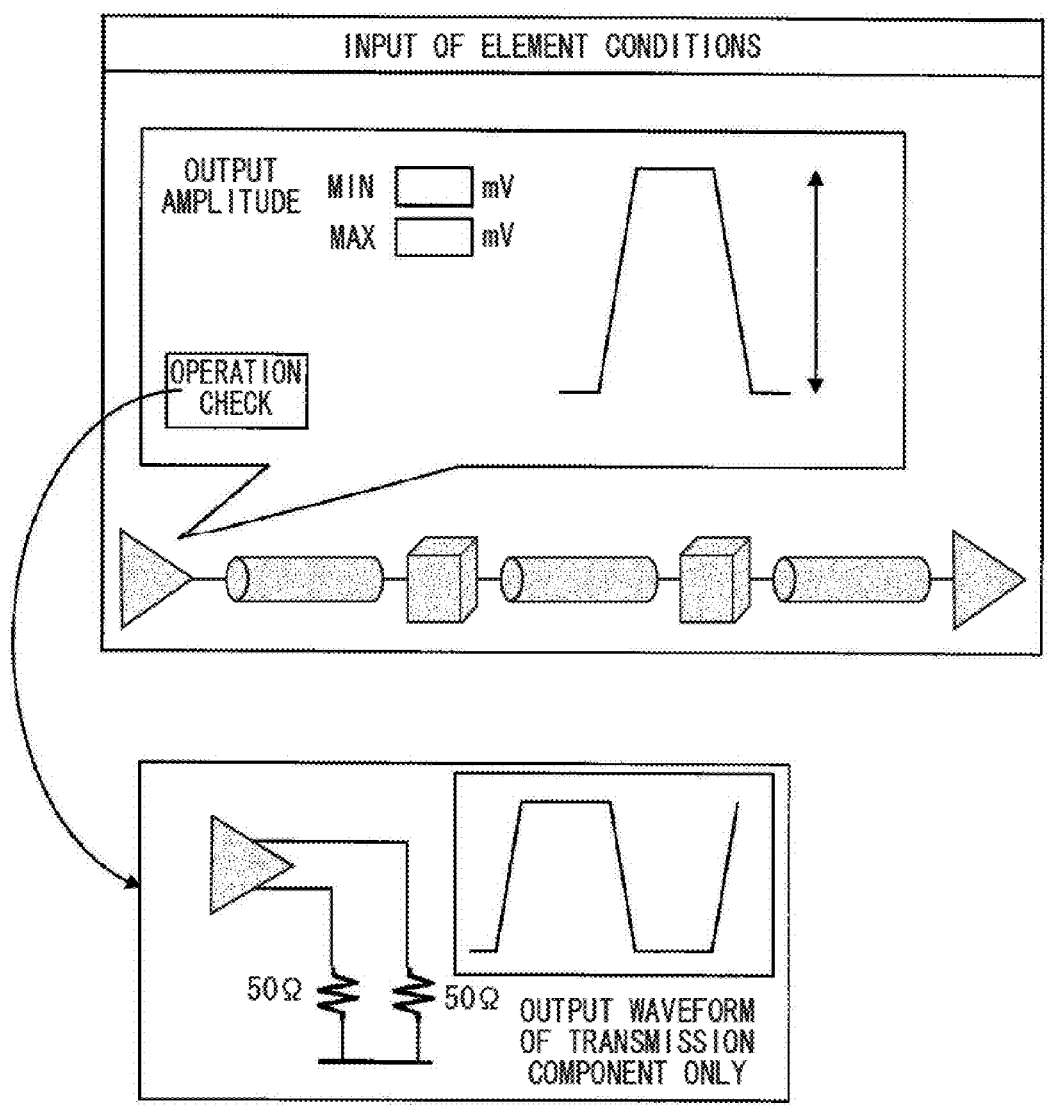
FIG. 31 is a conceptual diagram illustrating an operation check of the transmission component in the element conditions acquisition process of the embodiment.
Figure 32:
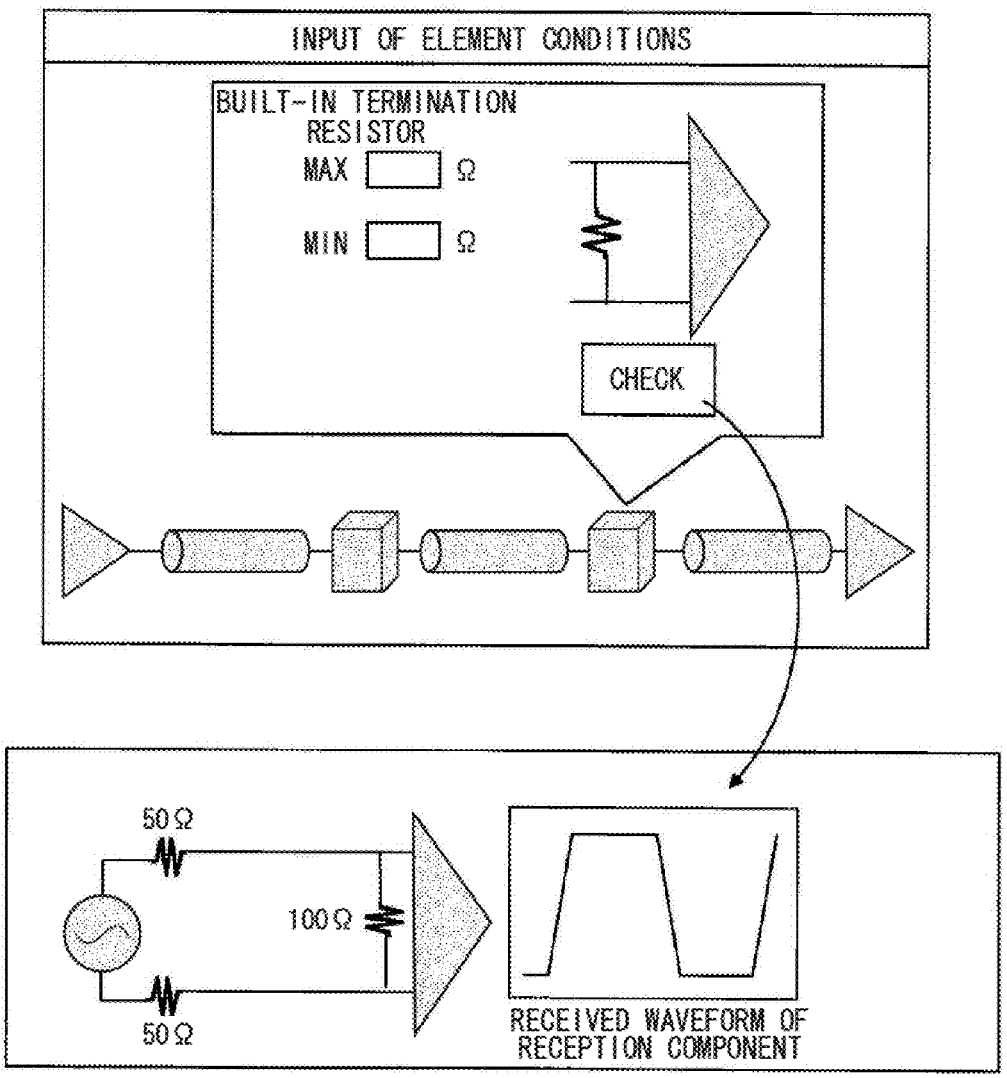
FIG. 32 is a conceptual diagram illustrating an operation check of the reception component in the element conditions acquisition process of the embodiment (a received waveform of the reception device is displayed after an input of the built-in termination resistor of the reception element)

FIG. 31 is a conceptual diagram illustrating an example of an operation check of a transmission component in the element conditions acquisition process of the embodiment. In this example, after an input of the output amplitude of the transmission component, an output waveform of only the transmission component is displayed. FIG. 32 is a conceptual diagram illustrating an example of an operation check of a reception component in the element conditions acquisition process of the embodiment. In this example, after an input of the built-in termination resistor of a reception component, a received waveform of the reception component is displayed.

According to the embodiment, even if a user has no expert knowledge, the user is able to calculate a transmission margin with high accuracy, thereby favorably reducing the number of manhours required for studying the high-speed signal transmission by as much as ten times compared to desk-top analysis.

Described next is a connector crosstalk calculation process.

The connector crosstalk calculation process of the embodiment is executed to calculate an average of parameters based on the proportion of each of the types of connector crosstalk. The parameters here are those related to the amplitude of a noise source and the attenuation of a noise waveform, which are the factors affecting the eventual amount of noise to be observed at the input terminal of a reception component. Calculating an average as such accordingly simplifies the procedure of calculation, and implements the high calculation speed.

With the related art, a simulation is performed to each of the detailed-classified types of connector crosstalk, and this requires quite a large number of manhours. For such type-basis simulations, however, any parameters under the same item are merely changed depending on the conditions. Attention is thus given to such a fact in this embodiment, and an invariant law is found based on the proportion of each of the crosstalk types, thereby integrating the parameters. To represent such a law, an approach of average value calculation is adopted.

Previous examination confirms that an error between the related art and the technology of the embodiment is within tolerance. Moreover, the connector crosstalk calculation process of this embodiment actually achieves, in the actual product design, the reduction of manhours required for calculation. Specifically, although the number of parameters originally required is 48, the number of parameters is integrated down to four. The connector crosstalk calculation process of this embodiment works effectively to reduce the number of steps for calculation especially in an area of the wiring board where the attenuation of high-frequency components is considered.

Exemplified here is a case of applying the connector crosstalk calculation process of the embodiment to estimate an amount of connector crosstalk in a BWB (Back Wiring Board) transmission model.

Figure 33:
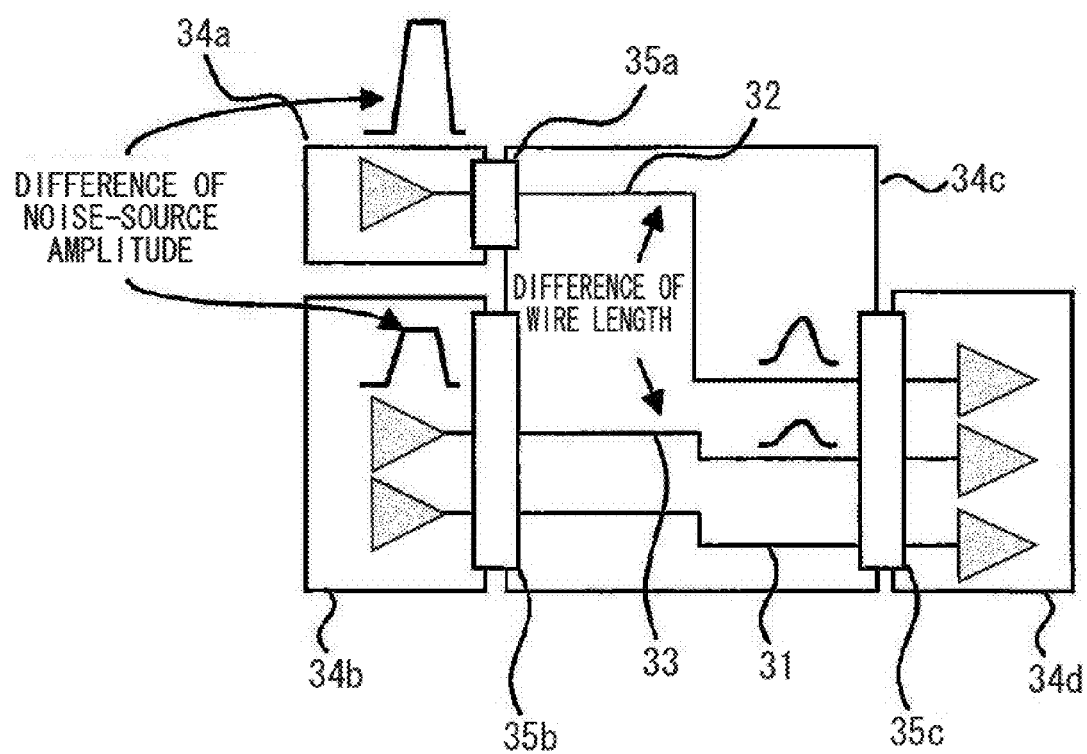
FIG. 33 is a conceptual diagram illustrating a BWB transmission model of the embodiment.

FIG. 33 is a conceptual diagram illustrating an example of a BWB transmission model of the embodiment. This BWB transmission model is configured to include a target network 31, e.g., a first transmission path, and noise-source networks 32 and 33, e.g., a second transmission path and a signal source of a type for generating noise to the target network 31. The target network 31 is a type of network suffering connector-crosstalk noise, and the noise-source networks 32 and 33 are types of networks generating the connector-crosstalk noise to the target network 31.

A signal of the target network 31 comes from a transmission component on a transmission-side PIU (Plug-In Unit) 34b, and is received by a reception component, e.g., at a reception end, on a reception-end PIU 34d via a connector 35b, a BWB 34c, and a connector 35c. A signal of the noise-source net 32 comes from a transmission component (noise source) on a transmission-side PIU 34a, and is received by the reception component on the reception-side PIU 34d via a connector 35a, the BWB 34c, and the connector 35c. A signal of the noise-source network 33 comes from the transmission component on the transmission-side PIU 34b, and is received by the reception component on the reception-side PIU 34d via the connector 35b, the BWB 34c, and the connector 35c.

In this example, the calculation target is the connector crosstalk that is generated in the connector 35c, and is directed from the noise-source networks 32 to 33 to the target network 31. Herein, the noise-source networks 32 and 33 vary in noise-source amplitude and wire length.

Figure 34:
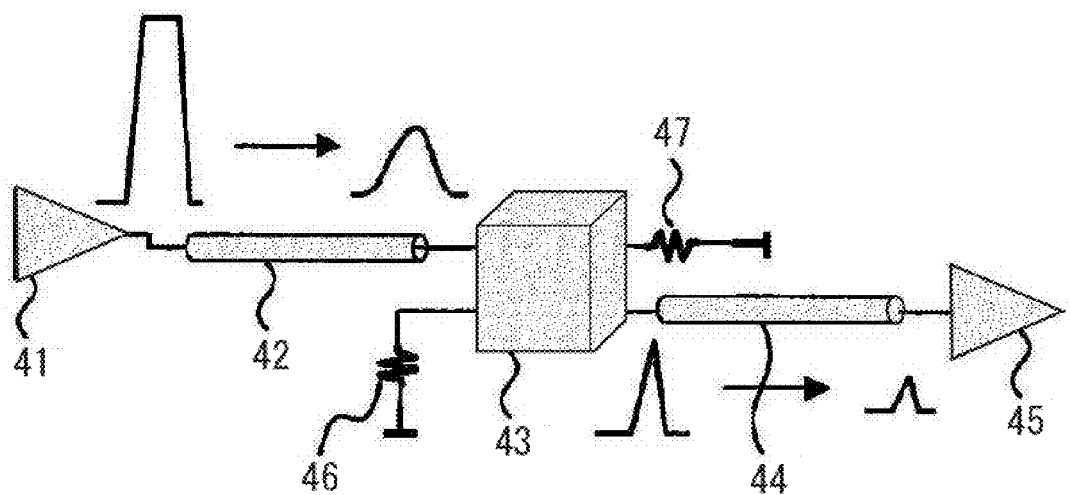
FIG. 34 is a conceptual diagram illustrating a combined model of the embodiment.

In the connector crosstalk calculation process of the embodiment, the connector crosstalk noise is calculated using a combined model, which is the simplified version of the BWB transmission model in which the noise sources are combined together. FIG. 34 is a conceptual diagram illustrating an example of a combined model of the embodiment. This combined model is configured to include a noise-source model 41, a noise-source transmission-path model 42, a connector model 43, a target network transmission-path model 44, a waveform observation model 45, and impedance matching terminations 46 and 47. In the BWB transmission model, a signal generated by the noise-source model 41 is first propagated through the noise-source transmission-path model 42, and then through the target network transmission-path model 44 by the connector crosstalk in the connector model 43 before being observed as crosstalk noise in the waveform observation model 45.

Figure 35:
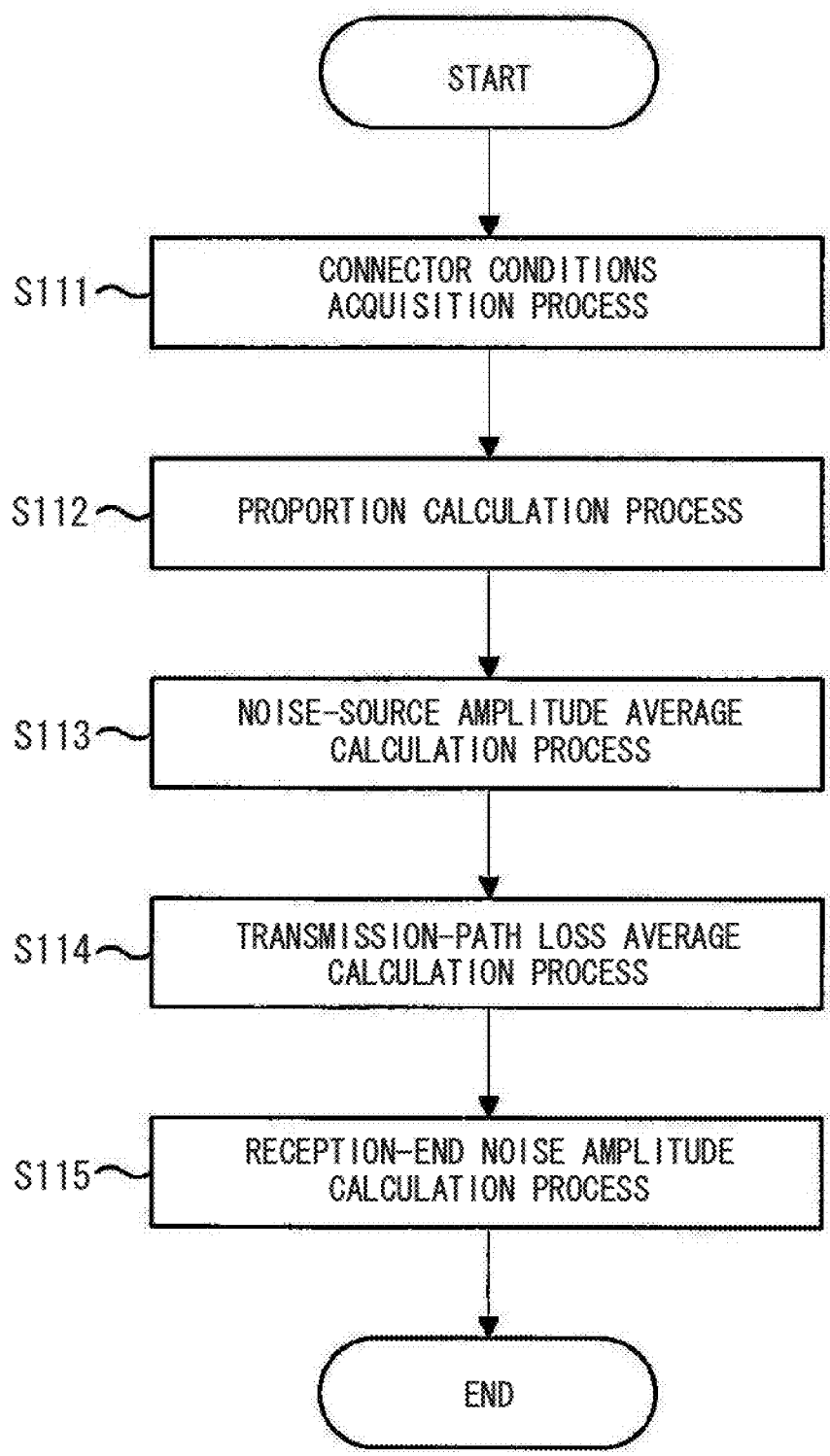
FIG. 35 is a flowchart of a connector crosstalk calculation process of the embodiment.

FIG. 35 is a flowchart of an example of a connector crosstalk calculation process of the embodiment. First of all, the UI section 21 goes through a connector conditions acquisition process for acquiring connector conditions, i.e., conditions for the connector crosstalk calculation process (S111).

The calculation section 25 then goes through a proportion calculation process for calculating a proportion of each of the crosstalk types (S112). For accurately calculating the amount of connector crosstalk noise reaching the reception end, the calculation section 25 classifies the types of connector crosstalk according to the direction of coupling and the state of connection. The calculation section 25 also calculates the proportion of each of the crosstalk types of the whole.

The calculation section 25 then goes through a noise-source amplitude average calculation process for calculating an average value of the noise-source amplitude (noise-source output) (S113). The noise-source amplitude varies depending on the connector crosstalk type. Thus, a MIN or MAX value of any coupled device is required to be set for such a variation. In the embodiment, on the other hand, the amplitude is determined by first calculating a proportion of each of the connector crosstalk types, and then by calculating an average value in accordance with the calculation results of proportions.

The calculation section 25 then goes through a transmission-path loss average calculation process for calculating an average value of the transmission-path loss (S114). Any loss of the transmission path coupled to the connector is also a factor affecting the eventual amount of noise. Herein, the transmission path being a target for calculation of the transmission-path loss is the noise-source transmission path and the target network transmission path. Similar to the noise-source amplitude, parameters for each of the connector crosstalk types are desirably set. As such, in the embodiment, the transmission-path loss is determined by calculating an average value similar to the noise-source amplitude.

Next, the calculation section 25 goes through a reception-end noise amplitude calculation process for calculating noise amplitude at the reception end (S115), and this is the end of the flow. Herein, based on the calculation results, e.g., the noise-source amplitude and the transmission-path loss, the calculation section 25 lastly calculates a peak value of the waveform that is observed at the reception end. Such a peak value calculation is performed considering the phenomenon of the amplitude reduction before the noise source reaches the connector, and a phenomenon of the reduction of the peak waveform of the noise generated in the connector in the transmission path.

Described next is a connector conditions acquisition process.

Figure 36:
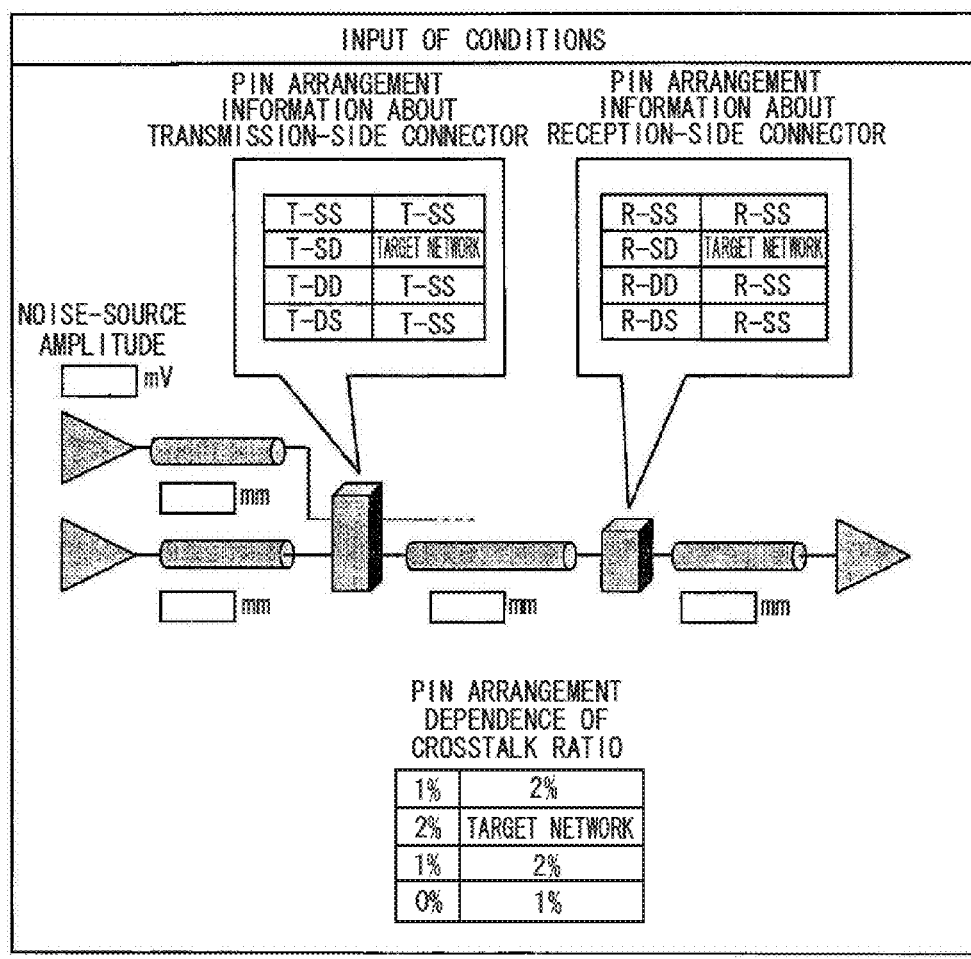
FIG. 36 illustrates an input screen for connector conditions of the embodiment.

In the connector conditions acquisition process, the UI section 21 displays an input screen for the connector conditions, thereby acquiring the connector conditions input by a user into the input screen thereof. FIG. 36 is an example of an input screen for the connector conditions of the embodiment. In the input screen for the connector conditions as such, items for input regarding the connector conditions include information about the pin arrangements in transmission- and reception-side connectors, noise-source amplitude, transmission-path length of each transmission path, a pin-basis connector crosstalk ratio, and the like.

Described now is a proportion calculation process.

FIG. 37 is a flowchart of an example of a proportion calculation process of the embodiment. First of all, the calculation section 25 performs a crosstalk-type classification for the signal transmission system being a target (S121). Such a crosstalk-type classification is performed based on the direction of coupling between noise-source pins and noise-suffering pins, and the connection relationship therebetween.

FIG. 38 is a table illustrating examples of crosstalk types of the embodiment. This table illustrates, for each of eight crosstalk types, the items of "connector" "coupling" "connection" and "type abbreviation". The item of "connector" indicates which connector generates crosstalk, e.g., connector on transmission-side or on reception-side, and the item of "coupling" indicates the signal direction, e.g., the same or a different direction. The item of "connection" indicates whether the connector is connected to the same printed board or not. Below, conceptual diagrams of the crosstalk types are illustrated. In any of the conceptual diagrams, there are two transmission paths. The upper transmission path is the target network for crosstalk calculation (receiving the crosstalk noise), and the lower transmission path is the path that is a noise source (generating the crosstalk noise).

FIG. 39 is a conceptual diagram illustrating the crosstalk types of T-SS and R-SS of the embodiment. In this drawing, the upper portion illustrates the crosstalk type of T-SS, and the lower portion illustrates the crosstalk type of R-SS. The transmission direction for signals of the target network and those of the noise source is from left to right in the drawing.

Figure 40:
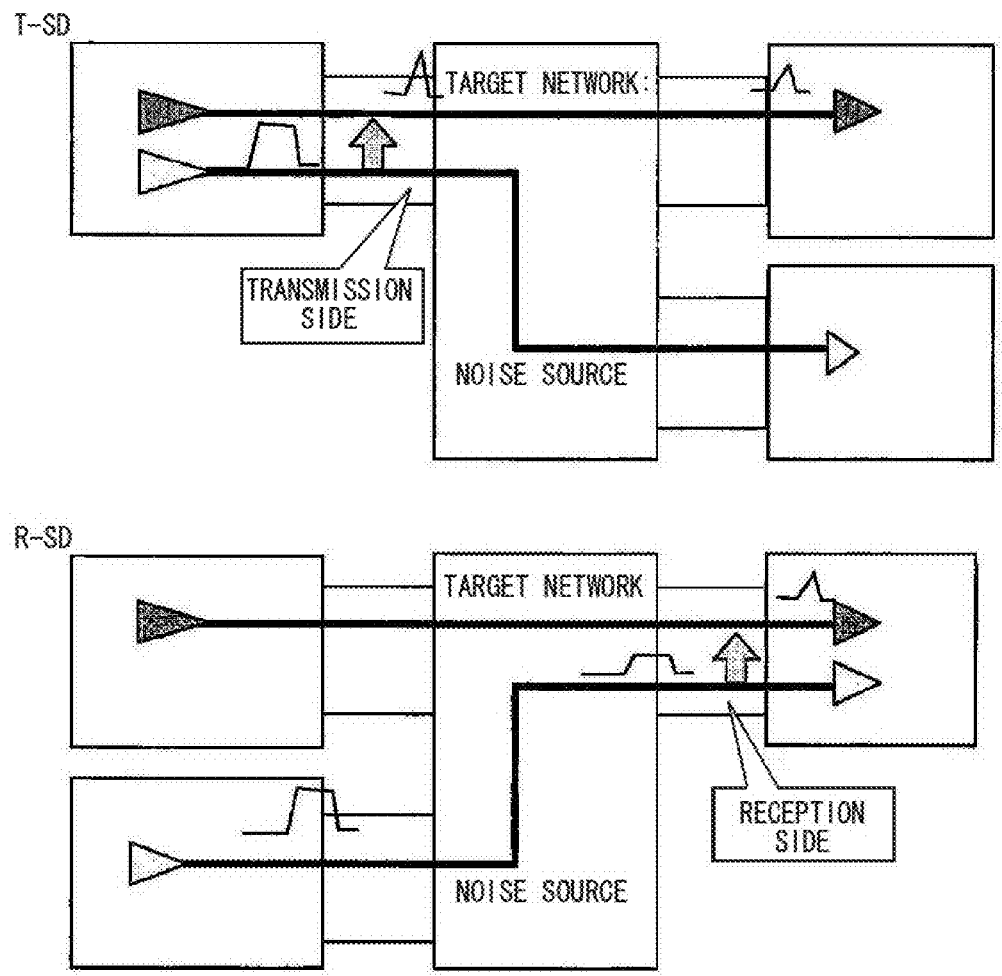
FIG. 40 is a conceptual diagram illustrating the crosstalk types of T-SD and R-SD of the embodiment.

FIG. 40 is a conceptual diagram illustrating the crosstalk types of T-SD and R-SD of the embodiment. In this drawing, the upper portion illustrates the crosstalk type of T-SD, and the lower portion illustrates the crosstalk type of R-SD. The transmission direction for signals of the target network and those of the noise source is from left to right in the drawing.

Figure 41:
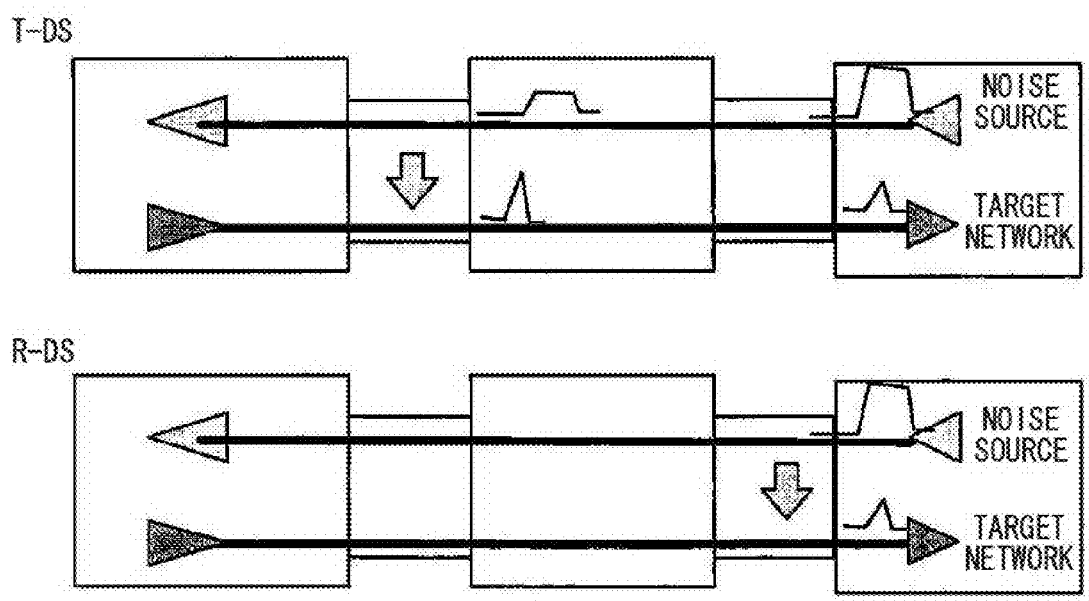
FIG. 41 is a conceptual diagram illustrating the crosstalk types of T-DS and R-DS of the embodiment.

FIG. 41 is a conceptual diagram illustrating the crosstalk types of T-DS and R-DS of the embodiment. In this drawing, the upper portion illustrates the crosstalk type of T-DS, and the lower portion illustrates the crosstalk type of R-DS. The transmission direction for signals of the target network is from left to right in the drawing, and that for signals of the noise source is from right to left in the drawing.

FIG. 42 is a conceptual diagram illustrating the crosstalk types of T-DD and R-DD of the embodiment. In this drawing, the upper portion illustrates the crosstalk type of T-DD, and the lower portion illustrates the crosstalk type of R-DD. The transmission direction for signals of the target network is from left to right in the drawing, and that for signals of the noise source is from right to left in the drawing.

Figure 43:
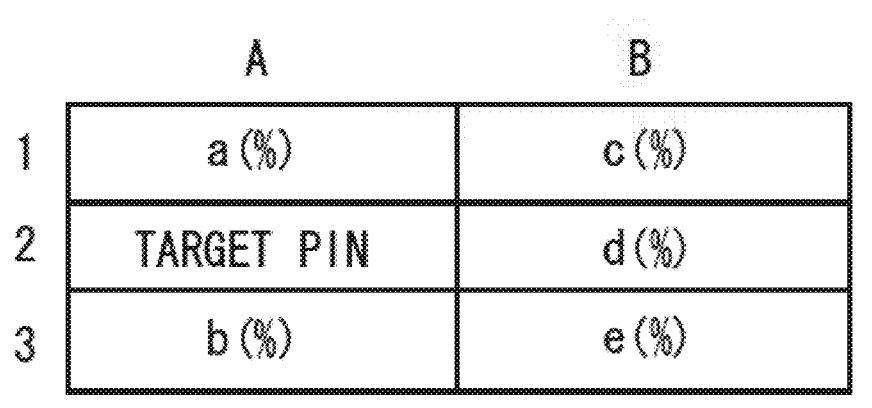

The calculation section 25 then calculates the crosstalk ratio for each of the types (S123). In this process, the calculation section 25 acquires the pin arrangement dependence provided by the user for each of the crosstalk ratios. The amount of connector crosstalk is dependent on the physical positional relationship, in terms of the pin arrangement, between signals receiving noise and signals generating noise. FIG. 43 is a table illustrating an example of a pin-arrangement dependence of each of the crosstalk ratios of this embodiment. In this drawing, the pin arrangement of a six-pin connector is represented by three lines and by two columns. In the table, "A" and "B" each denote a physical column of the connector, and "1", "2", and "3" each denote a line. Among the pins, any pins other than the pins of the target network are noise-source pins. The crosstalk ratio of each of the noise-source pins is denoted by the proportion of the amount of noise to the noise source (%). It is assumed here that the pins 1A, 1B, 2B, 3A, and 3B have the crosstalk ratios of a, b, c, d, and e [%] respectively.

The calculation section 25 then establishes a correlation between the crosstalk types and the crosstalk ratios (S124). For such a correlation establishing process, the calculation section 25 uses the pin-arrangement information about the crosstalk types, and information about the pin-arrangement dependence of each of the crosstalk ratios to establish such a correlation between the crosstalk types and the crosstalk ratios in terms of the pin address of each of the noise-source pins.

Figure 44:
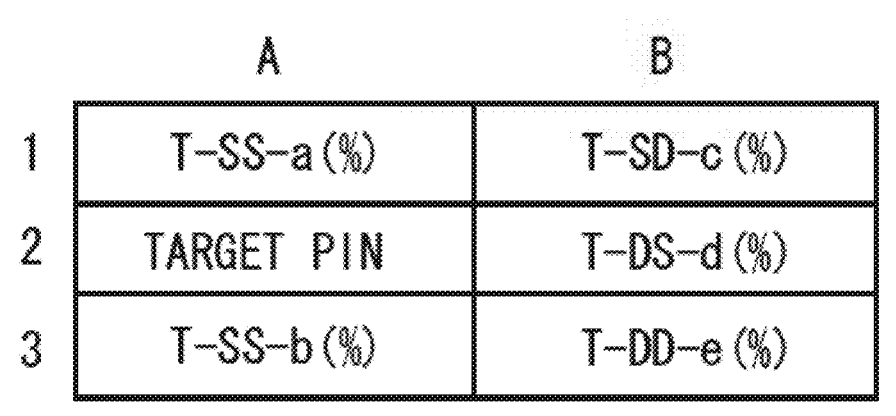
Figure 45:
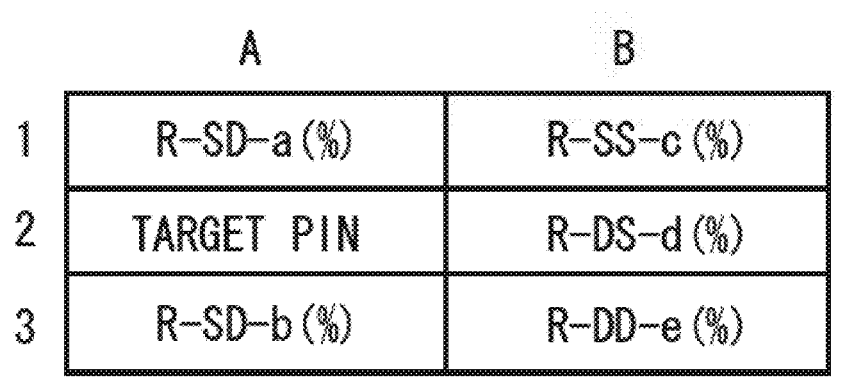

FIG. 44 is a table illustrating an example of a correlation between the crosstalk type and the crosstalk ratio of each of the pins of a transmission-side connector of the embodiment. In this drawing, the correlation for the noise-source pins is denoted as "crosstalk type→crosstalk ratio". FIG. 45 is a table illustrating an example of a correlation between the crosstalk type and the crosstalk ratio of each of the pins of a reception-side connector of the embodiment. In this drawing, the correlation for the noise-source pins is denoted as "crosstalk type→crosstalk ratio".

The calculation section 25 then calculates the sum of the crosstalk ratios of each of the types (S125). The calculation section 25 performs such a calculation of the sum of the crosstalk ratios for each of the types using the crosstalk types and the crosstalk ratios correlated to each other. The calculation section 25 also calculates the sum of the crosstalk ratios of all of the crosstalk types. FIG. 46 is a table illustrating an example of a sum of crosstalk ratios for each of the crosstalk types of the embodiment. This drawing illustrates the sum of the crosstalk ratios calculated for each of the crosstalk types. Note here that the sum of all of the crosstalk ratios will be 100%.

Next, the calculation section 25 calculates a proportion of each of the types (S126), and this is the end of the flow. For each of the crosstalk types, the proportion with respect to the calculated resulting sum of the crosstalk ratios is calculated. Such a proportion is calculated as follows:

Proportion of Each Type [%]=Crosstalk Ratio of Each Type [%]/Sum of Crosstalk Ratio [%]

FIG. 47 is a table illustrating examples of proportions of each of the crosstalk types of the embodiment. This table lists the proportion calculated for each of the crosstalk types. Note here that the sum of all of the crosstalk ratios will be 100%.

Described next is a noise-source amplitude average calculation process.

First of all, the calculation section 25 sets a noise-source amplitude to each of the crosstalk types. The crosstalk types have their own noise-source amplitudes. FIG. 48 is a table illustrating examples of conditions for a noise-source amplitude for each of the crosstalk types of the embodiment. As illustrated in this drawing, the noise-source amplitude is set to either the MAX (maximum value) or MIN (minimum value) of the specifications defined by any coupling component.

Herein, the MIN is set when the same PIU carries both a transmission component being a noise source and a transmission component receiving noise, and the MAX is set when such transmission components are mounted on each separate PIU. The transmission component of receiving the noise is set to the amplitude of MIN, that is the worst conditions, because the transmission component of receiving the noise is the target for calculation of a transmission margin. When the noise source is mounted on the same PIU, the voltage supply is made from the power supply on the same board, and thus the noise-source amplitude will be also MIN. On the other hand, when the transmission components are disposed on a different printed board, there is no more dependence therebetween so that the noise source is set to MAX even if the transmission component of receiving the noise has the output amplitude of MIN.

The calculation section 25 then calculates a noise-source amplitude (noise-source amplitude average value). At this time, the calculation section 25 classifies the calculated proportion values into those to be assigned the minimum noise-source amplitude, and into those to be assigned the maximum noise-source amplitude. After the completion of such a classification, the sum of each of the results, e.g., MIN-amplitude proportions and MAX-amplitude proportions, is calculated. The calculation section 25 then calculates the amplitude when the noise sources are combined together based on such sums of the results. Such a combined noise-source amplitude is calculated as follows:

MIN-Amplitude Proportion(%) = Proportion of $T\text{-}SS$ (%) +

Proportion of $T\text{-}SD$ (%) + Proportion of $R\text{-}SS$ (%)

MAX-amplitude Proportion(%) = Proportion of $T\text{-}DS$ (%) +

Proportion of $T\text{-}DD$ (%) + Proportion of $R\text{-}SD$ (%) +

Proportion of $R\text{-}DS$ (%) + Proportion of $R\text{-}DD$ (%)

Combined Noise-Source Amplitude($V$) =

MIN amplitude ($V$) × MIN-Amplitude Proportion(%) / 100 +

MAX amplitude($V$) × MAX-Amplitude Proportion(%) / 100

To derive an average value of the noise-source amplitudes as such, the proportion is used to calculate the weighted average of the values of the MIN and MAX amplitudes corresponding to all of the crosstalk types.

Described next is a transmission-path loss average calculation process.

First of all, the calculation section 25 sets a wire length to each of the crosstalk types. The crosstalk types have their own wire lengths from the transmission component being a noise source to the connector, and that from the connector to the reception component. FIG. 49 is a table illustrating an example of a wire length of each of the crosstalk types of the embodiment. This table lists, for each of the crosstalk types, the wire length of a system of the noise source and the wire length of a system of the target network. The wire length of the system of the noise source includes the wire length of a transmission PIU, and the wire length of a BWB. The wire length of the system of the target network includes the wire length of a BWB, and the wire length of a reception PIU.

Next, the calculation section 25 then calculates the wire loss of the noise source, and that of the target network. Herein, the calculation section 25 calculates the wire loss corresponding to the set wire length. Such a wire loss is calculated collectively, e.g., for a group of noise sources, and for a group of target networks. FIG. 50 is a table illustrating examples of wire loss for each of the crosstalk types of the embodiment. Herein, the calculation results of the wire loss of the noise sources of the crosstalk types of T-SS, T-SD, T-DS, T-DD, R-SS, R-SD, R-DS, and R-DD are assumed as being a1, b1, c1, d1, e1, f1, g1, and h1 respectively, and the calculation results of the wire loss of the target networks of the crosstalk types of T-SS, T-SD, T-DS, T-DD, R-SS, R-SD, R-DS, and R-DD are assumed as being a2, b2, c2, d2, e2, f2, g2, and h2 respectively.

Using the wire loss and the proportion calculated for each of the crosstalk types, the calculation section 25 then calculates a loss after combining the transmission paths. The combined transmission-path loss is calculated for the respective noise sources and the respective target networks, e.g., the combined noise-source transmission-path loss and the combined target network transmission-path loss. The combined noise-source transmission-path loss and the combined target network transmission-path loss are calculated as follows:

Combined Noise-Source Transmission-Path Loss =

$a1[\text{dB}] \times \text{Proportion of } T\text{-}SS(\%)/100 +$ $b1[\text{dB}] \times \text{Proportion of } T\text{-}SD(\%)/100 +$ $c1[\text{dB}] \times \text{Proportion of } T\text{-}DS(\%)/100 +$ $d1[\text{dB}] \times \text{Proportion of } T\text{-}DD(\%)/100 +$ $e1[\text{dB}] \times \text{Proportion of } R\text{-}SS(\%)/100 +$ $f1[\text{dB}] \times \text{Proportion of } R\text{-}SD(\%)/100 +$ $g1[\text{dB}] \times \text{Proportion of } R\text{-}DS(\%)/100 +$ $h1[\text{dB}] \times \text{Proportion of } R\text{-}DD(\%)/100$ Combined Target network Transmission-Path Loss $a2[\text{dB}] \times \text{Proportion of } T\text{-}SS(\%)/100 +$ $b2[\text{dB}] \times \text{Proportion of } T\text{-}SD(\%)/100 +$ $c2[\text{dB}] \times \text{Proportion of } T\text{-}DS(\%)/100 +$ $d2[\text{dB}] \times \text{Proportion of } T\text{-}DD(\%)/100 +$ $e2[\text{dB}] \times \text{Proportion of } R\text{-}SS(\%)/100 +$ -continued $f2[\text{dB}] \times \text{Proportion of } R\text{-}SD(\%)/100 +$ $g2[\text{dB}] \times \text{Proportion of } R\text{-}DS(\%)/100 +$ $h2[\text{dB}] \times \text{Proportion of } R\text{-}DD(\%)/100$ For calculating the combined noise-source transmission-path loss and the combined target network transmission-path loss, the proportions of each of the crosstalk types are used to calculate the weighted average of the values of the wire loss thereof.

Described next is a reception-end noise amplitude calculation process.

In this process, the setting section 22 and the waveform simulator 24 perform a waveform simulation for calculating the attenuation of the noise source and the noise peak waveform using the combined transmission-path loss calculated as above. The waveform simulator 24 may be any type of commercial simulator. Described below is the specific procedure of the reception-end noise amplitude calculation process.

Figure 51:
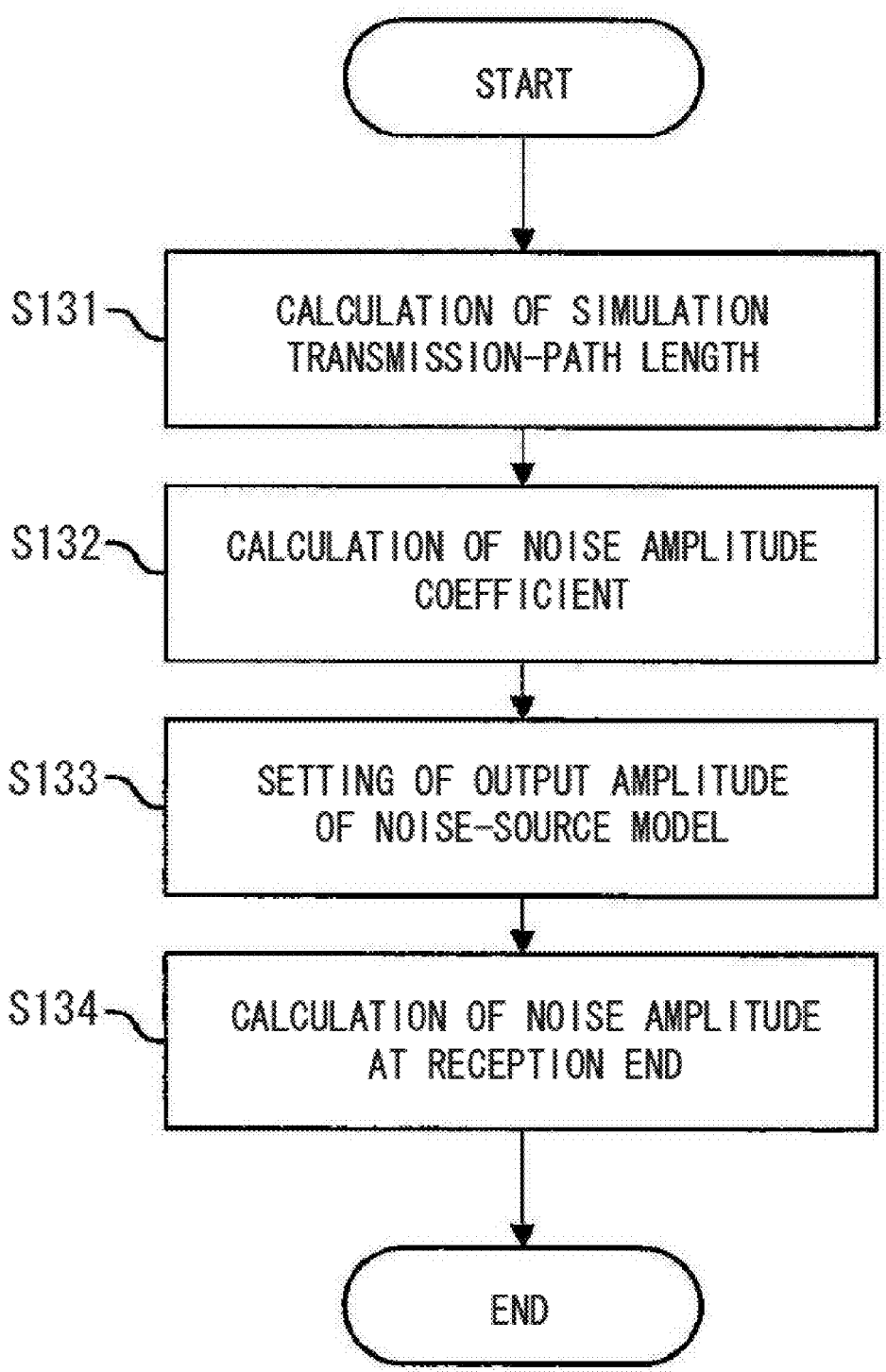
FIG. 51 is a flowchart of a reception-end noise amplitude calculation process of the embodiment.
Figure 52:
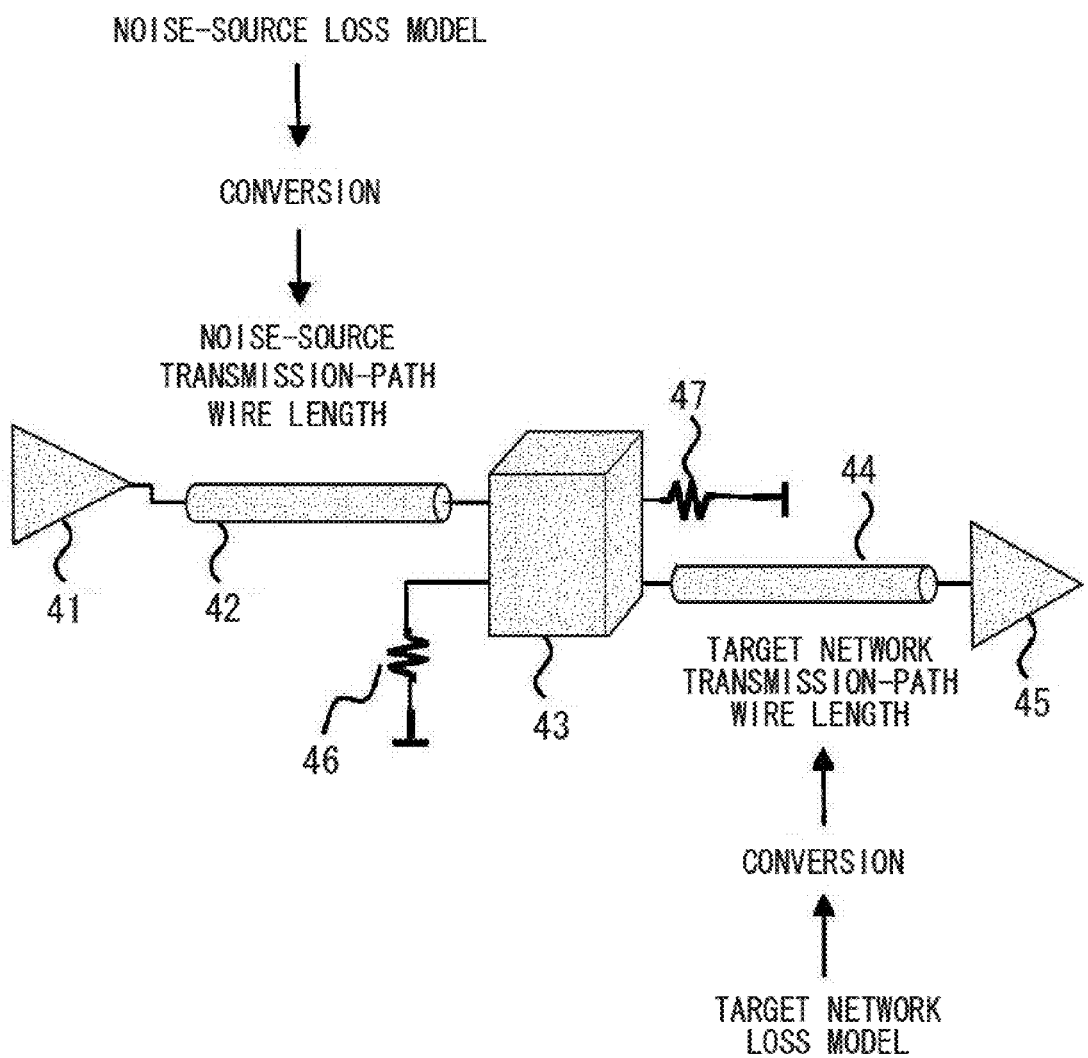
FIG. 52 is a conceptual diagram illustrating a simulation transmission-path length of the embodiment.

FIG. 51 is a flowchart of an example of a reception-end noise amplitude calculation process of the embodiment. First of all, the setting section 22 calculates the wire length corresponding to the transmission-path model (simulation transmission-path length) based on the combined transmission-path loss (S131). The simulation transmission-path length is calculated as follows:

Simulation Transmission-Path Length=Combined Transmission-Path Loss/Loss per meter of Transmission-Path Model FIG. 52 is a conceptual diagram illustrating an example of a simulation transmission-path length of the embodiment. In this example, the simulation transmission-path length of the noise-source transmission-path model 42 is assumed as being the noise-source transmission-path wire length, and the simulation transmission-path length of the target network transmission-path model 44 is assumed as being the target network transmission-path wire length. The noise-source transmission-path length is calculated by substituting the value of the combined noise-source transmission-path loss in the equation above, and the target network transmission-path wire length is calculated by substituting the value of the combined target network transmission-path loss in the equation above.

The setting section 22 then calculates a noise amplitude coefficient based on the sum of the crosstalk ratios calculated for each of the types in the process step S125 (S132). To be specific, using the crosstalk ratio of the preset connector model, and using the sum of the crosstalk ratios, the setting section 22 sets a coefficient for adjusting the noise-source amplitude average value, i.e., noise amplitude coefficient. The noise amplitude coefficient is calculated as follows:

Noise Amplitude Coefficient=Sum of Crosstalk ratios/ Crosstalk ratio of Connector Model The noise-source amplitude is calculated as follows:

Noise-Source Amplitude=Noise-Source Amplitude Average×Noise Amplitude Coefficient With the related art, the crosstalk is set by changing the wire space between signal lines in the model, and by adjusting the degree of electrical coupling. However, such a setting requires a complicated operation, and thus a large number of manhours is required. As such, a high level of calculation has been required for automation.

Figure 53:
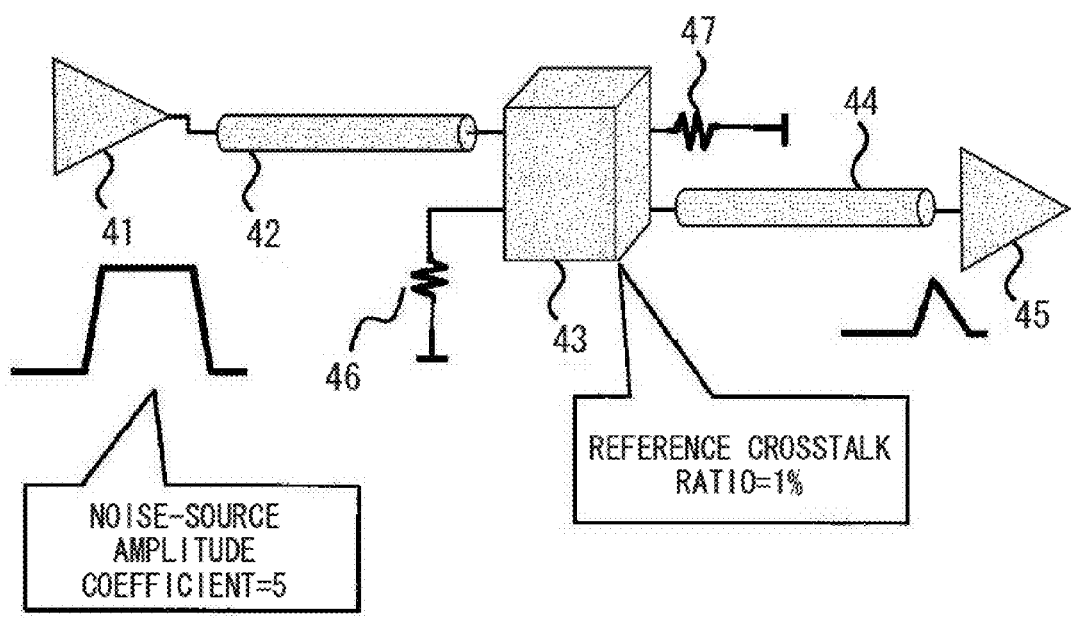
FIG. 53 is a conceptual diagram illustrating crosstalk ratio setting of the embodiment.

In the embodiment, on the other hand, the crosstalk ratio for setting in the connector model, e.g., the reference crosstalk ratio, remains constant, and any desired crosstalk ratio may be acquired through adjustment of the noise-source amplitude. With such a technique, calculation of crosstalk ratio is implemented with a simple ratio calculation, thereby reducing the amount of calculation. FIG. 53 is a conceptual diagram illustrating an example of a crosstalk ratio setting of the embodiment. In this example, the reference crosstalk ratio of the connector model 43 is set to 1%, and the noise-source amplitude coefficient of the noise-source model 41 is set to 5 so that the eventual crosstalk ratio will be 1%×5=5%.

Figure 54:
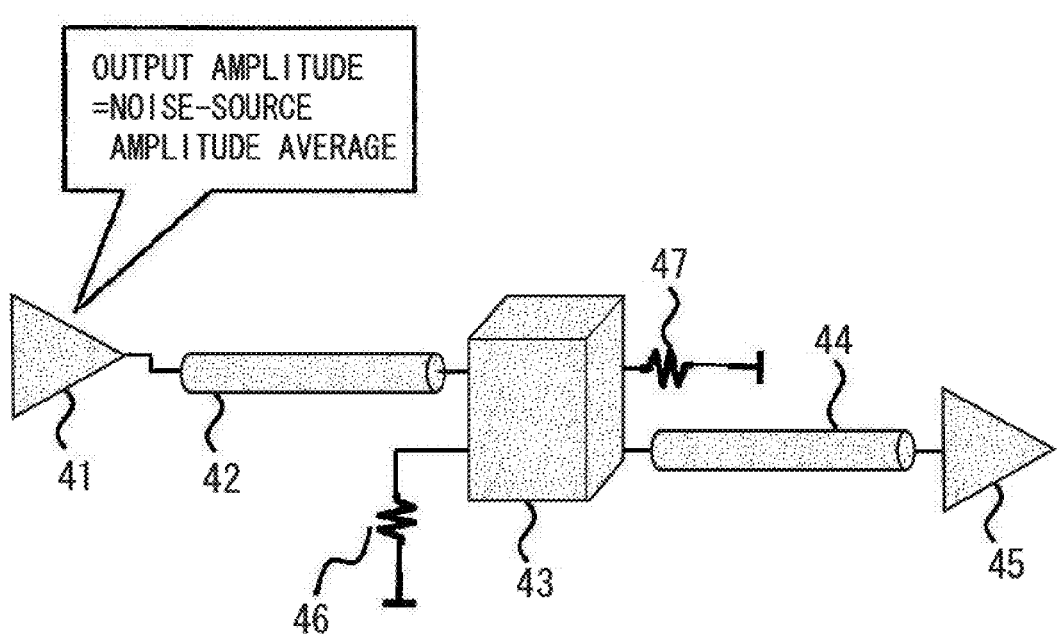
FIG. 54 is a conceptual diagram illustrating noise-source model setting of the embodiment.

The setting section 22 then sets the output amplitude of the noise-source model to the noise-source amplitude average value being the calculation result of the noise-source amplitude average calculation process (S133). FIG. 54 is a conceptual diagram illustrating an example of a noise-source model setting of the embodiment. The output amplitude of the noise-source model 41 is set to the noise-source amplitude average value.

Figure 55:
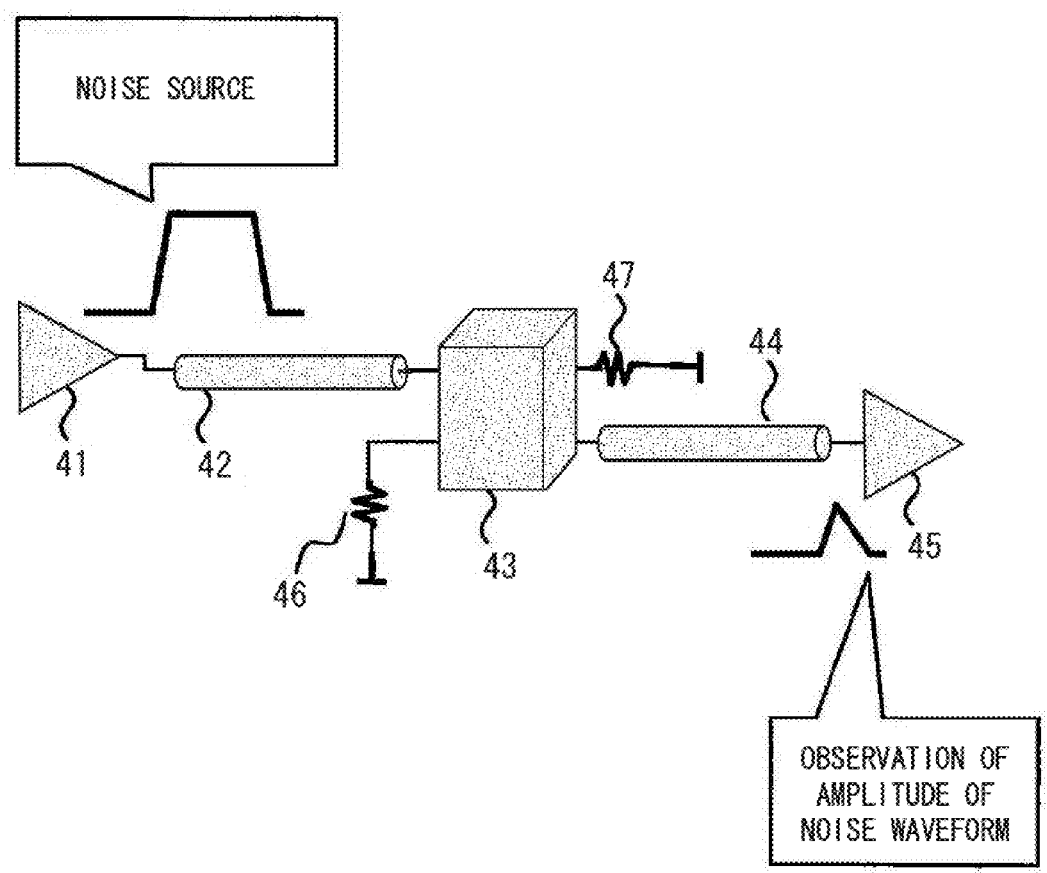
FIG. 55 is a conceptual diagram illustrating calculation of noise waveform amplitude of the embodiment.

The waveform simulator 24 then performs the waveform simulation, and calculates the amplitude of the noise waveform at the reception end, e.g., received noise amount, (S134) and this is the end of the flow. FIG. 55 is a conceptual diagram illustrating an example of an amplitude calculation of the noise waveform of the embodiment. In the waveform-observed model at the reception end, the noise amplitude is observed for the amplitude thereof.

In the connector crosstalk calculation process of the embodiment, the connector crosstalk may be calculated with less amount of calculation, and this largely contributes to the efficiency of the reliability study of the signal transmission.

Note here that the connector crosstalk calculation process of the embodiment may be alternatively executed using a signal attenuation calculation process, a wire-coupling connector model, or a frequency-characteristic connector model, or may be provided in the form of a card.

Described next is the signal attenuation calculation process.

The amount of noise calculated by the connector crosstalk calculation process is transferred to the reception component through the transmission path coupled to the connector. At this time, the loss of the transmission path causes attenuation of the signal. This phenomenon may be calculated using a general waveform simulator available in the market, however, if such a simulator is used, the operation time will be increased because the amount of calculation is large, and the setting of the simulator is complicated.

In this embodiment, for calculating the signal attenuation, the signal attenuation calculation process is executed by approximate calculation using a noise database, which is provided based on the result of the waveform simulation performed in advance so that the amount of calculation may be reduced to a considerable degree. Such a signal attenuation calculation process may be implemented by any general spreadsheet software, and thus is easily implemented. The connector crosstalk calculation process in this case does not require the waveform simulator 24.

Figure 56:
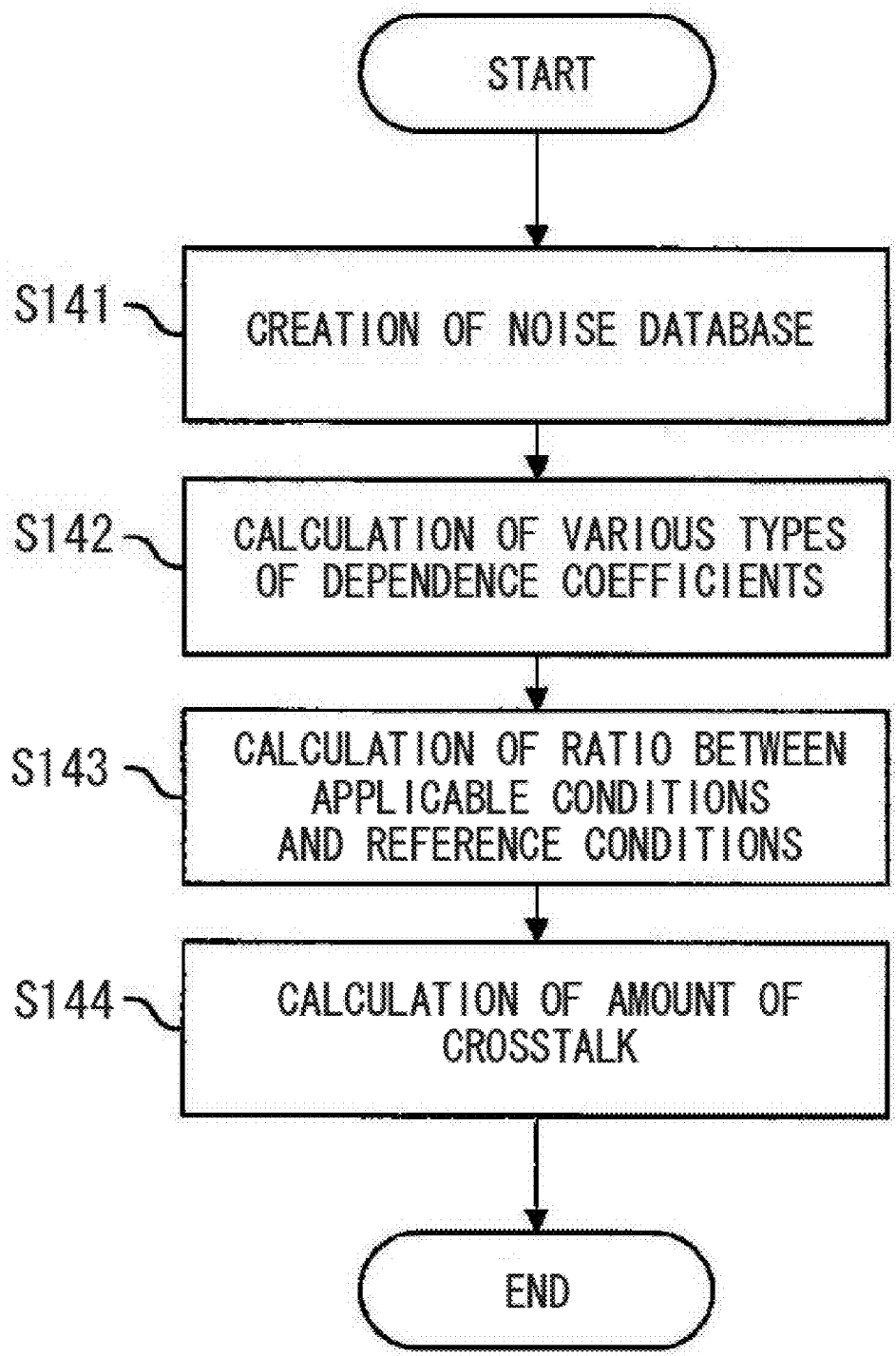
FIG. 56 is a flowchart of a signal attenuation calculation process of the embodiment.

FIG. 56 is a flowchart of an example of a signal attenuation calculation process of the embodiment. First of all, the calculation section 25 creates a noise database of the result of the waveform simulation related to the attenuation of the noise source and that of the noise attenuation caused by the transmission-path loss (S141). Such a noise database is created with a potential of sufficient conditions changes for calculation of each dependence coefficient that will be described later. In the embodiment, the noise database is created with such conditions that, for one item, the conditions of any other two items vary. The waveform simulator 24 for actually calculating a numeric value serving as a database basis may be a commercially available simulator.

Figure 58:
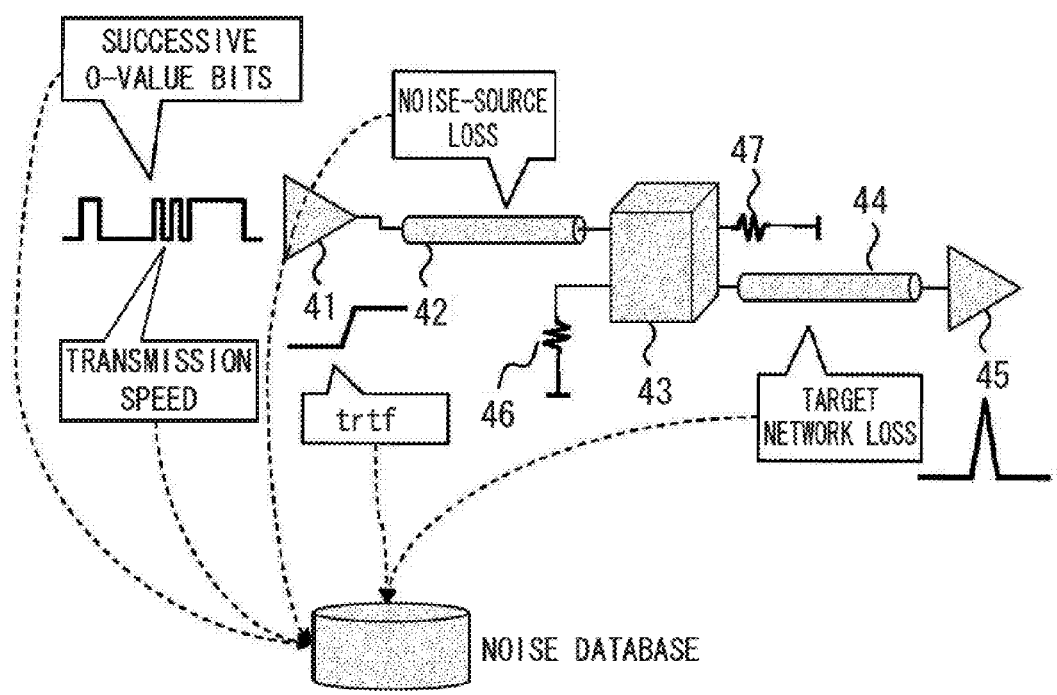
FIG. 58 is a conceptual diagram illustrating parameters of the embodiment affecting the noise.

FIG. 57 is a table illustrating an example of a noise database of the embodiment. This noise database illustrates parameters affecting the noise, and the calculation result of the noise amount. FIG. 58 is a conceptual diagram illustrating examples of parameters affecting the noise of the embodiment. The items of the parameters affecting the noise includes "the number of successive 0-value bits (0 succession)", "transmission speed", "noise-source loss", "target network loss", and "trtf". The items of the calculation result of noise amount illustrates the noise and the crosstalk (Xtalk) ratio.

The calculation section 25 then calculates various types of dependence coefficients (S142). Such dependence coefficients include "transmission-speed dependence coefficient", "trtf dependence coefficient", "the number of successive 0-value bits dependence coefficient", "target network transmission loss dependence coefficient", and "noise-source transmission loss dependence coefficient".

Described now is the transmission speed dependence coefficient. The noise-source waveform is attenuated before reaching the connector through the transmission path after being output from the transmission component. This amount of attenuation is dependent on the loss of the transmission path. The loss of the transmission path is dependent on the signal transmission speed, and thus a corresponding coefficient is desired. This coefficient is the transmission speed dependence coefficient which is calculated using the calculation result of the noise amount with two or more conditions extracted from the noise database. At this time, the two or more conditions to be extracted desirably share the same items other than the transmission speed. Among a plurality of dependence coefficients found from the data as such, any value illustrating the largest value of noise is selected. Below is an example of the equation of calculating the transmission speed dependence coefficient when the two types of conditions are to be selected.

> Provisional Transmission Speed Dependence Coefficient $A$=(Amount of Noise with Conditions $A$ at Transmission Speed $A$−Amount of Noise with Conditions $A$ at Transmission Speed $B$)/(Transmission Speed $A$−Transmission Speed $B$)
>
> Provisional transmission speed Dependence Coefficient $B$=(Amount of Noise with Conditions $B$ at Transmission Speed $A$−Amount of Noise with Conditions $B$ at Transmission Speed $B$)/(Transmission Speed $A$−Transmission Speed $B$)
>
> Transmission Speed Dependence Coefficient=MAX (Provisional Transmission Speed Dependence Coefficient $A$, Provisional Transmission Speed Dependence Coefficient $B$)

FIG. 59 is a table illustrating an example of a condition selection of the transmission speed dependence coefficient in the noise database of the embodiment. Here is an example of a selection of combinations in the noise database described above, e.g., combinations of two types of conditions such as conditions A and B, and two types of transmission speeds, e.g., transmission speeds A and B.

FIG. 60 is a table illustrating an example of a calculation result of the transmission speed dependence coefficient of the embodiment. In this example, using four types of conditions, the transmission speed dependence coefficient is calculated for each of the conditions from two types of transmission speeds. Next, among the transmission speed dependence coefficients of the four types of conditions, the maximum value (the worst value) is selected as the transmission speed dependence coefficient.

Described next is the trtf dependence coefficient. The connector crosstalk is known to indicate a larger noise peak value with a larger amount of high-frequency components included in the noise source. The high-frequency components included in the noise source are increased with a shorter time rising/ time falling (hereinafter, referred to as "trtf"). In this embodiment, for estimating the amount of noise, the influence of trtf is considered as the trtf dependence coefficient. This coefficient is calculated from the noise database similar to the transmission speed dependence coefficient described above.

Described next is the successive 0-value bits dependence coefficient. The data for transfer varies in bit pattern depending on the protocol of any applicable signal. The factors affecting the connector crosstalk include how many bits of the same value are in succession. The larger this number is, the lower the frequency is in the corresponding portion, and the amplitude is increased because the loss is small This means a large value of crosstalk for a noise source. In this embodiment, such an influence is considered in the equation as the successive 0-value bits dependence coefficient. This coefficient is calculated from the noise database similar to the transmission speed dependence coefficient described above.

Described next is the target network transmission loss dependence coefficient. The connector crosstalk is transferred to the input terminal of the reception component through the coupled transmission path. At this time, the noise waveform reaching the input terminal indicates a smaller peak value with a larger loss of the transmission path. In this embodiment, this influence is considered in the equation as the target network transmission loss dependence coefficient. This coefficient is calculated from the noise database similar to the transmission speed dependence coefficient described above. Similarly, the noise-source amplitude is also considered in the equation as the noise-source transmission loss dependence coefficient with a consideration of the influence over the loss.

The calculation section 25 then calculates a ratio between the applicable conditions being the target for the signal attenuation calculation process, and the specific reference conditions (S143). First of all, the calculation section 25 sets an initial value for finding a noise peak value reaching the reception component using the various types of dependence coefficients described above. This initial value may be arbitrarily selected from the noise database. The dependence coefficients described above each have their own conditions corresponding to the initial value. The calculation section 25 sets in advance such an initial value as the reference conditions. The calculation section 25 finds a noise peak value reaching the reception component for each of the items based on any change from the reference conditions and the dependence coefficients.

FIG. 61 is a table illustrating examples of reference conditions in the noise database of the embodiment. This example illustrates how to select the reference conditions in the noise database described above.

The calculation section 25 then calculates a difference of conditions value between the reference conditions and the applicable reference for each of the parameters affecting the noise. Such a difference of conditions value is calculated as follows:

Difference of Conditions Value=(Conditions Value with Applicable Conditions)−(Conditions Value with Reference Conditions)

The calculation section 25 calculates such a difference of conditions value for each of the parameter items affecting the noise. FIG. 62 is a table illustrating examples of applicable conditions and reference conditions in the noise database of the embodiment. The example here is a case of selecting the applicable conditions and the reference conditions in the above-described noise database.

Next, the calculation section 25 calculates a crosstalk ratio (S144), and this is the end of the flow. Here, first of all, using the calculated difference of calculated conditions values, the calculation section 25 calculates the increase of the crosstalk ratio of each of the items. The increase of the crosstalk ratio of each of the items is calculated as follows:

Increase of Crosstalk Ratio of Each Item=(Dependence Coefficient of Each Item)×(Difference of Conditions Value)

The calculation section 25 then calculates the eventual amount of noise reaching the reception component, e.g., the total crosstalk ratio, by multiplying the amount of noise with the reference conditions by the total ratio. Such a total crosstalk ratio is calculated as follows:

$$\begin{aligned}(\text{Total Crosstalk Ratio}) = &\ (\text{Crosstalk Ratio with Reference Conditions}) \times \\ &\ (\text{Increase of Crosstalk Ratio by Transmission Speed}) \times \\ &\ (\text{Increase of Crosstalk Ratio by the} \\ &\ \text{Number of Successive 0-Value Bits}) \times \\ &\ (\text{Increase of Crosstalk Ratio by Noise-Source Loss}) \times \\ &\ (\text{Increase of Crosstalk Ratio by } trtf)\end{aligned}$$

The calculation section 25 then calculates the crosstalk amount using the calculated total crosstalk ratio. The crosstalk amount is calculated as follows:

Crosstalk Amount=Total Crosstalk Ratio'Noise-Source amplitude

Described now is how to provide the connector crosstalk calculation process in the form of a card.

For including the connector crosstalk calculation process of the embodiment into any existing waveform analysis program, many manhours are required for detailed programming. However, the connector crosstalk calculation process may be implemented by any spreadsheet software available on the market. As such, the equations of the embodiment may be written on the spreadsheet program, and this may be read into any existing waveform analysis program in the form of a card for exchanging any needed numeric values. By providing the connector crosstalk calculation process in the form of a card as such, the manhours needed for program development to implement the function may be reduced to a considerable degree, and the waveform calculation programs varying in type may be provided with the function of the connector crosstalk calculation process so that the versatility is favorably increased.

Figure 63:
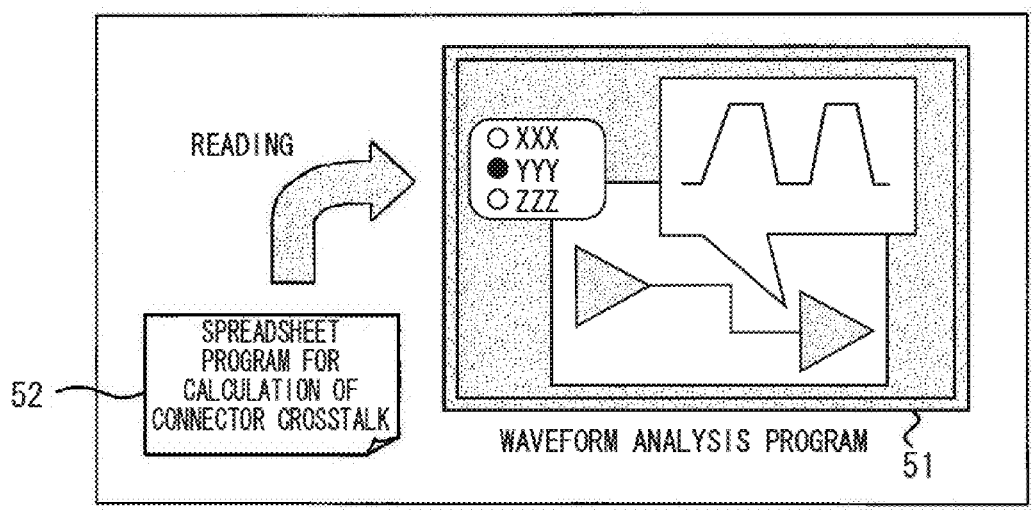
FIG. 63 is a conceptual diagram illustrating a waveform analysis program of the embodiment.

FIG. 63 is a conceptual diagram illustrating an example of a waveform analysis program of the embodiment. This waveform analysis program includes a waveform analysis program 51, and a connector crosstalk calculation spreadsheet program 52 in the form of a card. By the waveform analysis program 51 reading the connector crosstalk calculation spreadsheet program 52, the connector crosstalk calculation process may be incorporated as a function.

Described next is a wire-coupling connector model.

The crosstalk generated in a connector is difficult to represent as a simulation model because the crosstalk varies depending on the pin arrangement of the connector and the physical configuration of the connector, for example. A multi-port circuit simulator model is generally used, but such a simulator model is large in size, and thus requires a large amount of time for calculation. Moreover, the accuracy of the configuration including a through hole is not often studied yet in detail.

On the other hand, the connector model may be so configured so as to be wire-coupled, and the crosstalk ratio thereof may be represented by the approximate expression to be calculated using the wire space. If this is the case, the model may be implemented easily with a tolerable level of accuracy.

Figure 64:
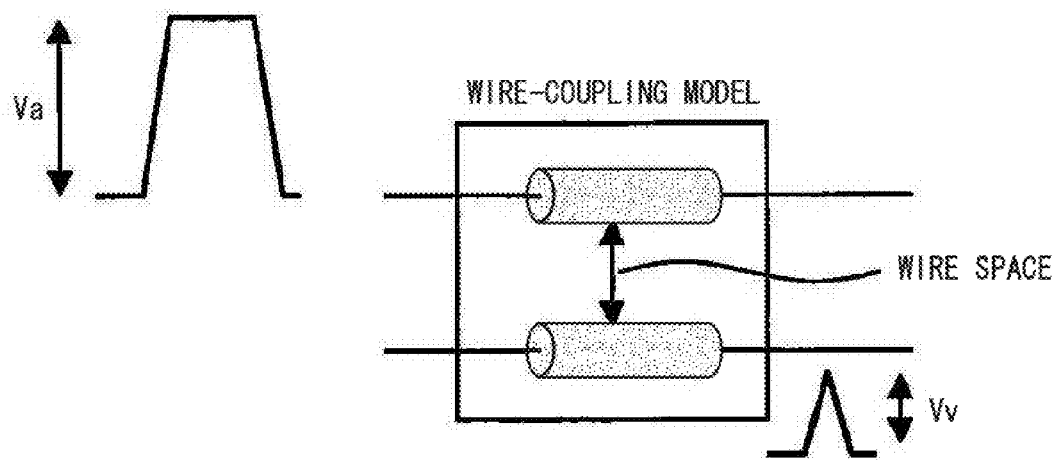
FIG. 64 is a conceptual diagram illustrating a wire-coupling connector model of the embodiment.

FIG. 64 is a conceptual diagram illustrating an example of a wire-coupling connector model of the embodiment. The crosstalk ratio may be represented as follows:

Crosstalk Ratio [%]=Vv/Va×100 where Vv denotes the noise-source amplitude, and Va denotes the noise amplitude in the target network.

Figure 65:
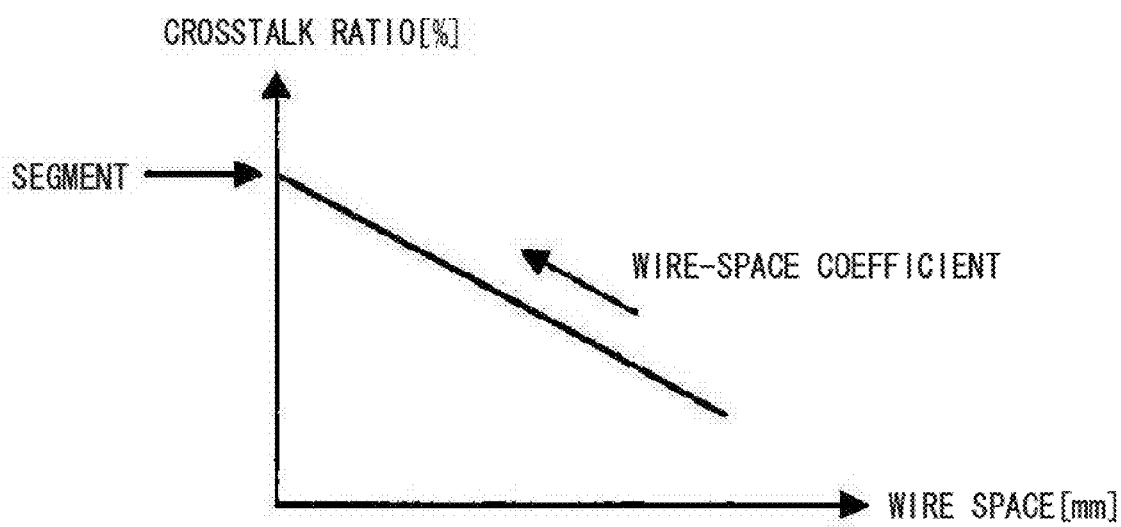
FIG. 65 is a conceptual diagram illustrating a wire space determination method in the wire-coupling connector model of the embodiment.

FIG. 65 is a conceptual diagram illustrating an example of a wire space determination method in the wire-coupling connector model of the embodiment. The line in the drawing is represented by the following equation:

Crosstalk Ratio [%]=Wire Space Coefficient×Wire Space [mm]+Segment [mm]

This equation leads to the equation below for determining the wire space from the crosstalk ratio.

Wire Space [mm]=(Crosstalk Ratio [%]−Segment [mm])/Wire Space Coefficient

With such an equation, by setting the wire space with the input conditions of the crosstalk ratio, the resulting connector model may have any desired crosstalk ratio. A tolerable level of accuracy may be provided by obtaining a reliable measurement result of the crosstalk ratio and the like.

Described next is the frequency-characteristic connector model.

Figure 66:
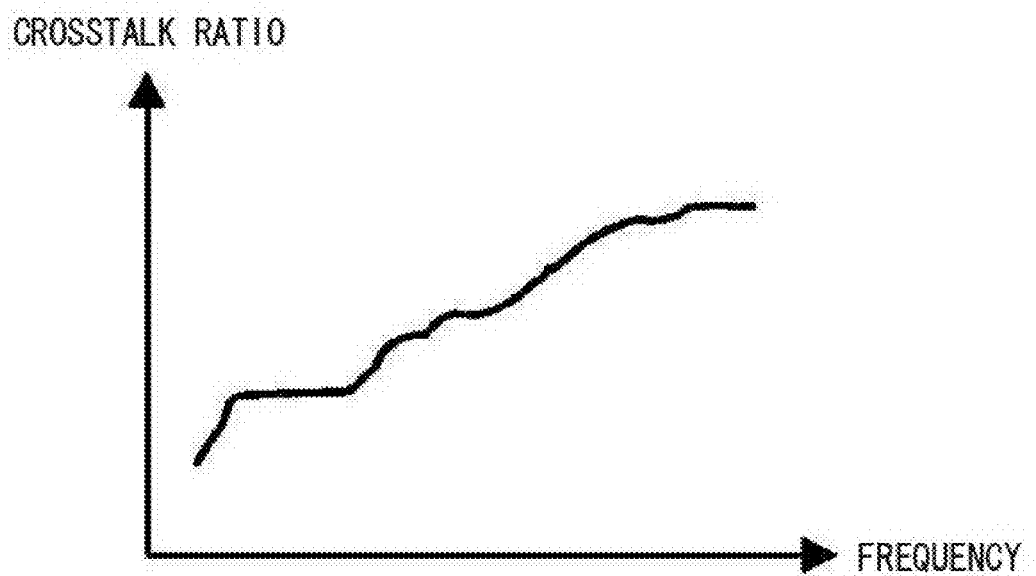
FIG. 66 is a conceptual diagram illustrating reference characteristics of a connector of the embodiment.

The crosstalk ratio of the connector is affected by trtf of the incoming noise-source waveform, and the characteristics thereof may be represented with high accuracy by the frequency characteristics. As such, the frequency characteristics derived by actual measurement are regarded as the reference characteristics, and calculating a rate thereto may lead to the accurate connector model. FIG. 66 is a conceptual diagram illustrating an example of reference characteristics of the connector of the embodiment. In this drawing, the lateral axis indicates the frequency, and the vertical axis indicates the crosstalk ratio.

Note here that the frequency characteristics as a result of an actual measurement cannot be converted into the reference crosstalk ratio described above, and adjustments may be needed to achieve desired levels of crosstalk ratio.

Figure 67:
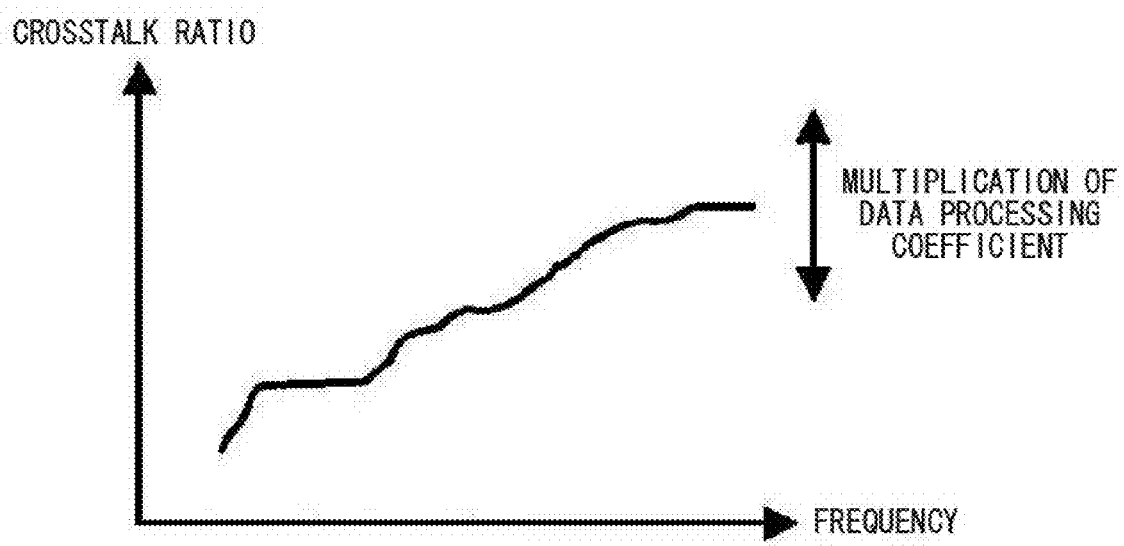
FIG. 67 is a conceptual diagram illustrating frequency characteristics of a connector model of the embodiment.

Frequency Characteristics of Connector Model =
   Reference Characteristics × Data Processing Coefficient
Data Processing Coefficient = Crosstalk Ratiok Ratio [%] input as
   Conditions/Crosstalk Ratio [%] in Reference Characteristics FIG. 67 is a conceptual diagram illustrating frequency characteristics of the connector model of the embodiment. The frequency characteristics of the connector model are those derived by multiplying the above-described reference characteristics by a data processing coefficient.

With the connector crosstalk calculation process of the embodiment, the connector crosstalk may be calculated within a tolerable time period for any general design schedule.

Note here that, in the signal transmission system evaluation apparatus of the embodiment, the UI section 21 may take charge of component placement in the signal processing system being a target. The components here include a transmission device, a reception device, a substrate, a connector, and a transmission path.

Figure 68:
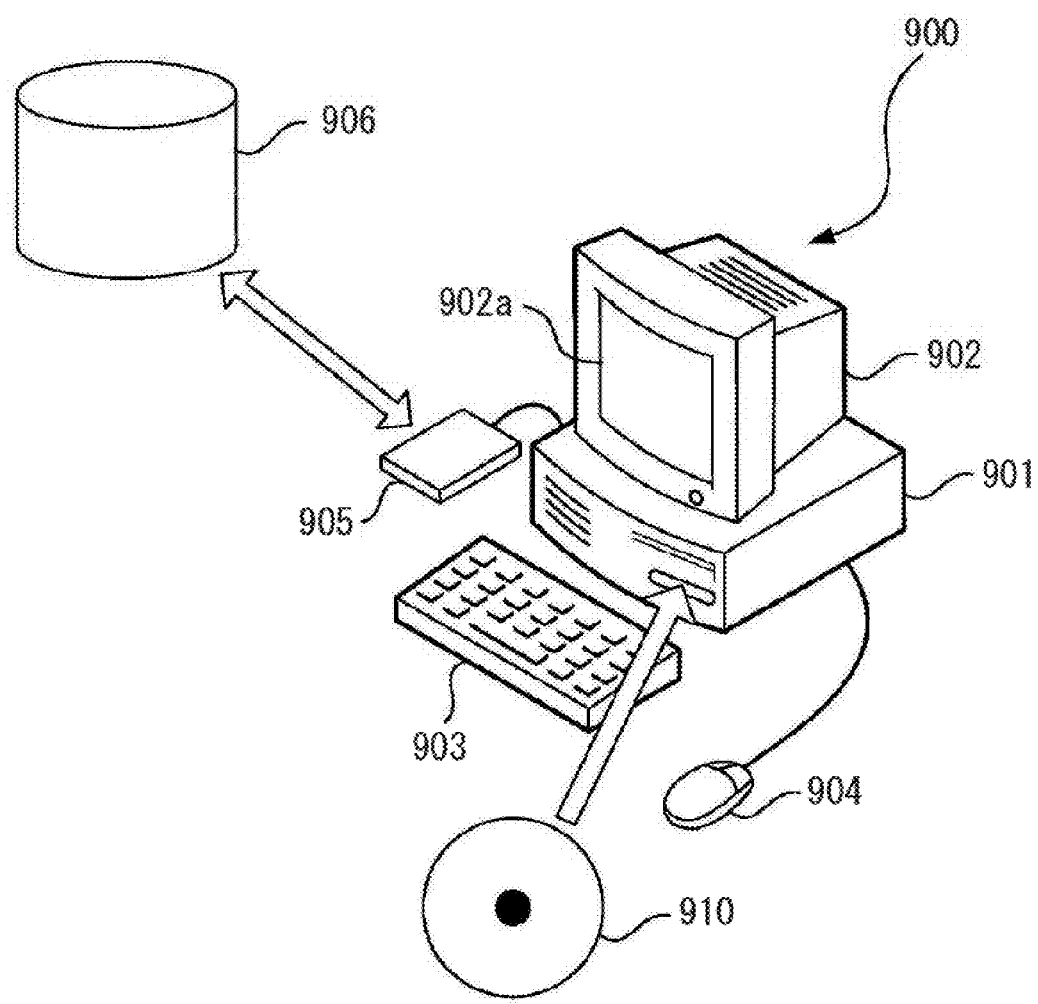
FIG. 68 is a diagram illustrating a computer system to which the invention is applied.

Note that the invention is applicable to a computer system as described below. FIG. 68 is a diagram illustrating an example of a computer system related to the invention. A computer system 900 is configured to include a main unit 901, a display 902, a keyboard 903, a mouse 904, and a communications device 905. The main unit 901 includes a CPU (Central processing Unit), a disk drive, and the like. The display 902 is provided for image display in response to a command coming from the main unit 901. The keyboard 903 is for input of various types of information into the computer system 900. The mouse 904 is for designating any arbitrary position on a display screen 902a of the display 902. The communications device 905 is for downloading a program or others stored in any other computer system through access to a database and the like located externally. The communications device 905 may be a network communications card, a modem, or the like.

In the computer system configuring the signal transmission system evaluation apparatus as described above, a program of executing the steps described above may be provided as a signal transmission system evaluation program. This program may be run by the computer system configuring the signal transmission system evaluation apparatus by being stored in a computer-readable recording medium. The program for executing the steps described above may be stored in a portable recording medium such as disk 910, or may be downloaded from a recording medium 906 of any other computer system by the communications device 905. Moreover, the signal transmission system evaluation program providing to the computer system 900 at least the signal transmission system evaluation function is input into the computer system 900 for compilation. This program operates as the signal transmission system evaluation system having the signal transmission system evaluation function in the computer system 900. Alternatively, this program may be stored in a computer-readable recording medium such as the disk 910. Herein, such a recording medium readable by the computer system 900 includes an internal storage device such as ROM (Read-Only Memory) and RAM (Random-Access memory) to be provided inside a computer, a portable storage medium such as disk 910, a flexible disk, a DVD (Digital Versatile Disk), a magneto-optical disk, and an IC card, a database storing a computer program, any other computer system and a database thereof, and various types of recording media accessible by a computer system coupled via a communications method such as the communications device 905.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the spirit and scope of the invention.

What is claimed is:

1. A signal transmission system evaluation apparatus for evaluating a signal transmission system, the apparatus comprising:
   a processor;
   a memory storing executable instructions which when executed by the processor perform the functions of:
      a parameter acquisition section that acquires model information about a waveform simulation model of the signal transmission system, a first parameter of a waveform variation in a time direction in the signal transmission system, and a second parameter of a waveform variation in an amplitude direction in the signal transmission system;
      a first eye pattern calculation section that calculates a first eye pattern of the signal transmission system through a waveform simulation based on the model information acquired by the parameter acquisition section;
      a second eye pattern calculation section that calculates, based on the first and second parameters acquired by the parameter acquisition section, a second eye pattern through processing of the first eye pattern calculated by the first eye pattern calculation section; and
      a transmission margin calculation section that calculates, as a transmission margin, a positional relationship between a specific area and an aperture of the second eye pattern calculated by the second eye pattern calculation section.

2. The signal transmission system evaluation apparatus according to claim 1, wherein the transmission margin includes either a minimum distance between the specific area and the aperture in the time direction, or a minimum distance between the specific area and the aperture in the amplitude direction.

3. The signal transmission system evaluation apparatus according to claim 1, wherein the transmission margin calculation section determines whether the calculated transmission margin satisfies a specific transmission margin condition or not.

4. The signal transmission system evaluation apparatus according to claim 1, wherein the second eye pattern calculation section calculates the second eye pattern by increasing a width of the first eye pattern in the time direction based on the first parameter, and by increasing a width of the first eye pattern in the amplitude direction based on the second parameter.

5. The signal transmission system evaluation apparatus according to claim 4, wherein the first parameter is output jitter.

6. The signal transmission system evaluation apparatus according to claim 4, wherein the second parameter is an amount of crosstalk noise.

7. The signal transmission system evaluation apparatus according to claim 1, wherein the parameter acquisition section acquires a type to be classified according to a positional relationship between a first transmission path being an evaluation target in the signal transmission system, and a second transmission path providing crosstalk to the first transmission path, and acquires a crosstalk ratio being a ratio of the size of the crosstalk to calculate an amount of crosstalk noise based on the type and the crosstalk ratio.

8. The signal transmission system evaluation apparatus according to claim 4, wherein the model information includes an output amplitude range of a transmission device in the signal transmission system, and an input amplitude range of a reception device in the signal transmission system, and the parameter acquisition section checks, based on the model information, a relationship between the output amplitude range of the transmission device and the input amplitude range of the reception device.

9. The signal transmission system evaluation apparatus according to claim 1, wherein the model information includes information about output jitter of a transmission device in the signal transmission system, and information about an input jitter tolerance of a reception device in the signal transmission system, and the parameter acquisition section checks, based on the model information, a relationship between the output jitter of the transmission device and the input jitter tolerance of the reception device.

10. The signal transmission system evaluation apparatus according to claim 1, wherein the model information includes information about a topology of the signal transmission system, and information about a setting of an amplitude in the signal transmission system, and the parameter acquisition section checks the setting of the amplitude based on the model information.

11. The signal transmission system evaluation apparatus according to claim 1, wherein the parameter acquisition section displays a plurality of preset topologies, and based on a user input, selects any one of the plurality of topologies for the signal transmission system, and sets the model information based on the selected topology.

12. The signal transmission system evaluation apparatus according to claim 1, wherein the parameter acquisition section displays a plurality of preset protocols, and based on a user input, selects any one of the plurality of protocols for the signal transmission system.

13. The signal transmission system evaluation apparatus according to claim 11, wherein the parameter acquisition section sets, based on the selected protocol, at least one item of information about the transmission and reception devices in the signal transmission system, a transmission speed, or a data pattern, as the model information.

14. The signal transmission system evaluation apparatus according to claim 1, wherein the parameter acquisition section displays, based on the acquired model information, either a transmission waveform of a transmission device in the signal transmission system or a reception waveform of a reception device therein.

15. A non-transitory recording medium recorded with executable instructions which when executed by a processor perform a signal transmission system evaluation, the medium comprising instructions to:
   acquire model information about a waveform simulation model of a signal transmission system, a first parameter of a waveform variation in a time direction in the signal transmission system, and a second parameter of a waveform variation in an amplitude direction in the signal transmission system;
   calculate a first eye pattern of the signal transmission system through a waveform simulation based on the acquired model information;
   calculate, based on the acquired first and second parameters, a second eye pattern through processing of the calculated first eye pattern; and calculate, as a transmission margin, a positional relationship between a specific area and an aperture of the calculated second eye pattern.

16. A transmission system design method comprising:

causing a processor to execute operations of:

determining a layout of a transmission device, a layout of a reception device, a layout of a substrate, a layout of a connector, and a layout of a transmission path in a signal transmission system;

acquiring model information about a waveform simulation model of the signal transmission system, a first parameter of a waveform variation in a time direction in the signal transmission system, and a second parameter of a waveform variation in an amplitude direction in the signal transmission system;

calculating a first eye pattern of the signal transmission system through a waveform simulation based on the acquired model information;

calculating, based on the acquired first and second parameters, a second eye pattern through processing of the calculated first eye pattern; and calculating, as a transmission margin, a positional relationship between a specific area and an aperture of the calculated second eye pattern.

17. A signal transmission system manufacturing method comprising:

causing a processor to execute operations of:

determining a layout of a transmission device, a layout of a reception device, a layout of a substrate, a layout of a connector, and a layout of a transmission path in a signal transmission system;

acquiring model information about a waveform simulation model of the signal transmission system, a first parameter of a waveform variation in a time direction in the signal transmission system, and a second parameter of a waveform variation in an amplitude direction in the signal transmission system;

calculating a first eye pattern of the signal transmission system through a waveform simulation based on the acquired model information;

calculating, based on the acquired first and second parameters, a second eye pattern through processing of the calculated first eye pattern;

calculating, as a transmission margin, a positional relationship between a specific area and an aperture of the calculated second eye pattern; and making a determination whether the calculated transmission margin satisfies a specific transmission margin condition or not, and when the transmission margin satisfies the specific transmission margin condition, performing the determined layouts.

* * * * *